United States Patent
Matsunuma et al.

(10) Patent No.: US 11,424,279 B2
(45) Date of Patent: Aug. 23, 2022

(54) IMAGING ELEMENT AND ELECTRONIC DEVICE INCLUDING IMAGING DEVICE

(71) Applicant: Sony Semiconductor Solutions Corporation, Kanagawa (JP)

(72) Inventors: Takeshi Matsunuma, Kanagawa (JP); Motonari Honda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 227 days.

(21) Appl. No.: 16/606,623

(22) PCT Filed: Mar. 20, 2018

(86) PCT No.: PCT/JP2018/010988
§ 371 (c)(1),
(2) Date: Oct. 18, 2019

(87) PCT Pub. No.: WO2018/211813
PCT Pub. Date: Nov. 22, 2018

(65) Prior Publication Data
US 2021/0118931 A1   Apr. 22, 2021

(30) Foreign Application Priority Data
May 16, 2017 (JP) .............................. JP2017-097413

(51) Int. Cl.
  *H01L 27/146* (2006.01)
  *G02B 5/20* (2006.01)
  *G02B 5/30* (2006.01)

(52) U.S. Cl.
  CPC .. *H01L 27/14625* (2013.01); *H01L 27/14621* (2013.01); *H01L 27/14645* (2013.01);
(Continued)

(58) Field of Classification Search
  CPC ......... H01L 27/14625; H01L 27/14621; H01L 27/14645; H01L 27/14649
(Continued)

(56) References Cited

U.S. PATENT DOCUMENTS 8,866,950 B2 * 10/2014 Yokogawa ........ H01L 27/14627
                                                    348/340
9,876,995 B2 *  1/2018 Lin ...................... G02B 5/1819
(Continued)

FOREIGN PATENT DOCUMENTS

CN       102342115 A     2/2012
JP    2010-263158 A    11/2010
(Continued)

OTHER PUBLICATIONS

Chinese Office Action dated May 10, 2021 for corresponding Chinese Application No. 201880026924.3.

*Primary Examiner* — David Vu
*Assistant Examiner* — Brandon C Fox
(74) *Attorney, Agent, or Firm* — Michael Best & Friedrich LLP

(57) ABSTRACT

In an imaging element, a plurality of pixels each having a photoelectric conversion part is arranged in a two-dimensional matrix. Some of the plurality of pixels each have a polarizer placed therein on a side of a light beam incidence plane. At least some of pixels having no polarizer placed therein each have a material layer placed therein that prevents transmission of a light beam having a wavelength of a predetermined range, to reduce color mixture in the pixel having the polarizer placed therein.

20 Claims, 48 Drawing Sheets

(52) U.S. Cl.
CPC ........ *H01L 27/14649* (2013.01); *G02B 5/201* (2013.01); *G02B 5/3058* (2013.01)

(58) Field of Classification Search
USPC ........................................................ 257/432
See application file for complete search history.

(56) References Cited

U.S. PATENT DOCUMENTS

| | | | |
|---|---|---|---|
| 2010/0282945 | A1 | 11/2010 | Yokogawa |
| 2014/0146207 | A1* | 5/2014 | Yokogawa ............. H04N 5/332 348/281 |
| 2016/0211388 | A1* | 7/2016 | Natsuaki ........... H01L 31/02162 |
| 2018/0213170 | A1* | 7/2018 | Segawa ................ H04N 13/239 |
| 2018/0308883 | A1* | 10/2018 | Yanagita ........... H01L 27/14629 |
| 2020/0152683 | A1* | 5/2020 | Akiyama ............... G02B 5/201 |

FOREIGN PATENT DOCUMENTS

| | | | | |
|---|---|---|---|---|
| JP | 2017-005111 A | 1/2017 | | |
| JP | 2017-076683 A | 4/2017 | | |
| WO | WO-2017002717 A1 * | 1/2017 | ........... | H01L 27/307 |

\* cited by examiner

IMAGING ELEMENT AND ELECTRONIC DEVICE INCLUDING IMAGING DEVICE

TECHNICAL FIELD

The present disclosure relates to an imaging element capable of acquiring information such as the intensity relating to a polarization component together with image information, and an electronic device including such an imaging element.

BACKGROUND ART

An imaging element capable of acquiring information such as the intensity relating to a polarization component together with image information has conventionally been proposed. For example, Japanese Patent Laid-Open No. 2010-263158 (PTL 1) proposes an imaging element having a plurality of pixels arranged in a two-dimensional matrix, in which a polarizer (a polarizing member) is placed on the side of a light beam incidence plane of some of the pixels.

An imaging element having such a configuration as above has an advantage of being able to facilitate application to various fields such as clarification of the border of an object, detection of the condition of a road surface, acquisition of the surface shape of an object, measurement of the surface characteristic of an object, and the like, by acquiring information such as the intensity relating to a polarization component together with image information.

CITATION LIST

Patent Literature

[PTL 1]
Japanese Patent Laid-Open No. 2010-263158

SUMMARY

Technical Problem

In an imaging element that has a configuration in which some of the pixels have a polarizer placed therein, a situation occurs where a pixel having a polarizer placed therein and another pixel having no polarizer placed therein are adjacent to each other. In this case, it can be considered that a portion of an incident light beam entering the pixel having no polarizer placed therein reaches the pixel having the polarizer placed therein. The light beam from the pixel having no polarizer placed therein degrades the extinction ratio in the pixel having the polarizer placed therein and, as a result, this therefore acts as a factor to generate an error in the information relating to the polarization component.

An object of the present disclosure therefore relates to an imaging element capable of alleviating, in a case where a pixel having a polarizer placed therein and another pixel having no polarizer placed therein are adjacent to each other, any influence of a light beam from the pixel having no polarizer placed therein, and an electronic device including such an imaging element.

Solution to Problem

An imaging element according to a first aspect of the present disclosure to achieve the above object is
an imaging element including:
a plurality of pixels each having a photoelectric conversion part and arranged in a two-dimensional matrix, in which
some of the plurality of pixels each have a polarizer placed therein on a side of a light beam incidence plane, and
at least some of pixels having no polarizer placed therein each have a material layer placed therein that prevents transmission of a light beam having a wavelength of a predetermined range, to reduce color mixture in the pixel having the polarizer placed therein.

An electronic device according to the first aspect of the present disclosure to achieve the above object is
an electronic device including:
an imaging element, in which
the imaging element includes a plurality of pixels each having a photoelectric conversion part and arranged in a two-dimensional matrix,
some of the plurality of pixels each have a polarizer placed therein on a side of a light beam incidence plane, and
at least some of pixels having no polarizer placed therein each have a material layer placed therein that prevents transmission of a light beam having a wavelength of a predetermined range, to reduce color mixture in the pixel having the polarizer placed therein.

Advantageous Effect of Invention

According to the imaging element of the present disclosure, at least some of the pixels having no polarizer placed therein each have the material layer placed therein that prevents transmission of the light beam having the wavelength of the predetermined range. This reduces occurrence of such a case where a portion of an incident light beam entering the pixel having no polarizer placed therein reaches the pixel having the polarizer placed therein, and the extinction ratio in the pixel having the polarizer placed therein is therefore improved. Note that the effect described herein is merely exemplification and is not limitative, and, moreover, any additional effects may be achieved.

DESCRIPTION OF EMBODIMENTS

Figure 1:
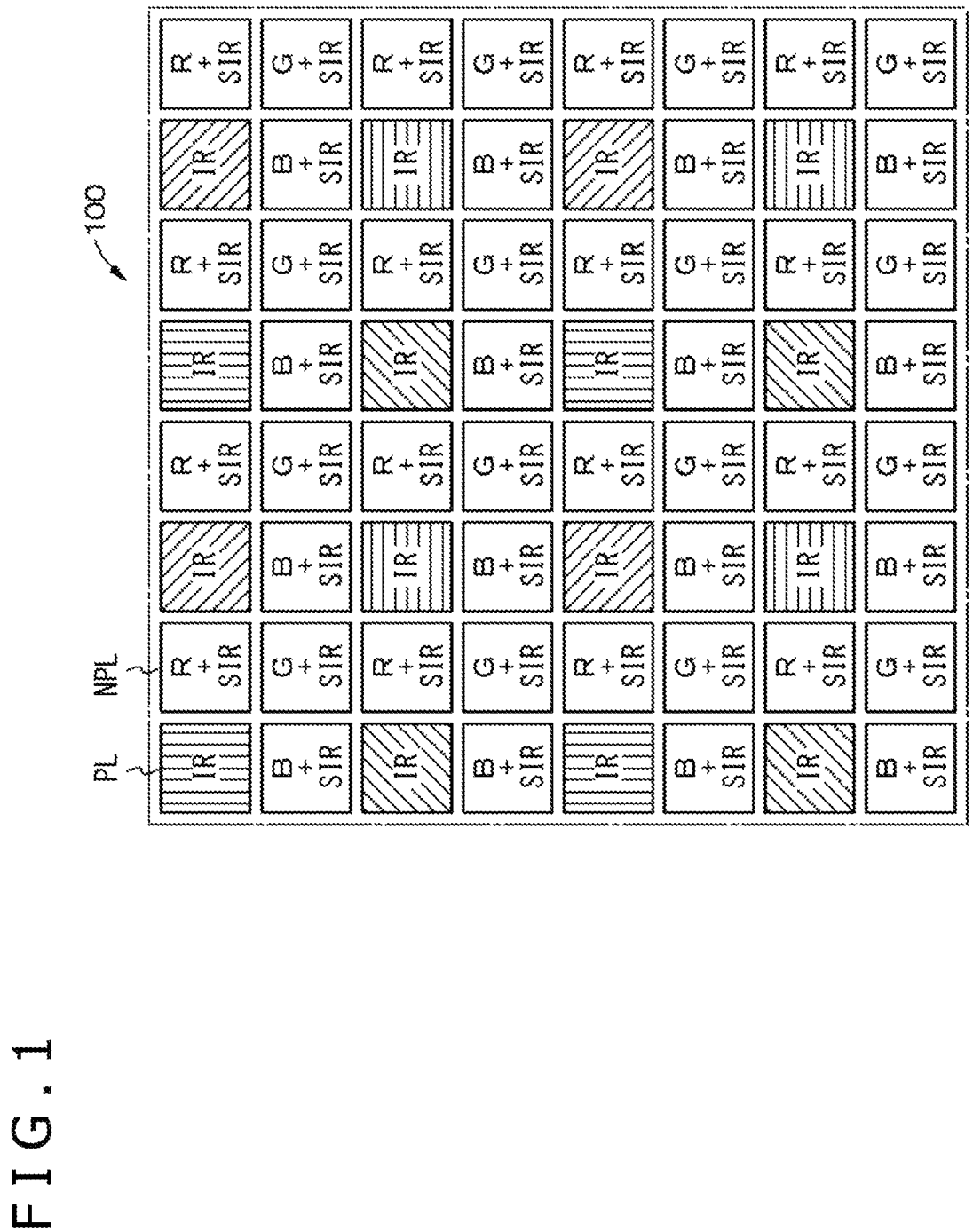
FIG. 1 is a schematic diagram of a portion of a planar layout in a pixel area of an imaging element according to a first embodiment of the present disclosure.

The present disclosure will be described below on the basis of embodiments with reference to the drawings. The present disclosure is not limited to the embodiments and, various numerical values and materials in the embodiments are exemplification. In the description below, the same elements or the elements having the same functions will be denoted by the same reference signs and redundant description will be omitted. In addition, description will be made in the following order.

1. General Description for Imaging Element According to First Aspect of Present Disclosure and Electronic Device According to First Aspect of Present Disclosure.
2. First Embodiment
3. Relation between Pixel Detecting Polarized Light Beam and Light Beam to Be Detected
4. Placement of Color Filters
5. Placement of Infrared Light Beam-Absorbing Filter Layers and Polarizers
6. Oblique Placement of Pixels
7. Exemplary Placement of Polarizers Having Same Structure
8. Second Embodiment
9. Exemplary Configuration of Three-Dimensional Placement
10. Exemplary Placement of Elements of Type Different from Pixel
11. Application Examples
12. Others

[General Description for Imaging Element According to First Aspect of Present Disclosure and Electronic Device According to First Aspect of Present Disclosure]

As described above, an imaging element according to the first aspect of the present disclosure or an imaging element used in an electronic device according to the first aspect of the present disclosure (hereinafter, these may simply be referred to as the imaging element of the present disclosure) is an imaging element including:

a plurality of pixels each having a photoelectric conversion part and arranged in a two-dimensional matrix, in which some of the plurality of pixels each have a polarizer placed therein on a side of a light beam incidence plane, and at least some of pixels having no polarizer placed therein each have a material layer placed therein that prevents transmission of a light beam having a wavelength of a predetermined range, to reduce color mixture in the pixel having the polarizer placed therein.

The imaging element of the present disclosure can also have a configuration in which the polarizer is placed in a pixel for an infrared light beam, or the polarizer is placed in a pixel for a visible light beam.

The imaging element of the present disclosure including the above various types of preferred forms can have a configuration in which the material layer preventing transmission of the light beam having the wavelength of the predetermined range is placed in all the pixels having no polarizer placed therein, from among the pixels having no polarizer placed therein, a pixel adjacent to the pixel having the polarizer placed therein through a side or a vertex of the pixel, or from among the pixels having no polarizer placed therein, a pixel adjacent to the pixel having the polarizer placed therein through a side of the pixel.

In this case, the material layer can include a material that prevents transmission of a light beam having a wavelength of a predetermined range from among light beams in a range of visible light beams or non-visible light beams. More specifically, the material layer can include a visible light beam-absorbing material, an infrared-absorbing material, or an electrically conductive material.

The imaging element of the present disclosure including the above various types of preferred forms can have a configuration in which the pixel having the polarizer placed therein is placed so as to be surrounded by and adjacent to the pixels having no polarizer placed therein.

Alternatively, the pixel having the polarizer placed therein can be placed so as to be adjacent to the pixel having no polarizer placed therein through a side of the pixel and adjacent to another pixel having the polarizer placed therein through a vertex of the pixel.

The imaging element of the present disclosure including the above various types of preferred forms can have a configuration in which a plurality of types of polarizers whose azimuth angles of polarization differ from each other is placed such that one type of polarizer is placed in one pixel.

In this case, the polarizers can have the same structure, and the polarizers can be placed such that the azimuth angles of polarization are made different from each other by differentiating a placement relation of the polarizer with respect to the pixel.

Alternatively, the pixel having no polarizer placed therein can be placed so as to be adjacent to pixels having polarizers placed therein whose azimuth angles of polarization are different from each other, on all sides of the pixel.

Alternatively, a plurality of the pixels having the polarizer placed therein can be placed adjacent to each other and constitutes a pixel group, and the pixel group can be placed so as to be surrounded by and adjacent to the pixels having no polarizer placed therein.

In this case, the pixels constituting one pixel group can have polarizers placed therein whose azimuth angles of polarization are equal to each other.

In the imaging element of the present disclosure including the above various types of preferred forms, the configuration of the polarizer is not especially limited as long as no problem arises relating to the implementation of the present disclosure. Examples of the polarizer include, for example, a polarization film formed by stretching an iodine-including base material and a wire grid polarizer. From the viewpoint that the polarizer is placed in each pixel, it is preferred that the polarizer include a wire grid polarizer.

The imaging element of the present disclosure including the above various types of preferred forms can have a configuration in which the infrared light beam-absorbing filter and the polarizer are placed in the same layer.

The imaging element of the present disclosure including the above various types of preferred forms can have a configuration in which the imaging element includes a color filter that is placed on the side of the light beam incidence plane and formed so as to cover an entire face including an area above the polarizer.

In this case, the material layer preventing transmission of the light beam having the wavelength of the predetermined range can be placed on a side of the color filter closer to the polarizer, or on a side of the color filter closer to the light beam incidence plane.

In this case, the infrared light beam-absorbing filter can be placed in the same layer as that of the color filter. Furthermore, the infrared light beam-absorbing filter can be placed so as to be embedded in the color filter.

The imaging element of the present disclosure including the above various types of preferred forms can have a configuration in which the material layer preventing transmission of the light beam having the wavelength of the predetermined range is placed so as to cover an entire face of the light beam incidence plane of the pixel or only a peripheral portion of the light beam incidence plane of the pixel.

Examples of the imaging element of the present disclosure including the preferred forms and configurations described above include a CCD image sensor and a CMOS image sensor. Moreover, these sensors may be of a front-illuminated type or a back-illuminated type. In addition, examples of the electronic device using the imaging element of the present disclosure include a digital still camera, a video camera, a camcorder, a surveillance camera, an on-vehicle camera, a camera for a smartphone, a user-interface camera for gaming, a camera for biometric authentication, and the like. These electronic devices can concurrently acquire information such as the intensity relating to a polarization component in addition to a normal image.

Examples of a substrate on which a photoelectric conversion part is formed include a semiconductor substrate and especially a silicon semiconductor substrate. The silicon semiconductor substrate also absorbs a light beam having a wavelength of approximately 1 µm in addition to visible light beams. The photoelectric conversion part such as a photodiode or a phototransistor formed on a silicon substrate can therefore execute photoelectric conversion also for a near-infrared light beam in addition to a visible light beam.

As above, the material layer preventing transmission of a light beam having a wavelength in a predetermined range can include a visible light beam-absorbing material, an infrared-absorbing material, or an electrically conductive material. A material constituting a what-is-called infrared transmitting filter is usable as the visible light beam-absorbing material, and a material including a pigment or a dye that absorbs the light beam in the infrared region is usable as the infrared light beam-absorbing material. Compounds such as a squarylium-based compound, a phthalocyanine-based compound, and a cyanine-based compound can be exemplified as the material included in the infrared light beam-absorbing material. From the viewpoint of the light resistance and the heat resistance, it is especially preferred that the squarylium-based compound be used.

Examples of the color filter include a white filter transmitting all the visible light beams (a transparent filter) and an infrared light beam-transmitting filter transmitting a specific wavelength in the infrared region, in addition to a red filter, a green filter, and a blue filter that respectively transmit the specific wavelengths of red, green, and blue. The color filter can include, for example, an organic material-based material layer that uses an organic compound such as a pigment, a dye, or the like. In addition, in some cases, a complementary-color color filter may be used that transmits a specific wavelength such as cyan, magenta, yellow, or the like.

The wire grid polarizer includes a plurality of belt-like electrically conductive light-blocking material layers, and a slit region disposed between an electrically conductive light-blocking material layer and another electrically conductive light-blocking material layer. An electromagnetic wave vibrating in a plane parallel to a direction for a wire grid to extend in is selectively reflected or absorbed by the wire grid. The electromagnetic wave having passed through the wire grid therefore becomes a linearly polarized light beam whose component perpendicular to the direction for the wire grid to extend in is dominant.

Examples of the material constituting the electrically conductive light-blocking material layer to constitute the wire grid include electric conductor materials such as aluminum (Al), copper (Cu), gold (Au), silver (Ag), platinum (Pt), tungsten (W), and alloys including these metals. Alternatively, a plurality of belt-like electrically conductive light-blocking material layers can be acquired by placing a linear material such as a carbon nanotube in a grid pattern, or a plurality of belt-like electrically conductive light-blocking material layers can also be acquired by placing nanoparticles of gold, silver, or the like in a grid pattern or printing a grid pattern using these nanoparticles.

Examples of a method for producing the wire grid polarizer include a combination of a film forming technique for the electrically conductive light-blocking material layers and a patterning technique for the electrically conductive light-blocking material layers by a lithography technique and an etching technique, a combination of formation of recesses and protrusions on a base body by a lithography technique and an etching technique and a film forming technique for the electrically conductive light-blocking material layers on a top face of the protrusions of the base body, and a what-is-called liftoff technique. Examples of a method for forming a film of the electrically conductive light-blocking material layers include physical vapor-phase growth methods such as various types of vacuum deposition method and sputtering method, a chemical vapor-phase growth method, a plating method, an MOCVD method, and an MBE method.

The imaging element of the present disclosure can have a configuration in which, in regions each positioned between a photoelectric conversion part and another photoelectric conversion part adjacent to each other, a light-blocking layer is disposed that includes a metal material such as, for example, chromium (Cr), copper (Cu), aluminum (Al), or tungsten (W), a dielectric material, or the like. In some cases, a wire grid polarizer can be constituted by appropriately applying etching or the like to the material layer to constitute the light-blocking layer.

The material layers constituting the color filter, the infrared light beam-absorbing filter layer, and the like, and an interlayer insulating layer, the flattening layer, and the like constituting the imaging element can each be formed on the basis of any known method such as various types of chemical vapor-phase growth method, an application method, and various types of physical vapor-phase growth method. Moreover, examples of the patterning method include known methods such as a combination of a lithography technique and an etching technique, and a liftoff method.

The imaging element of the present disclosure can take a form in which an on-chip lens (OCL) is placed above a photoelectric conversion part to improve the light condensing efficiency.

In the case where the interlayer insulating layer and the flattening layer include a transparent material, for example, an insulating material having no light-absorbing property, more specifically, an SiOx-based material (a material constituting a silicon-based oxide film), SiN, SiON, SiOC, SiOF, SiCN, a low-dielectric insulating material such as organic SOG, a polyimide-based resin, or a fluorine-based resin, can be used as the material. This similarly applies to the OCL.

Various conditions described herein are satisfied in a case where the conditions are strictly met and, in addition, are also satisfied in a case where the conditions are substantially met. For example, it is satisfying for "red" to substantially be recognized as red, and it is satisfying for "green" to substantially be recognized as green. This similarly applies to "blue" and "white." Presence of various dispersions generated in designing or production is admitted.

In the following description, graphs are referred to to describe the spectroscopic property and the like, but these are schematic graphs and do not indicate any accurate spectroscopic property and the like. The graphs also have schematic shapes.

First Embodiment

A first embodiment relates to an imaging element according to the present disclosure.

The imaging element of the present disclosure includes
a plurality of pixels each having a photoelectric conversion part and arranged in a two-dimensional matrix, in which
some of the plurality of pixels each have a polarizer placed therein on a side of a light beam incidence plane, and
at least some of pixels having no polarizer placed therein each have a material layer placed therein that prevents transmission of a light beam having a wavelength of a predetermined range.

The material layer preventing transmission of a light beam having a wavelength of a predetermined range includes a material that prevents transmission of a light beam having a wavelength of a predetermined range, from among light beams in a range of visible light beams or non-visible light beams. More specifically, the material layer can be formed using a visible light beam-absorbing material, an infrared-absorbing material, or an electrically conductive material. In the first embodiment, the material layer includes an infrared-absorbing material and the material layer constitutes an infrared light beam-absorbing filter that selectively absorbs infrared light beams. For convenience of the description, in the description of the first embodiment, the "material layer constituting the infrared light beam-absorbing filter" may simply be referred to as "infrared light beam-absorbing filter layer."

FIG. 1 is a schematic diagram of a portion of a planar layout in a pixel area of the imaging element according to the first embodiment of the present disclosure.

As depicted in FIG. 1, in a pixel area of an imaging element 100, a plurality of pixels is arranged in a two-dimensional matrix in an X-direction (the horizontal direction in the figure) and a Y-direction (the vertical direction in the figure).

In FIG. 1, a reference sign [R], [G], or [B] respectively indicates that the pixel includes a red filter, a green filter, or a blue filter. Moreover, a reference sign [IR] indicates that the pixel includes an infrared light beam-transmitting filter. This similarly applies to the other drawings.

Arrangement of color filters in FIG. 1 has a configuration, for example, obtained by partially modifying the what-is-called Bayer array. In other words, a configuration is adopted in which a red, a green, and a blue color filters are respectively placed in three pixels of 2×2 pixels, and an infrared light beam-transmitting filter is placed in the remaining one pixel.

Note that, though described later with reference to FIG. 16, a reference sign [W] indicates that the pixel includes a white filter (a transparent filter) that transmits visible light beams in general. This similarly applies to the other drawings.

Moreover, in FIG. 1, a reference sign [SIR] indicates that the pixel includes an infrared light beam-absorbing filter layer. This similarly applies to the other drawings.

A reference sign [R+SIR] indicates that the pixel includes an infrared light beam-absorbing filter layer in addition to the red filter, a reference sign [G+SIR] indicates that the pixel includes an infrared light beam-absorbing filter layer in addition to the green filter, and a reference sign [B+SIR] indicates that the pixel includes an infrared light beam-absorbing filter layer in addition to the blue filter.

In the example depicted in FIG. 1, a polarizer is placed in a pixel for an infrared light beam. More specifically, a polarizer is placed in a pixel that includes an infrared light beam-transmitting filter. The pixel having the polarizer placed therein is denoted by a reference sign [PL], and the pixel having no polarizer placed therein is denoted by a reference sign [NPL]. The pixel having the polarizer placed therein is placed so as to be surrounded by and adjacent to the pixels having no polarizer placed therein.

Moreover, in the following description, the pixel having the polarizer placed therein may be referred to as "polarized pixel" and the pixel having no polarizer placed therein may be referred to as "normal pixel."

In the example depicted in FIG. 1, a plurality of types of polarizers whose azimuth angles of polarization differ from each other is placed such that one type of polarizer is placed in one pixel. The figure schematically depicts, by hatching according to the azimuth angle of polarization, that the polarizer is placed in the pixel. This similarly applies to the other drawings. In the example depicted in FIG. 1, four types of polarizers whose azimuth angles of polarization are 0 degree, 45 degrees, 90 degrees, and 135 degrees with respect to the X-direction (the horizontal direction in the figure) are placed such that one type of polarizer is placed in one pixel.

In a case where polarization information is reflected on image information in the pixel having no polarizer placed therein, it is sufficient that plural polarized pixels are properly selected that are positioned in the vicinity of the pixel having no polarizer placed therein and that have the polarizers having the azimuth angles of polarization different from each other and the polarization information from each of the selected polarized pixels is properly be reflected.

In FIG. 1, the pixel having the polarizer placed therein is placed so as to be surrounded by and adjacent to the pixels having no polarizer placed therein. In addition, the infrared light beam-absorbing filter layer is placed in all the pixels having no polarizer placed therein. Moreover, the infrared light beam-absorbing filter layer is placed so as to cover the entire face of the light beam incidence plane of each of the pixels.

Figure 2:
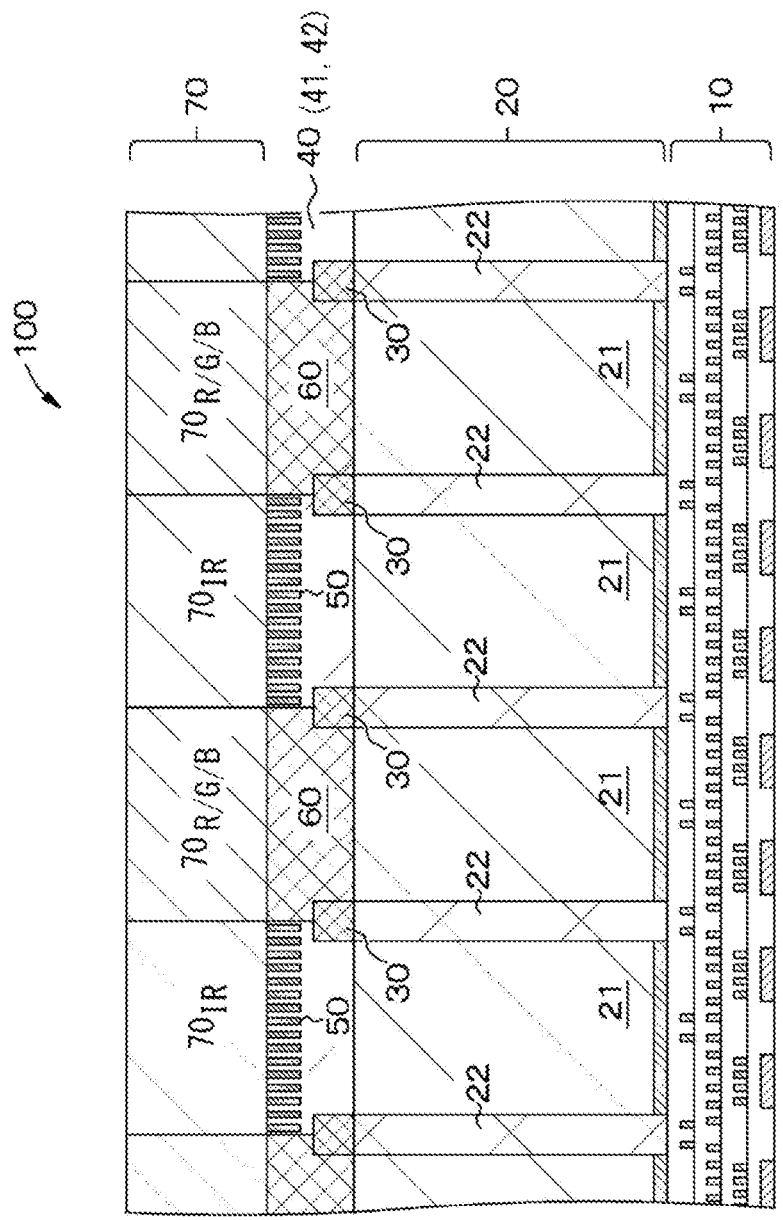
FIG. 2 is a schematic partial cross-sectional diagram of the imaging element according to the first embodiment of the present disclosure.

FIG. 2 is a schematic partial cross-sectional diagram of the imaging element according to the first embodiment of the present disclosure.

The imaging element 100 is an imaging element of a what-is-called back-illuminated type which is illuminated with light from the face opposite to the face having a wiring layer formed thereon, and basically has a structure in which a wiring layer 10, a semiconductor layer 20, a flattening layer 40, polarizers 50, infrared light beam-absorbing filter layers 60, color filters 70, and the like are stacked. A reference sign "21" denotes a photoelectric conversion part such as a photodiode formed in the semiconductor layer 20 and a reference sign "22" denotes a separation part disposed between the photoelectric conversion parts adjacent to each other.

Note that the flattening layer 40 includes a flattening layer 41 and a flattening layer 42 stacked on each other which will be described later, and may further take a structure in which another flattening layer is stacked. In a case where these layers do not need to be distinguished from each other, these layers are presented simply as the flattening layer 40.

On the side of the light beam incidence plane of the photoelectric conversion part 21, a light-blocking layer 30 is disposed that partitions the photoelectric conversion parts 21 adjacent to each other.

As described above, the imaging element 100 includes the color filters 70 that are placed on the side of the light beam incidence plane and that are formed so as to cover the entire face including areas above the polarizers 50.

The polarizer 50 is placed between an infrared light beam-transmitting filter (denoted by a reference sign 701R) of the color filters 70 and the photoelectric conversion part 21. The polarizer 50 includes a wire grid polarizer. Moreover, the infrared light beam-absorbing filter layer 60 is placed between a portion other than the infrared light beam-transmitting filter $70_{IR}$ (for convenience, denoted by a reference sign $70_{R/G/B}$) of the color filters 70 and the photoelectric conversion part 21. The infrared light beam-absorbing filter layer 60 and the polarizer 50 are therefore placed in the same layer.

The properties of the color filters 70 will next be described.

Figure 3:
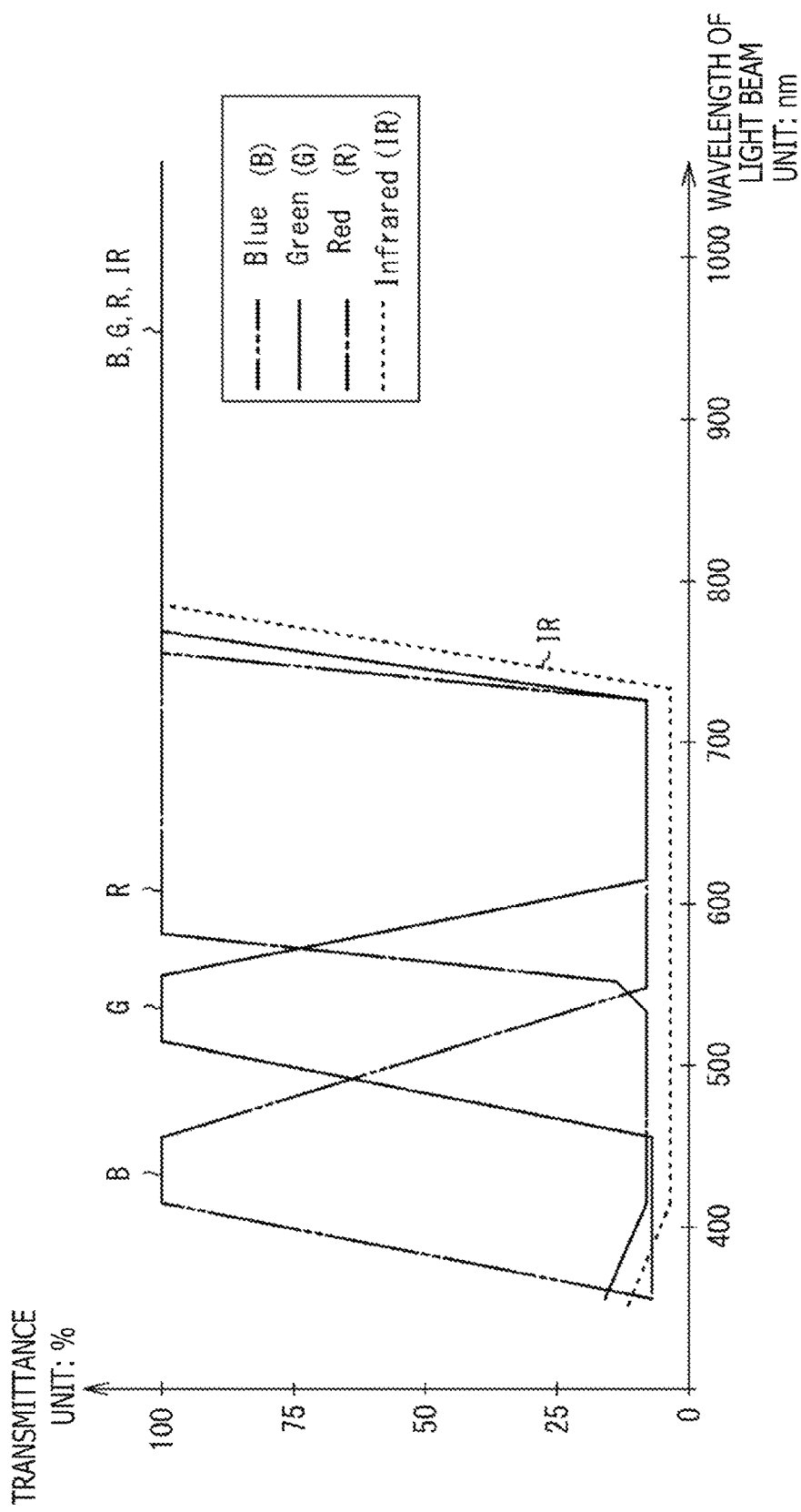
FIG. 3 is a schematic graph of the spectral transmittance of color filters.

FIG. 3 is a schematic graph of the spectral transmittances of color filters, and indicates the spectral transmittances acquired when color filters for a red, a green, a blue, and an infrared light beams are formed each as a film on a transparent base material. As depicted in the figure, commercially available color filters to be used in imaging elements each present a transmittance of approximately 100% on the side of the wavelength substantially longer than 800 nm.

The property of the infrared light beam-absorbing filter layer 60 will next be described.

Figure 4:
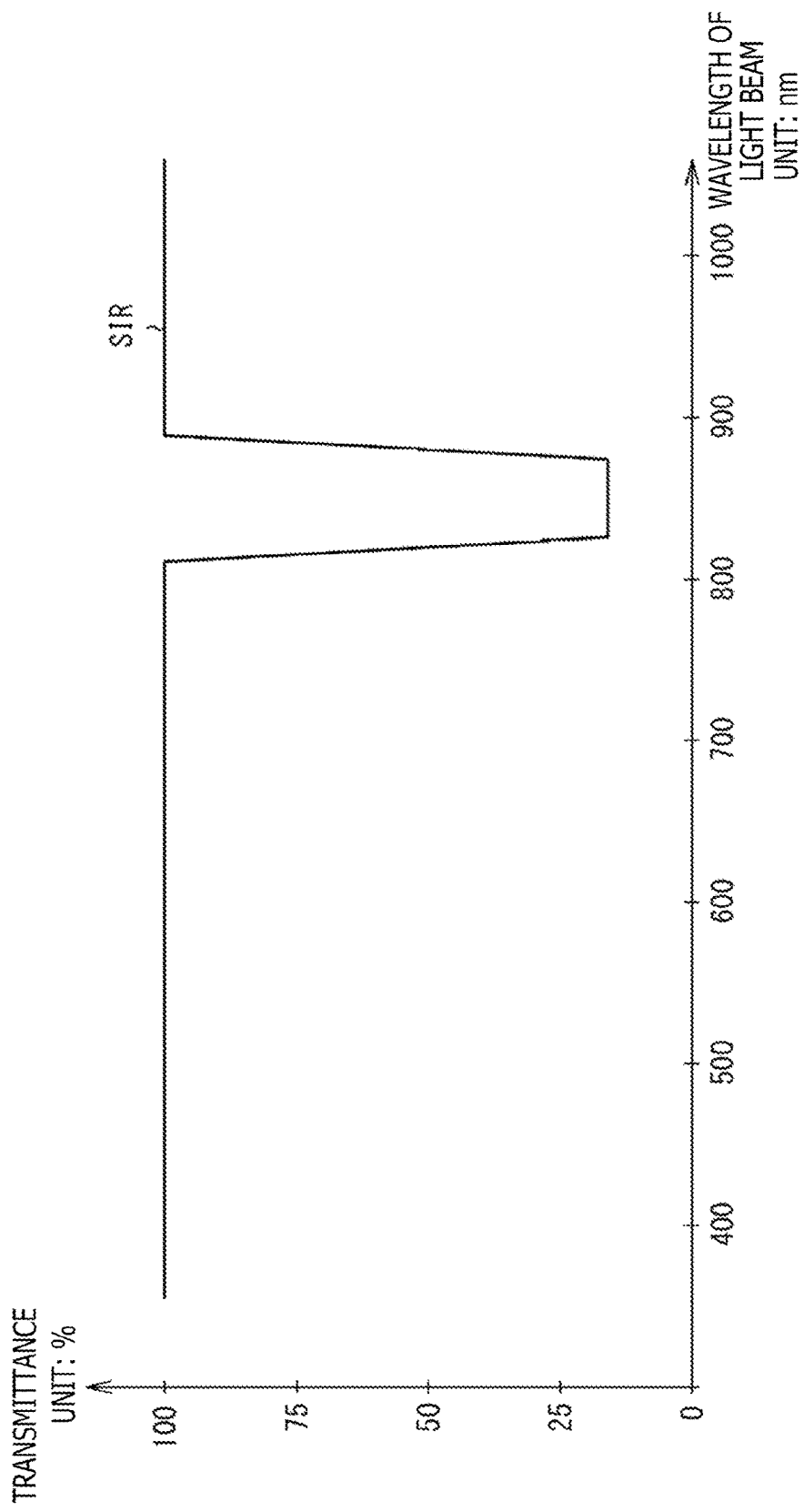
FIG. 4 is a schematic graph of the spectral transmittance of an infrared light beam-absorbing filter.

The infrared light beam-absorbing filter layer can have a configuration, for example, including one layer or a plurality of layers each containing a coloring matter such as, for example, cyanine, phthalocyanine, or squarylium. FIG. 4 is a schematic graph of the spectral transmittance of the infrared light beam-absorbing filter layer formed as above.

The central wavelength of the near-infrared absorption band can be adjusted by varying the molecular design of the coloring matter such as, for example, the frame of a molecule constituting the coloring matter and the configuration of a substituent. Moreover, as to the width of the near-infrared absorption band, the width of the near-infrared absorption band can be expanded by using a plurality of types of coloring matters having central wavelengths of the absorption bands different from each other.

Here, in order to facilitate the understanding of the present disclosure, as a reference example, a problem will be described that arises in an imaging element having a configuration including no infrared light beam-absorbing filter layer.

Figure 5:
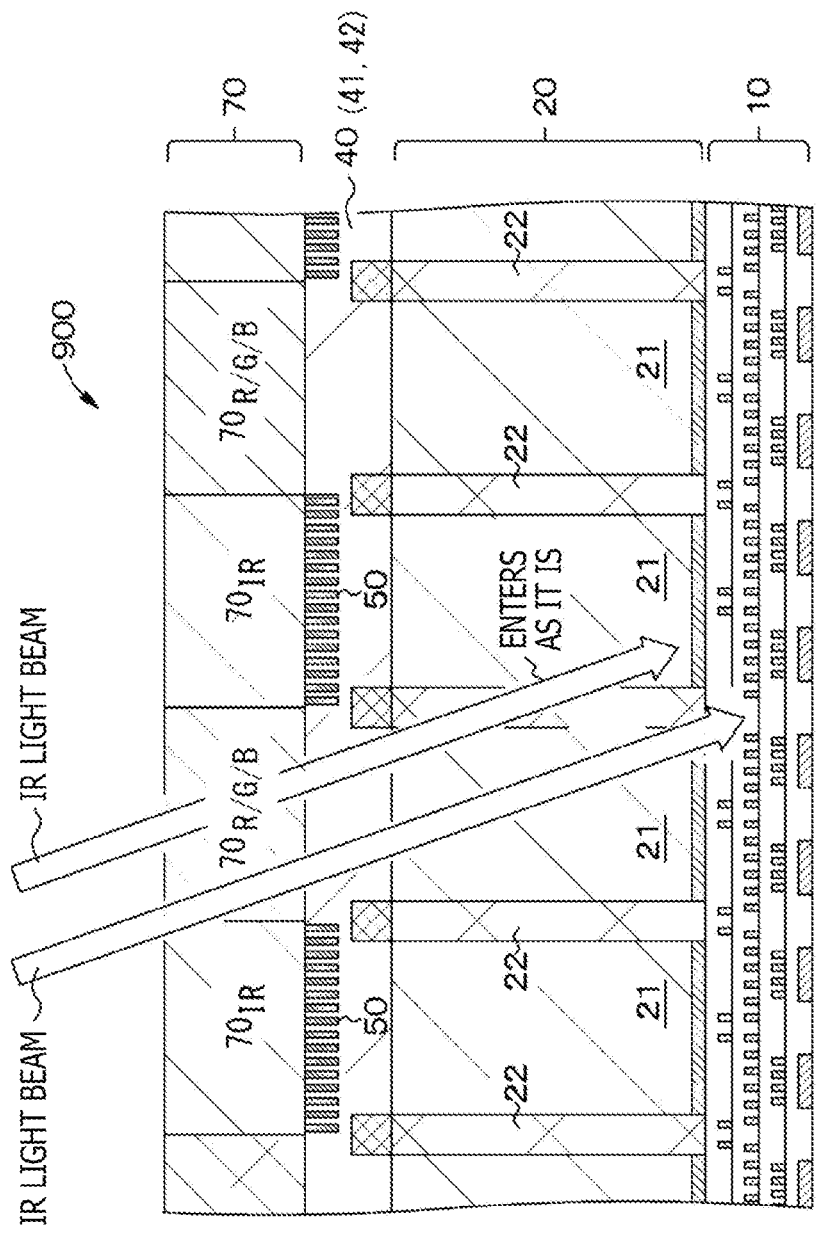
FIG. 5 is a schematic diagram for explaining a fact that the extinction ratio property of a pixel having a polarizer placed therein is degraded by light beams from another pixel adjacent side by side to the pixel having the polarizer placed therein, in an imaging element of a reference example having a configuration including no infrared light beam-absorbing filter.

FIG. 5 is a schematic diagram for explaining a fact that the extinction ratio property of the pixel having the polarizer placed therein is degraded by light beams from another pixel adjacent side by side to the pixel having the polarizer placed therein in the imaging element of the reference example having the configuration including no infrared light beam-absorbing filter layer.

In a case where a polarized pixel and a normal pixel are placed to be adjacent to each other, a light beam having a wavelength to be the target of photoelectric conversion of the polarized pixel (an infrared light beam) also enters the normal pixel.

In general, a light beam penetrates into the photoelectric conversion part 21 more deeply as the wavelength thereof is longer. In an imaging element 900 of the reference example that has the configuration including no infrared light beam-absorbing filter layer, a light beam entering from the pixel having no polarizer 50 placed therein therefore penetrates up to the photoelectric conversion part 21 of the pixel having the polarizer 50 placed therein, and color mixture caused by the unintended entrance of the light beam occurs. The extinction ratio in the pixel having the polarizer 50 placed therein is thereby degraded. Moreover, in some cases, such a state can be considered that the light beam transmitted through the photoelectric conversion part 21 of the pixel having no polarizer 50 placed therein is reflected by a wire or the like and reaches the photoelectric conversion part 21 of the pixel adjacent thereto.

To cope with the above problem, in the present disclosure, the configuration is adopted in which the infrared light beam-absorbing filter layer is placed in the pixel adjacent to the pixel having the polarizer placed therein.

Figure 6:
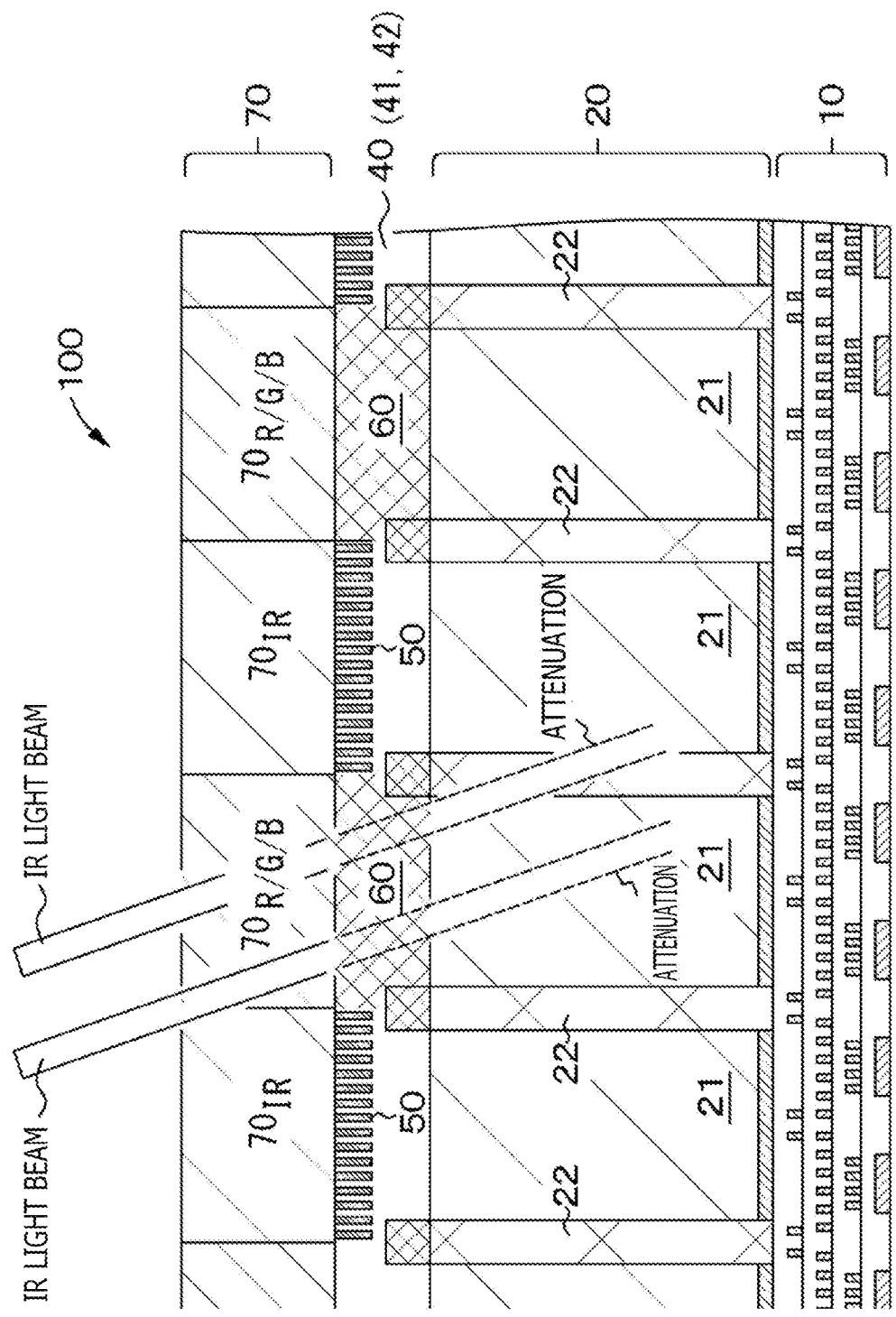
FIG. 6 is a schematic diagram for explaining a fact that the extinction ratio property of a pixel having a polarizer placed therein is improved by placing an infrared light beam-absorbing filter on another pixel adjacent side by side to the pixel having the polarizer placed therein.

FIG. 6 is a schematic diagram for explaining a fact that the extinction ratio property of the pixel having the polarizer placed therein is improved by placing the infrared light beam-absorbing filter layer on the pixel adjacent side by side to the pixel having the polarizer placed therein.

According to this configuration, even if a light beam having the wavelength to be the target of the photoelectric conversion by the polarized pixel (an infrared light beam) enters the normal pixel, the intensity thereof is attenuated by the infrared light beam-absorbing filter layer. Occurrence of an event can thereby be alleviated such as that the light beam transmitted through the photoelectric conversion part 21 of the pixel having no polarizer placed therein is reflected by a wire or the like and reaches the photoelectric conversion part 21 of the pixel adjacent thereto. The extinction ratio in the pixel having the polarizer placed therein is therefore improved.

The imaging element according to the first embodiment has been described as above. A method for fabricating the imaging element 100 will next be described with reference to FIG. 7 to FIG. 12.

Figure 7:
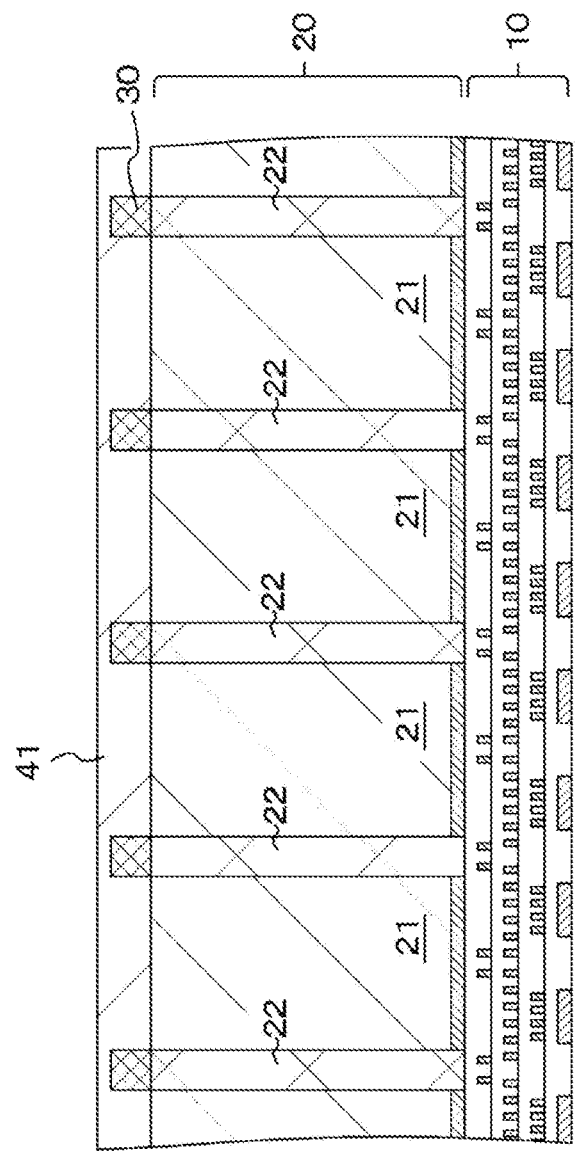
FIG. 7 is a schematic partial cross-sectional diagram for explaining a fabrication step of an imaging element.

[Step-100] (See FIG. 7)

The wiring layer 10 is formed on the silicon substrate having the photoelectric conversion part 21 formed therein, and the light beam incidence plane of the photoelectric conversion part 21 is next exposed by grinding the silicon substrate. The light-blocking part 30 is thereafter formed on the exposed light beam incidence plane and the flattening layer 41 is next formed on the entire face.

Figure 8:
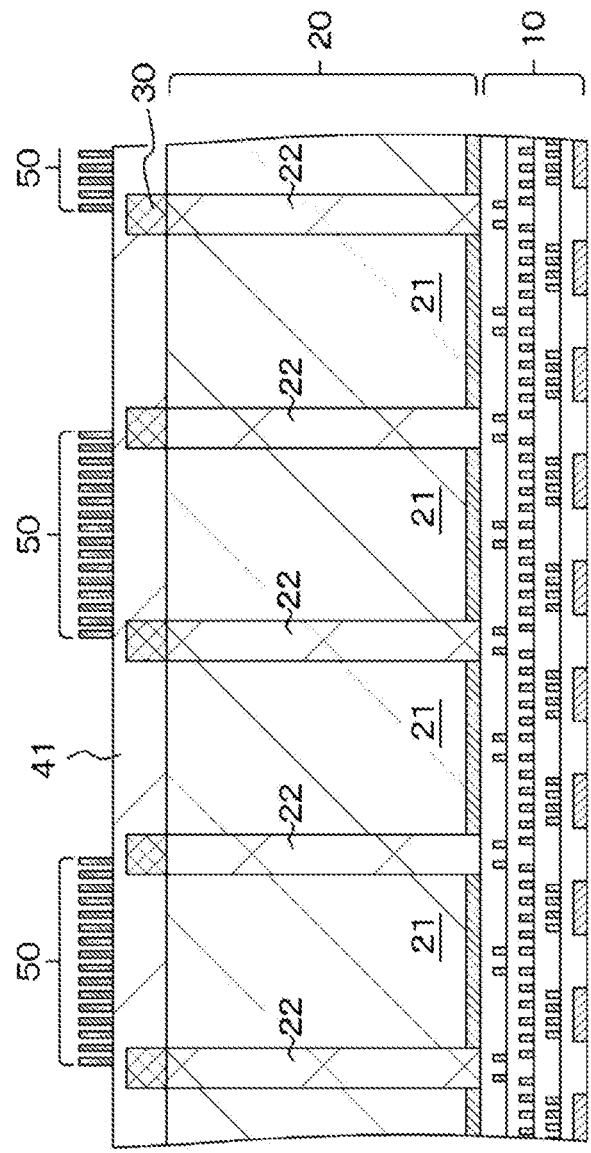
FIG. 8 is a schematic partial cross-sectional diagram for explaining the fabrication step of the imaging element, continued from FIG. 7.

[Step-110] (See FIG. 8)

The polarizer 50 is thereafter placed on the flattening layer 41. The polarizer 50 is placed by, for example, forming the wire grid structure using a lithography technique and an etching technique after forming an electrically conductive light-blocking layer on the flattening layer 41.

Figure 9:
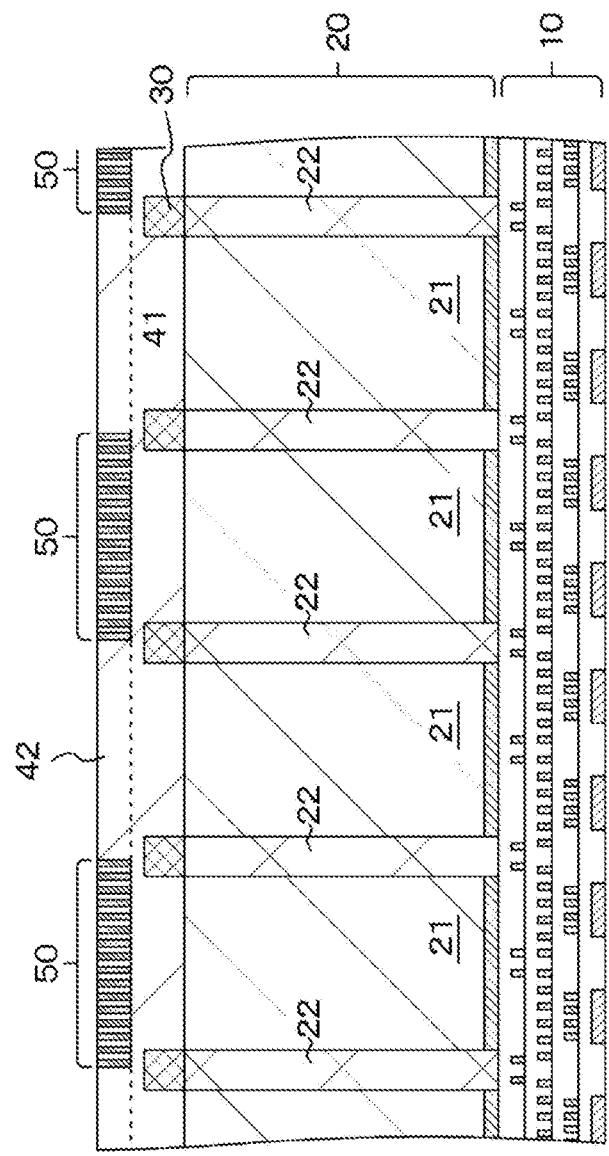
FIG. 9 is a schematic partial cross-sectional diagram for explaining the fabrication step of the imaging element, continued from FIG. 8.

[Step-120] (See FIG. 9)

The flattening layer 42 is next formed on the entire face including the polarizer 50. Flattening by CMP or the like is applied when necessary.

Figure 10:
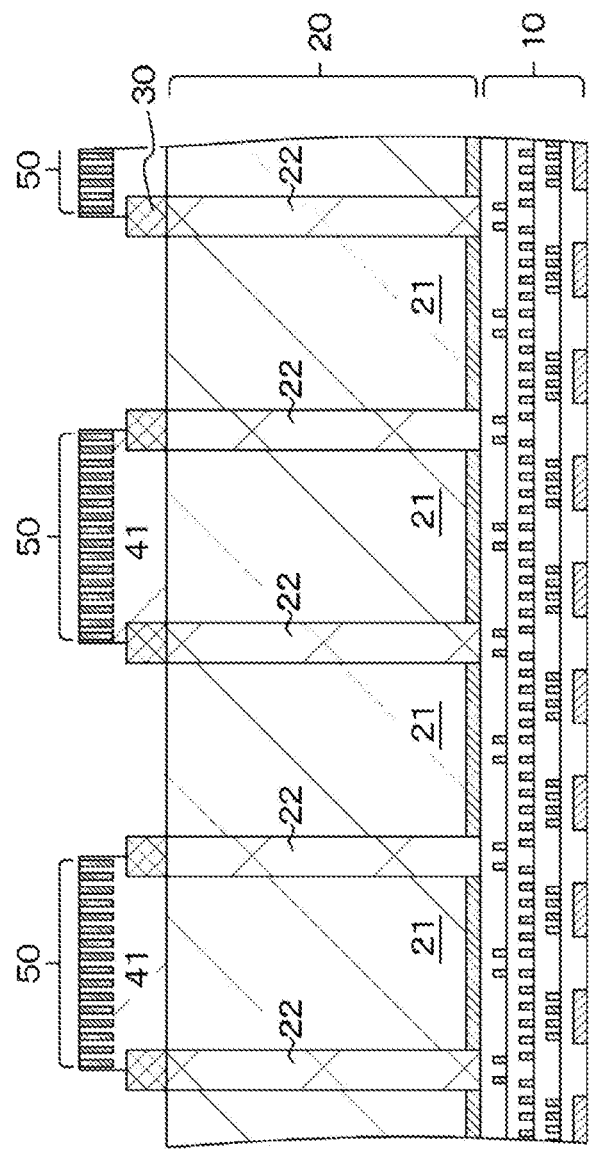
FIG. 10 is a schematic partial cross-sectional diagram for explaining the fabrication step of the imaging element, continued from FIG. 9.

[Step-130] (See FIG. 10)

A portion of the flattening layer at which the infrared light beam-absorbing filter layer 60 is to be formed is thereafter removed by a lithography technique and an etching technique.

Figure 11:
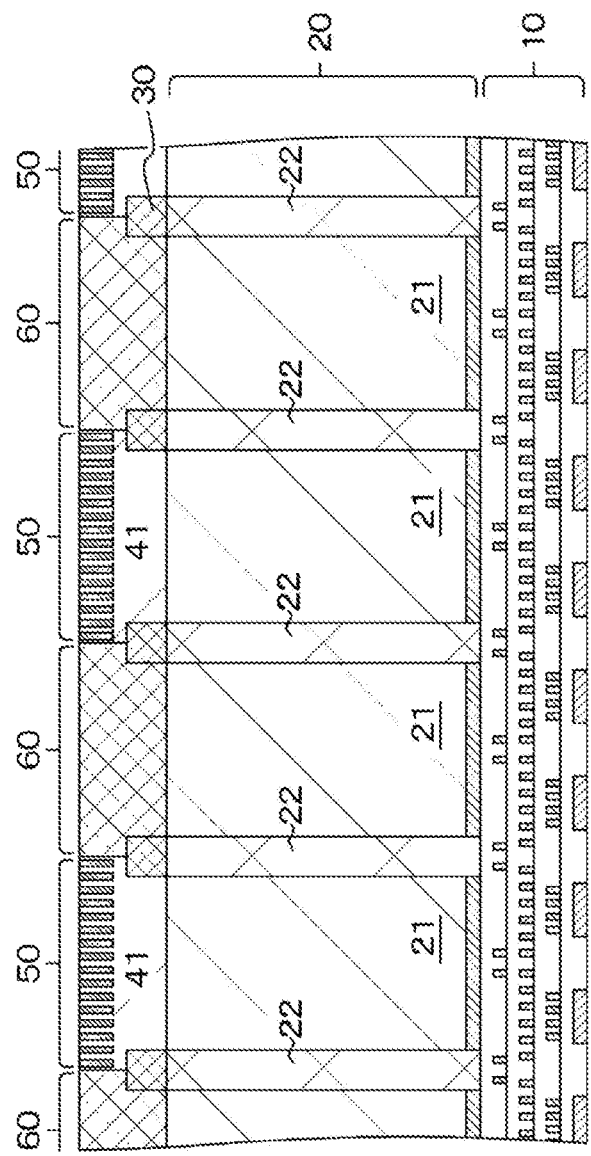
FIG. 11 is a schematic partial cross-sectional diagram for explaining the fabrication step of the imaging element, continued from FIG. 10.

[Step-140] (See FIG. 11)

The infrared light beam-absorbing filter layer 60 is next formed. The infrared light beam-absorbing filter layer 60 can be formed at a predetermined location by, for example, using a lithography technique and an etching technique after applying a material constituting the infrared light beam-absorbing filter layer on the entire face.

[Step-150]

The imaging element 100 depicted in FIG. 1 can be obtained by forming next the color filter 70 on the entire face including the polarizer 50 and the infrared light beam-absorbing filter layer 60 using a known method.

Figure 12:
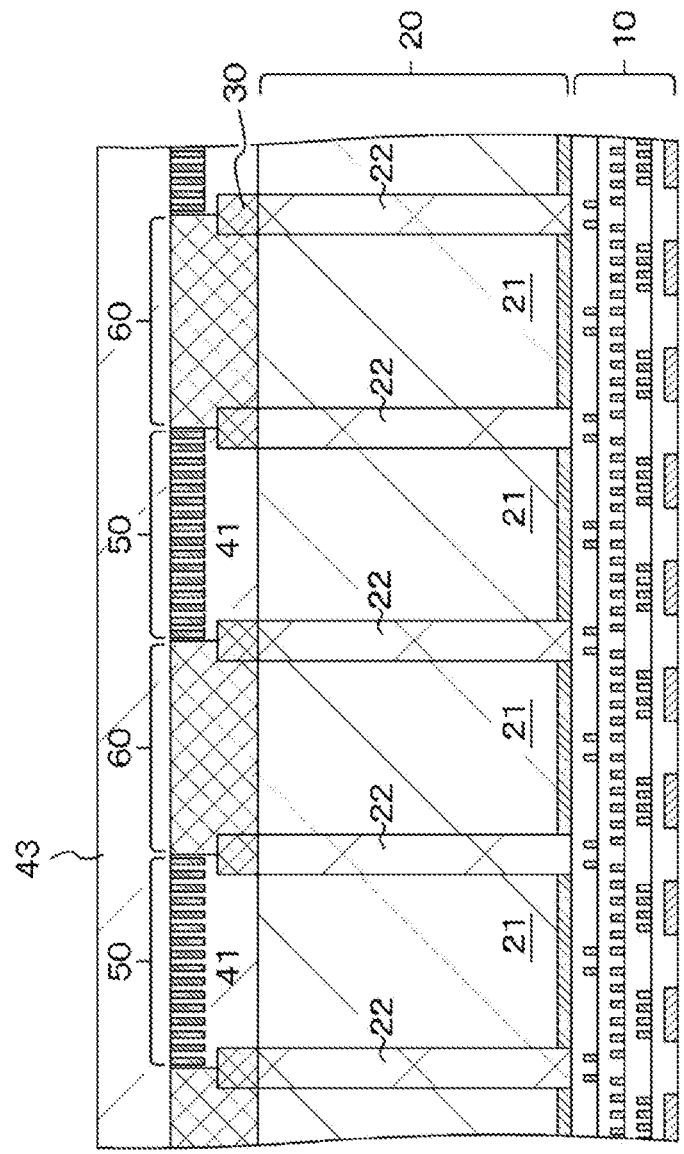
FIG. 12 is a schematic partial cross-sectional diagram for explaining the fabrication step in a case where a flattening layer is further stacked.

Note that, in a case where it is necessary, as depicted in FIG. 12, the color filter 70 may be formed after forming a flattening layer 43 on the entire face including the polarizer 50 and the infrared light beam-absorbing filter layer 60.

The imaging element 100 has been described with reference to FIG. 1 and the like as above while the imaging element 100 can take various variations thereof. The variations will be described with proper reference to the drawings.

[Relation Between Pixel Detecting Polarized Light Beam and Light Beam to be Detected]

In FIG. 1, it is assumed that the polarizer is placed in the pixels for infrared light beams. In other words, in this configuration, the polarization information is acquired on the basis of the infrared light beams.

In some cases, a configuration may also be adopted in which the polarizer is placed in the pixels for visible light beams. Following descriptions will be made with reference to FIG. 13 and FIG. 14.

Figure 13:
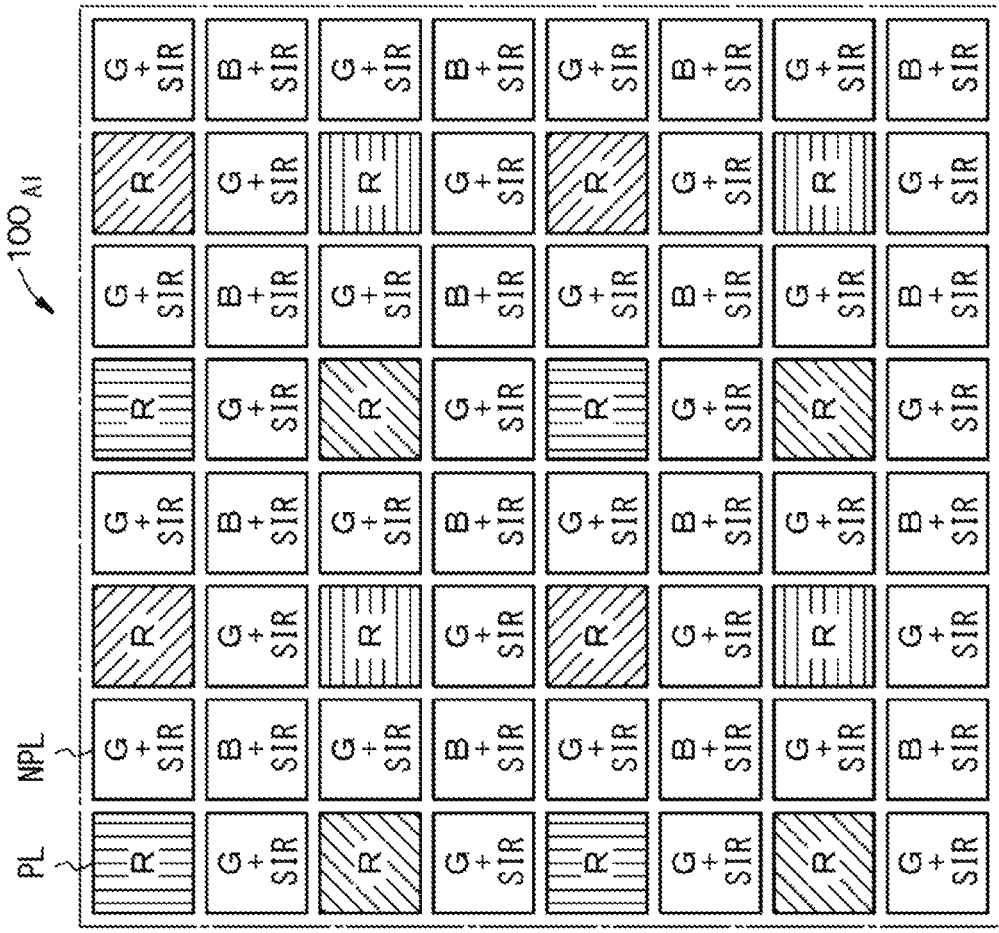
FIG. 13 is a schematic diagram of a portion of a planar layout in a pixel area, for explaining placement of color filters in a case where a polarized light beam of a red light beam is detected.

FIG. 13 is a schematic diagram of a portion of a planar layout in the pixel area, for explaining placement of color filters in a case where a polarized light beam of a red light beam is detected.

In an imaging element $100_{A1}$ depicted in FIG. 13, the arrangement of color filters has a configuration of what-is-called Bayer arrangement. In other words, the configuration is adopted in which a red, a green, a green, and a blue filters are each placed in corresponding one of 2×2 pixels and a polarizer is placed in the pixel of red. The polarization information is acquired on the basis of infrared light beams. In FIG. 13, an infrared light beam-absorbing filter layer is placed in all the pixels having no polarizer placed therein.

Figure 14:
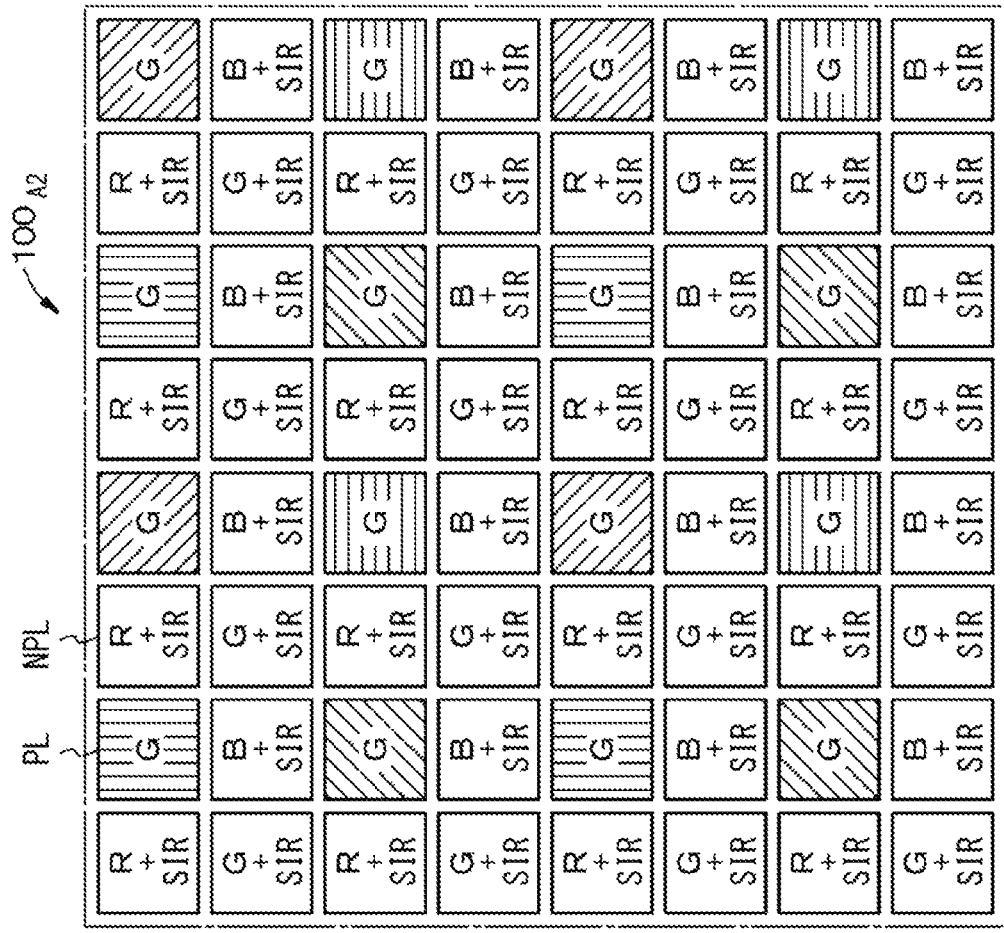
FIG. 14 is a schematic diagram of a portion of a planar layout in the pixel area, for explaining placement of color filters in a case where a polarized light beam of a green light beam is detected.

FIG. 14 is a schematic diagram of a portion of a planar layout in the pixel area, for explaining placement of color filters in a case where a polarized light beam of a green light beam is detected.

Also in an imaging element $100_{A2}$ depicted in FIG. 14, the arrangement of the color filters has a configuration of what-is-called Bayer arrangement. In other words, a red, a green, a green, and a blue filters are each placed in corresponding one of 2×2 pixels. The configuration is however adopted in which a polarizer is placed in one of the two green pixels. Moreover, also in FIG. 14, an infrared light beam-absorbing filter layer is placed in all the pixels having no polarizer placed therein.

[Placement of Color Filters]

In FIG. 1, the configuration is adopted in which image information relating to red, green, and blue and polarization information are acquired, and an aspect is adopted in which a color image to be acquired. However, depending on the use, a case can be considered where acquisition of image information relating to a single color or white is preferable.

Figure 15:
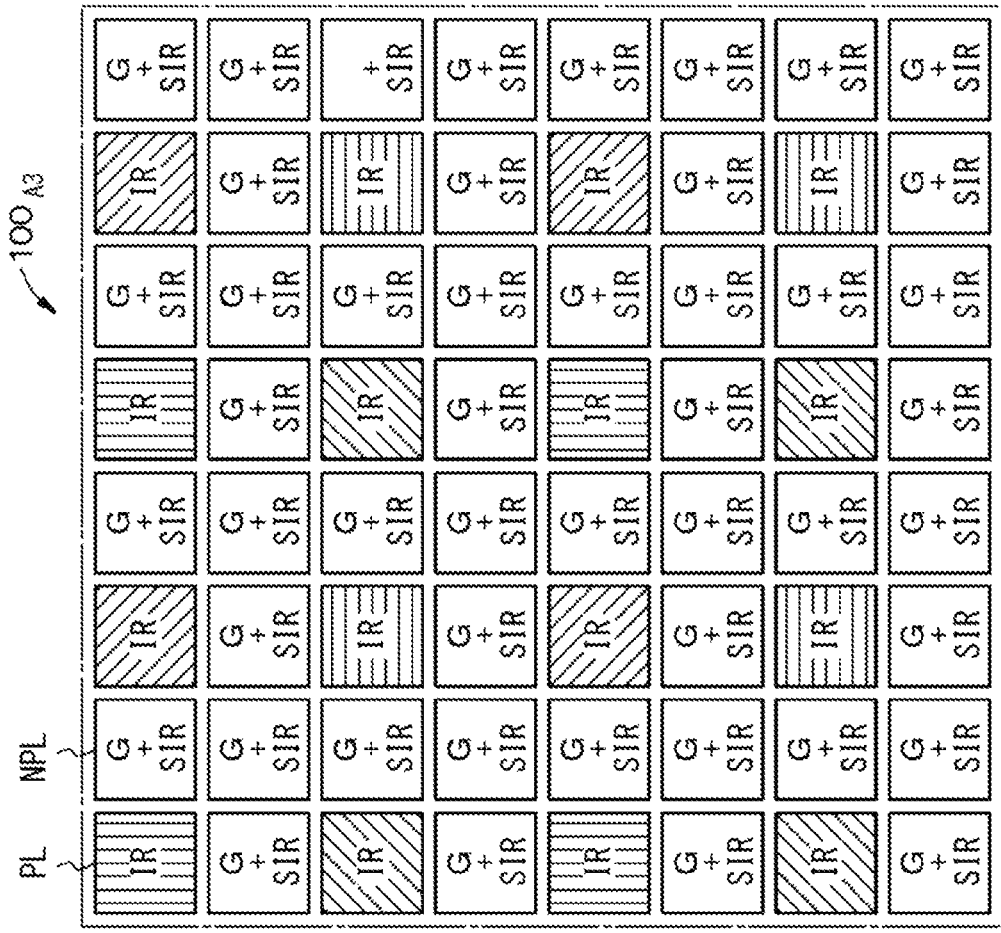
FIG. 15 is a schematic diagram of a portion of a planar layout in the pixel area, for explaining placement of color filters in a case where a polarized light beam of an infrared light beam and a green light beam are detected.

FIG. 15 is a schematic diagram of a portion of a planar layout in the pixel area, for explaining placement of color filters in a case where a polarized light beam of an infrared light beam and a green light beam are detected.

For example, in the case of the use of observing the oxygen binding condition of hemoglobin, it is satisfying that the imaging by the visible light beams is executed on the basis of the green light beam. An imaging element $100_{A3}$ depicted in FIG. 15 is an example of the case of such a use, and an infrared light beam-transmitting filter is placed in one of the 2×2 pixels and a green filter is placed in each of the remaining three pixels. A polarizer is placed in the pixel for an infrared light beam. Also in FIG. 15, an infrared light beam-absorbing filter layer is placed in all the pixels having no polarizer placed therein.

Figure 16:
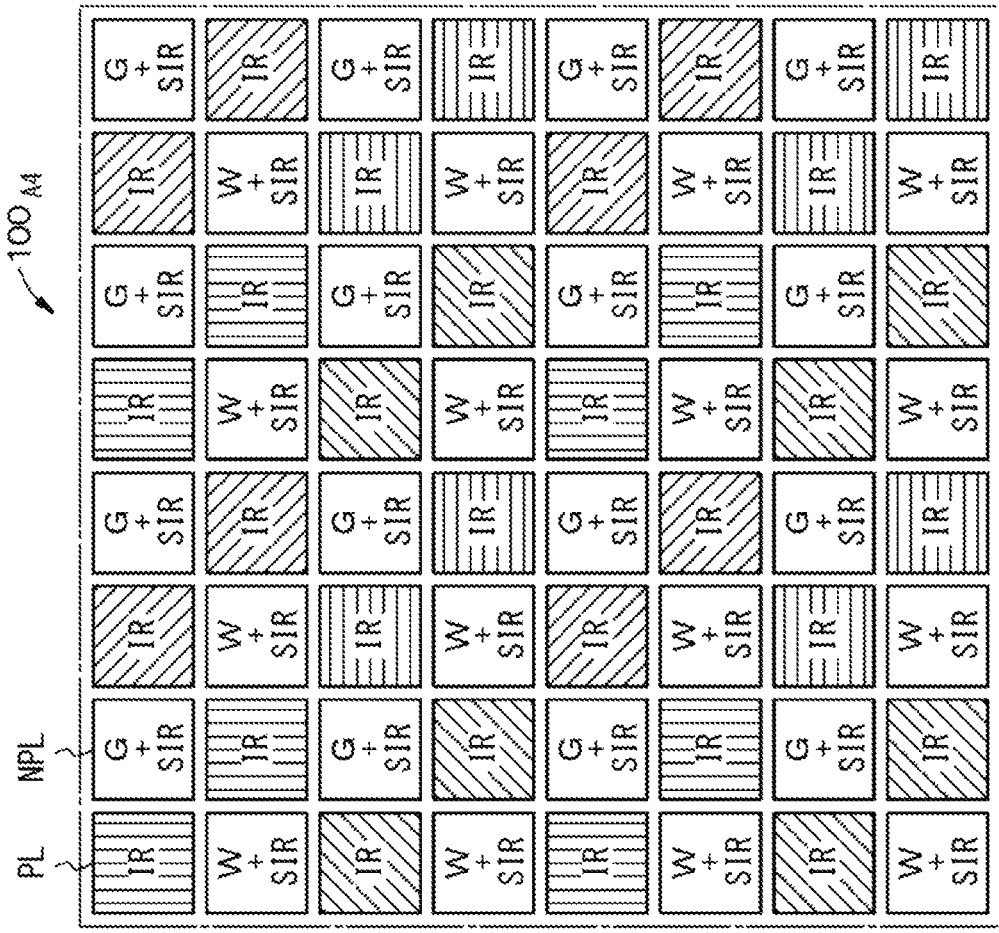
FIG. 16 is a schematic diagram of a portion of a planar layout in the pixel area, for explaining placement of color filters in a case where a polarized light beam of an infrared light beam, a green light beam, and a white light beam are detected.

FIG. 16 is a schematic diagram of a portion of a planar layout in the pixel area, for explaining placement of color filters in a case where a polarized light beam of an infrared light beam, a green light beam, and a white light beam are detected.

In an imaging element $100_{A4}$ depicted in FIG. 16, an infrared light beam-transmitting filter, a green filter, a white filter, and an infrared light beam-transmitting filter are each placed in corresponding one of 2×2 pixels. A polarizer is placed in the pixels having the infrared light beam-transmitting filter placed therein. Moreover, also in FIG. 16, an infrared light beam-absorbing filter layer is placed in all the pixels having no polarizer placed therein.

In the example depicted in FIG. 16, imaging is executed on the basis of the green light beam and the white light beam, and the polarization information is acquired on the basis of the infrared light beam. In addition, in the case of this placement, a pixel having the polarizer placed therein is placed so as to be adjacent to another pixel having no polarizer placed therein through a side of the pixel and to be adjacent to another pixel having the polarizer placed therein through a vertex of the pixel. As a result, the placement density of polarizers doubles those in the previous examples and this placement has therefore an advantage that the sensitivity is improved in acquiring the polarization information.

Figure 17:
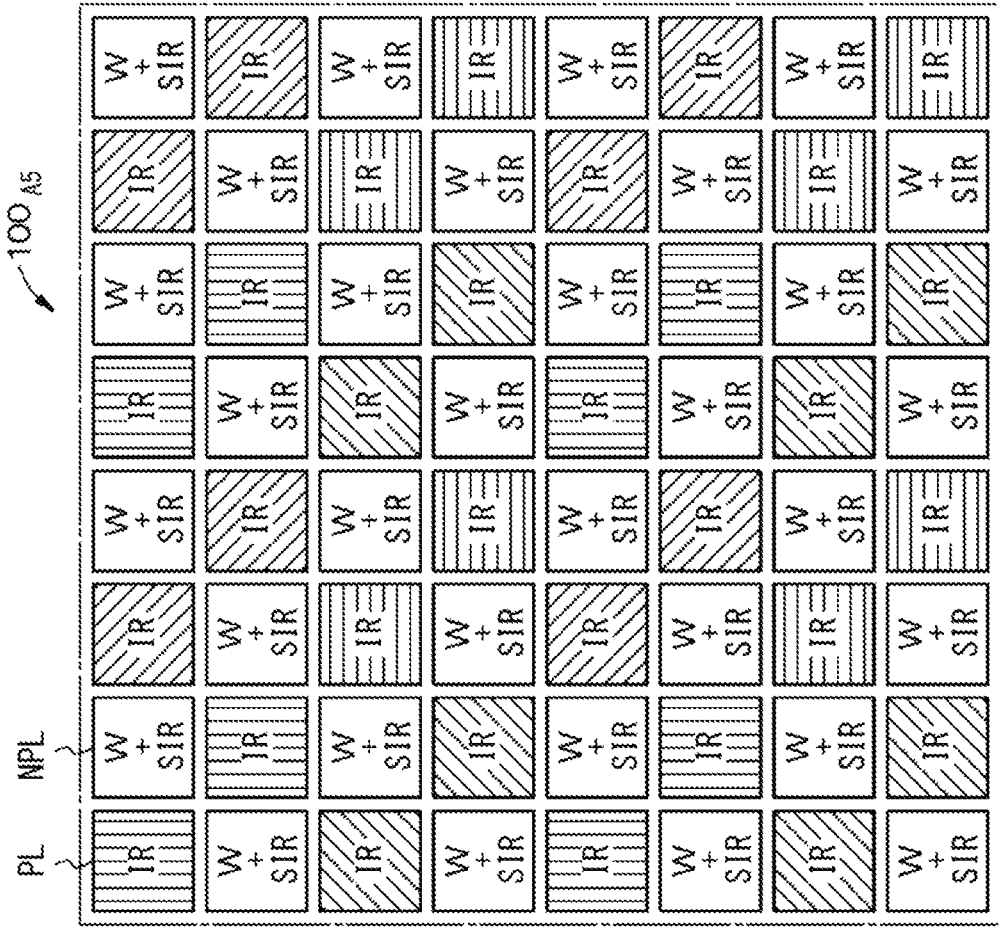
FIG. 17 is a schematic diagram of a portion of a planar layout in the pixel area, for explaining placement of color filters in a case where a polarized light beam of an infrared light beam and a white light beam are detected.

FIG. 17 is a schematic diagram of a portion of a planar layout in the pixel area, for explaining placement of color filters in a case where a polarized light beam of an infrared light beam and a white light beam are detected.

In an imaging element $100_{A5}$ depicted in FIG. 17, an infrared light beam-transmitting filter, a white filter, a white filter, and an infrared light beam-transmitting filter are each placed in corresponding one of 2×2 pixels. A polarizer is placed in the pixels having the infrared light beam-transmitting filter placed therein. Moreover, also in FIG. 17, an infrared light beam-absorbing filter layer is placed in all the pixels having no polarizer placed therein.

In the example depicted in FIG. 17, imaging is executed on the basis of the white light beam and the polarization information is acquired on the basis of the infrared light beam. Note that, also with this placement, the placement density of polarizers doubles those in the previous examples and this placement has an advantage that the sensitivity is improved in acquiring the polarization information.

[Placement of Infrared Light Beam-Absorbing Filter Layers and Polarizers]

In the previous examples, it is assumed that the infrared light beam-absorbing filter layer is placed in all the pixels having no polarizer placed therein. In some cases, it can be considered that an infrared light beam-absorbing filter layer is placed in some pixels from among the pixels having no polarizer placed therein.

Figure 18:
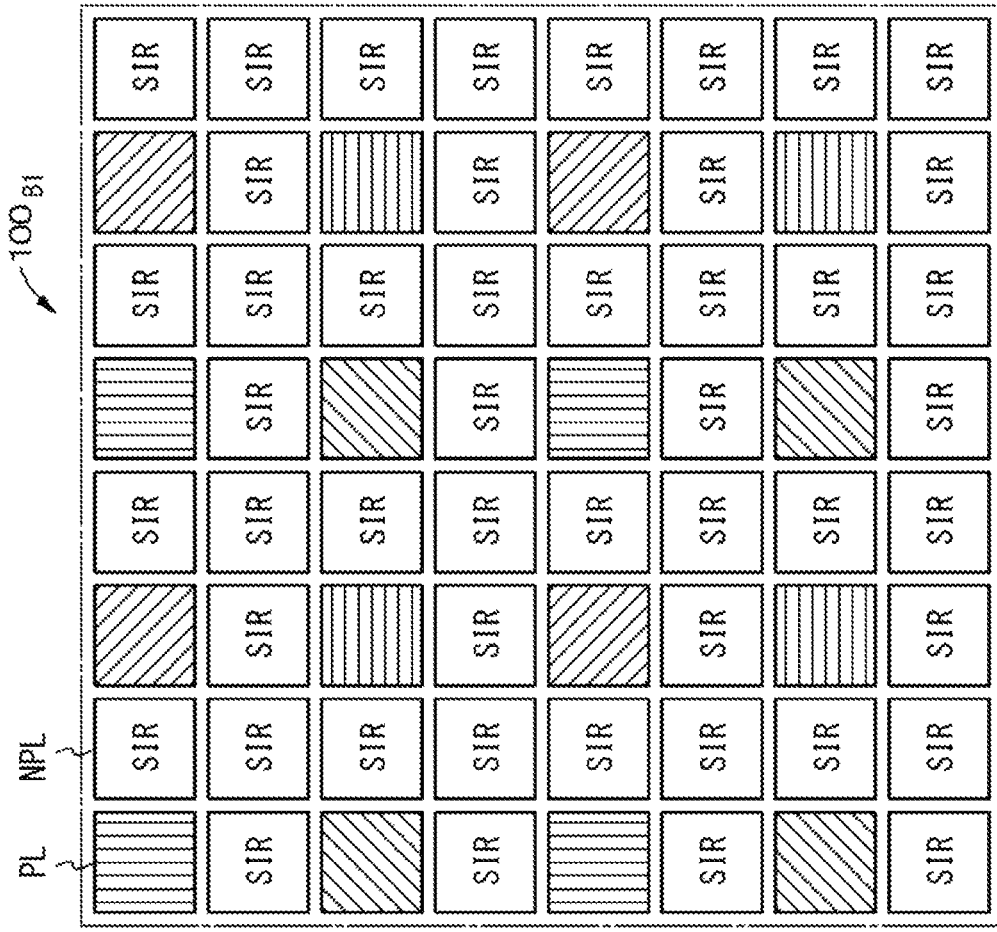
FIG. 18 is a schematic diagram of a portion of a planar layout in the pixel area, for explaining placement of polarizers and infrared light beam-absorbing filters.

FIG. 18 is a schematic diagram of a portion of a planar layout in the pixel area, for explaining placement of polarizers and infrared light beam-absorbing filter layers.

In an imaging element $100_{B1}$ depicted in FIG. 18, a polarizer is placed in one of 2×2 pixels and an infrared light beam-absorbing filter layer is placed in each of the other three pixels.

From the viewpoint such as entrance of a light beam from adjacent pixels, when a comparison is made for a pixel having the polarizer placed therein, between the entrance of a light beam from another pixel adjacent thereto through a side of the pixel and the entrance of a light beam from another pixel adjacent thereto through a vertex of the pixel, the influence of the latter is relatively weak compared to the influence of the former. A configuration in which only the entrance of the light beam from the pixel adjacent through the side is reduced can therefore be considered.

Figure 19:
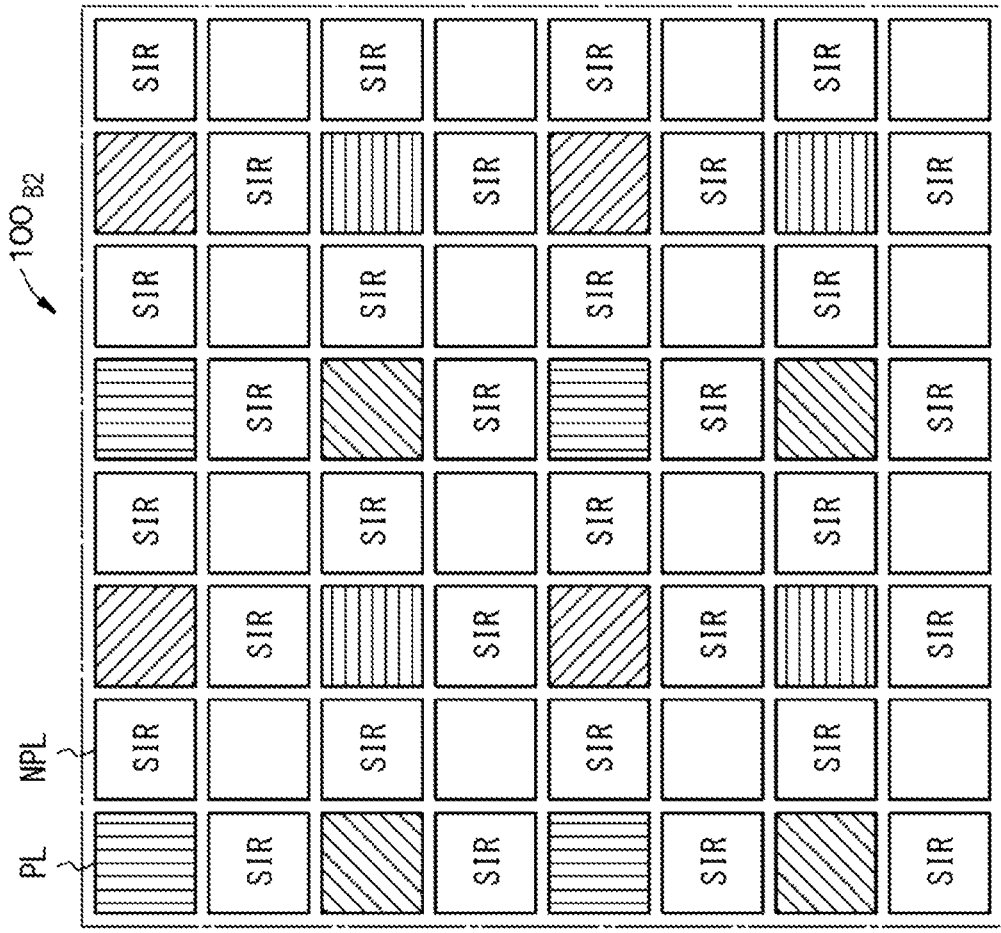
FIG. 19 is a schematic diagram of a portion of a planar layout in the pixel area, for explaining a configuration that does not include an infrared light beam-absorbing filter in another pixel adjacent to a pixel having the polarizer placed therein through a vertex of the pixel, in comparison with FIG. 18.

FIG. 19 is a schematic diagram of a portion of a planar layout in the pixel area, for explaining a configuration that does not include an infrared light beam-absorbing filter layer in another pixel adjacent to a pixel having the polarizer placed therein through a vertex of the pixel, in comparison with FIG. 18.

In an imaging element $100_{B2}$ depicted in FIG. 19, from among the pixels having no polarizer placed therein, an infrared light beam-absorbing filter layer is placed in a pixel adjacent to the pixel having the polarizer placed therein through the side of the pixel.

Figure 20:
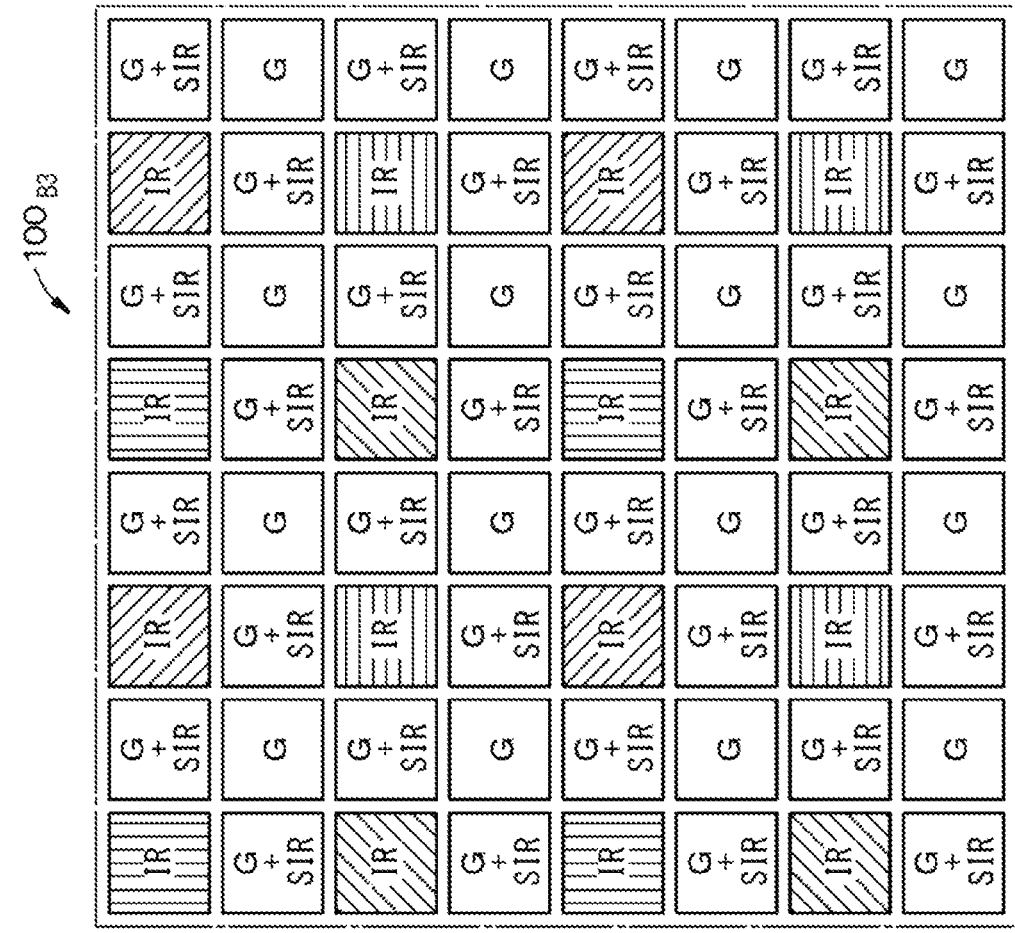
FIG. 20 is a schematic diagram of a portion of a planar layout in the pixel area, for explaining exemplary placement of color filters placed in the pixels in the configuration depicted in FIG. 19.

FIG. 20 is a schematic diagram of a portion of a planar layout in the pixel area, for explaining exemplary placement of color filters placed in the pixels in the configuration depicted in FIG. 19.

In an imaging element $100_{B3}$ depicted in FIG. 20, an infrared light beam-absorbing filter layer is placed in one of 2×2 pixels and a green filter is placed in each of the other three pixels.

Compared to the imaging element $100_{A3}$ depicted in FIG. 15 described above, in the imaging element $100_{B3}$ depicted in FIG. 20, the infrared light beam-absorbing filter layer is omitted in some of the pixels for green. The imaging element $100_{B3}$ therefore facilitates improvement of the imaging sensitivity and also has an advantage that the influence of the incidence light beams from the adjacent pixels can be reduced to some extent for the pixels each having the polarizer placed therein.

Exemplary placement of the polarizers will next be described.

Figure 21:
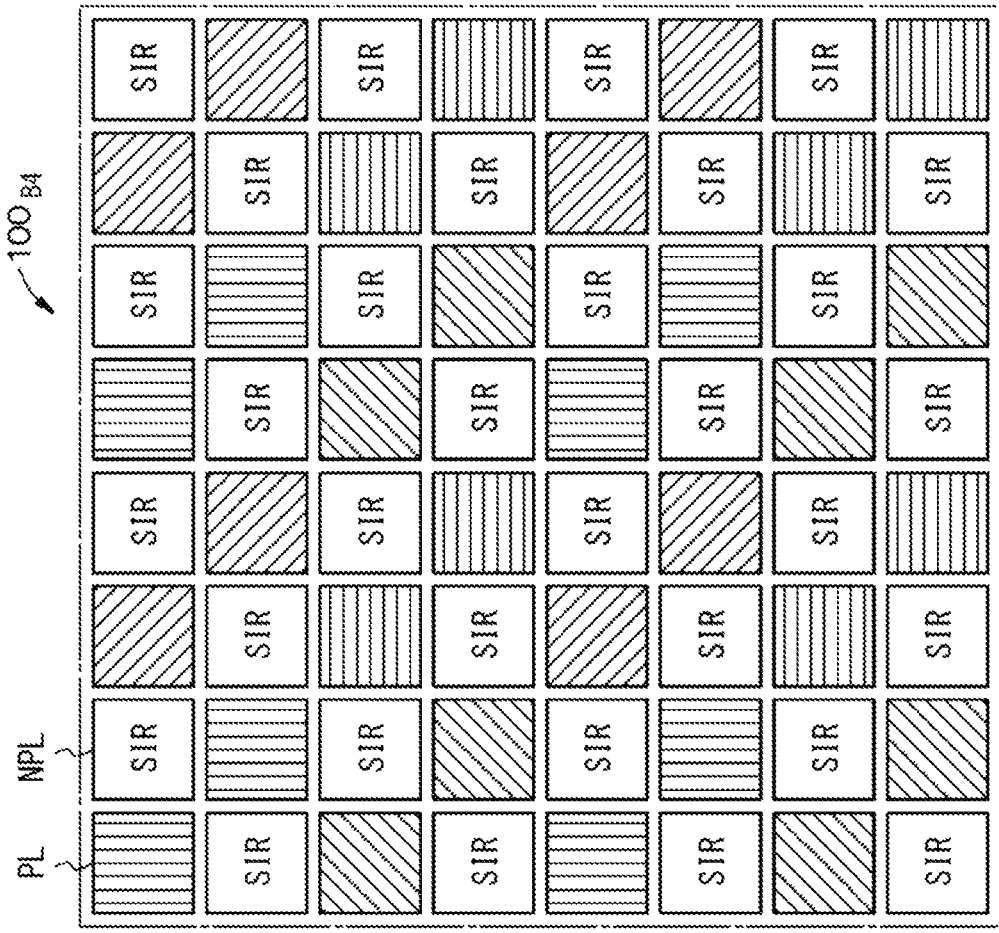
FIG. 21 is a schematic diagram of a portion of a planar layout in the pixel area, for explaining placement of polarizers and infrared light beam-absorbing filters.

FIG. 21 is a schematic diagram of a portion of a planar layout in the pixel area, for explaining placement of polarizers and infrared light beam-absorbing filter layers.

In an imaging element $100_{B4}$ depicted in FIG. 21, polarizers whose azimuth angles are equal to each other are placed in a pair of obliquely lining pixels from among 2×2 pixels and an infrared light beam-absorbing filter layer is placed in the remaining pixels. Note that the polarizers are placed to have different azimuth angles in units of 2×2 pixels. FIG. 16 described above explains such placement.

In the case of this placement, the pixel having no polarizer placed therein is surrounded by four polarizers through the sides thereof. Two of the four polarizers, however, have the equal azimuth angle. Therefore, to acquire information relating to the four types of azimuth angle of polarization, the information relating to the polarized pixel present at a location distant from the pixel having no polarizer placed therein has to be used.

From the viewpoint such as that polarization information is reflected on image information of a normal pixel, it is preferred that information relating to all the azimuth angles be able to be acquired from polarized pixels adjacent to a normal pixel.

Figure 22:
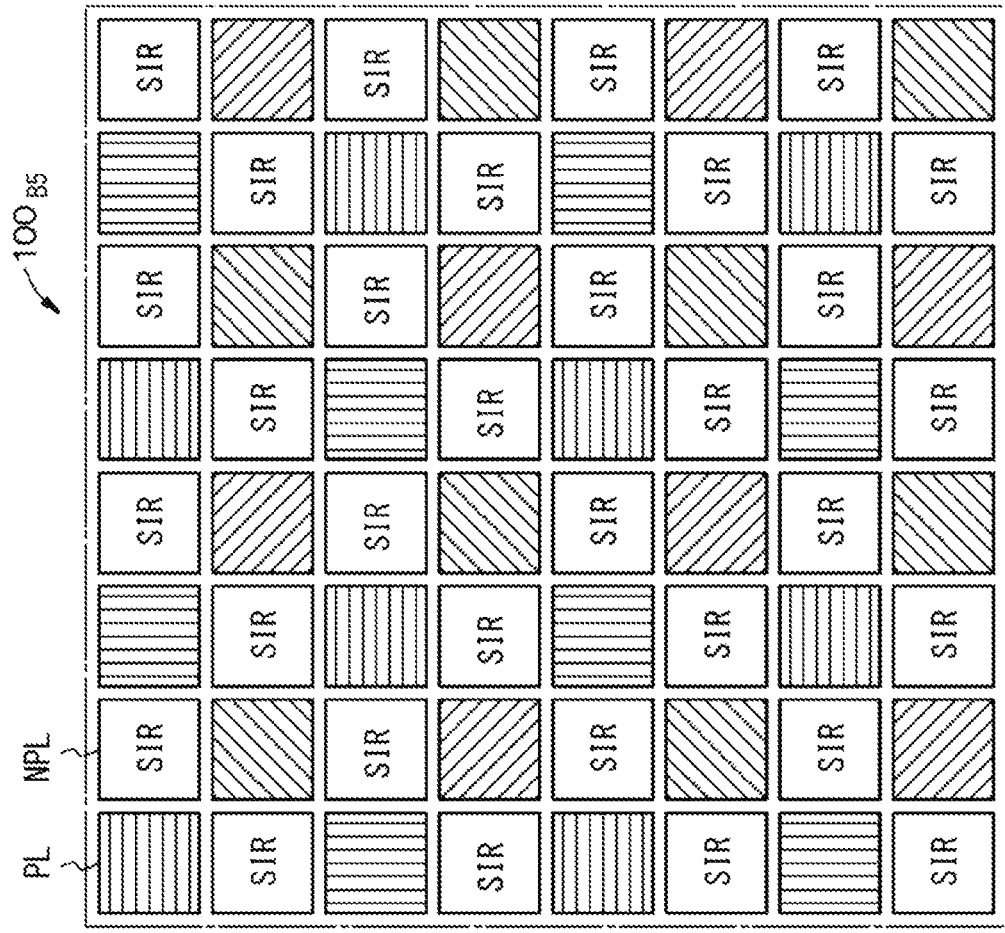
FIG. 22 is a schematic diagram of a portion of a planar layout in the pixel area, for explaining placement of polarizers and infrared light beam-absorbing filters.
Figure 23B:
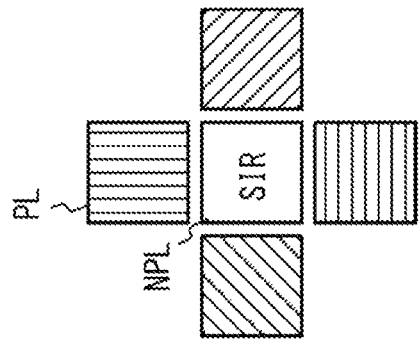
FIG. 23A to FIG. 23D are schematic diagrams for explaining a state where polarizers whose azimuth angles are different from each other are placed on sides of a pixel having an infrared light beam-absorbing filter placed therein, in the configuration depicted in FIG. 22.
Figure 23D:
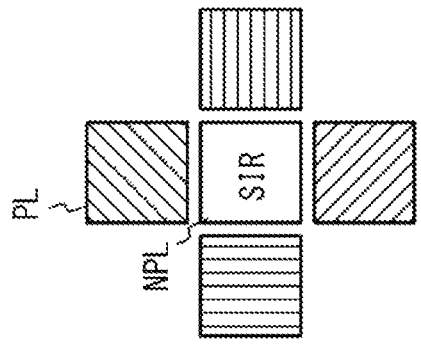
Figure 23A:
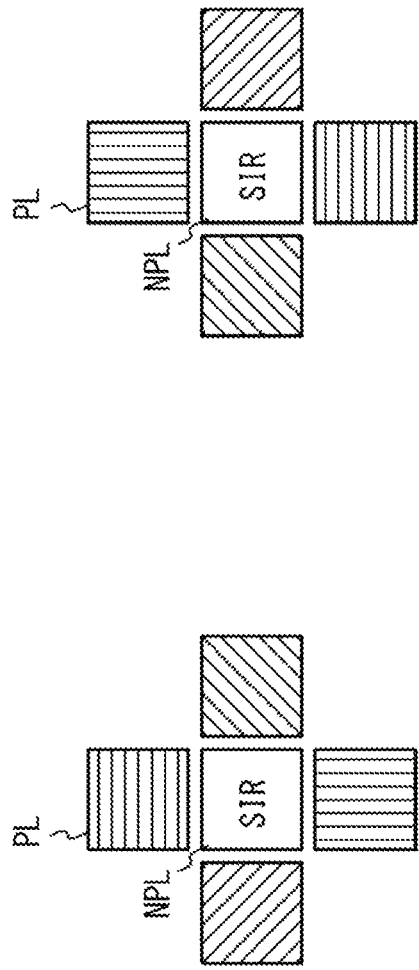
Figure 23C:
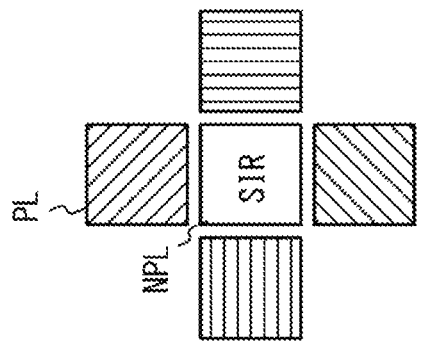

FIG. 22 is a schematic diagram of a portion of a planar layout in the pixel area, for explaining placement of polarizers and infrared light beam-absorbing filter layers. FIG. 23A to FIG. 23D are schematic diagrams for explaining a state where polarizers whose azimuth angles are different from each other are placed on sides of a pixel having an infrared light beam-absorbing filter layer placed therein, in the configuration depicted in FIG. 22.

An imaging element $100_{B5}$ depicted in FIG. 22 are different from the imaging element $100_{B4}$ depicted in FIG. 21 in that polarizers whose azimuth angles are different from each other are placed in a pair of obliquely lining pixels from among 2×2 pixels.

In the imaging element $100_{B5}$, a pixel having no polarizer placed therein is placed so as to be adjacent to pixels having polarizers placed therein whose azimuth angles of polarization are different from each other, on all the sides of the pixel. In this configuration, the relation among the azimuth angles of the polarized elements surrounding the normal pixel is any of those depicted in FIG. 23A to FIG. 23D. The polarization information relating to all the azimuth angles can therefore be acquired from the polarized pixels adjacent to the normal pixel.

Another exemplary placement will next be descried.

In the previous examples, the polarized pixels are not adjacent to each other through a side. In some cases, however, a configuration in which a plurality of polarized pixels is placed to form a group can be considered.

Figure 24:
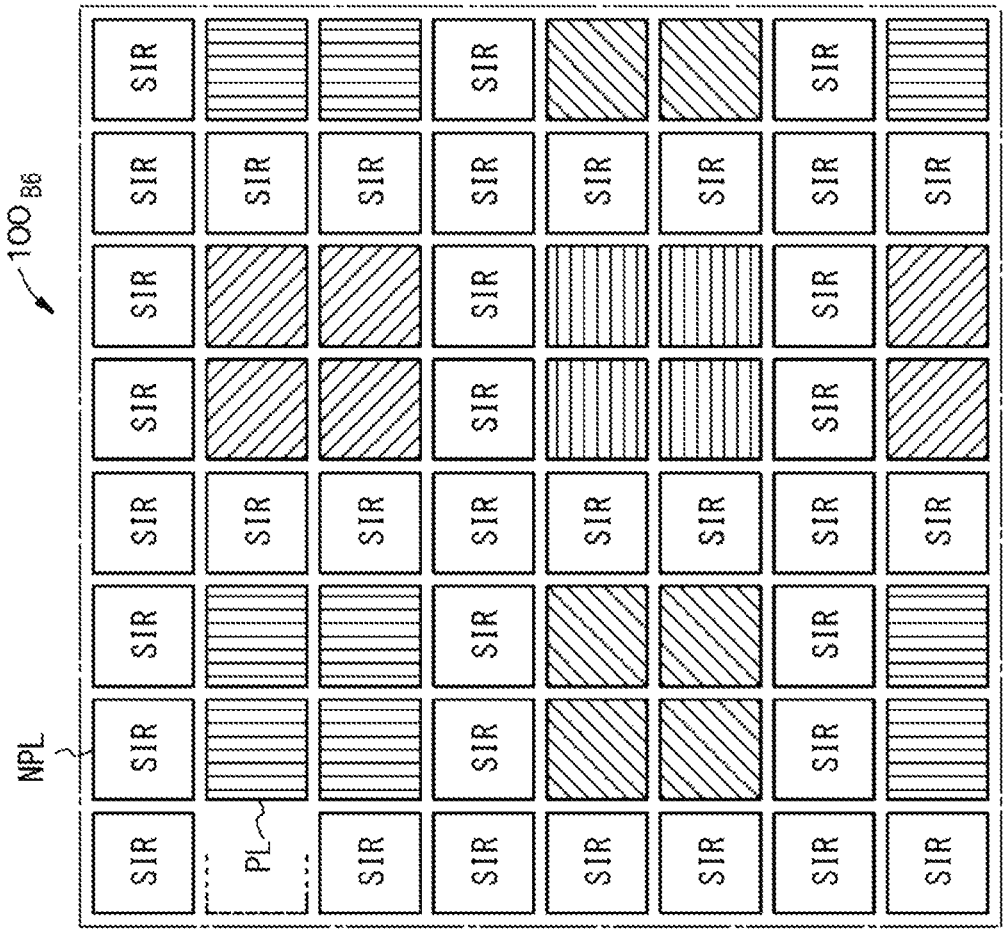
FIG. 24 is a schematic diagram of a portion of a planar layout in the pixel area, for explaining placement of polarizers and infrared light beam-absorbing filters.

FIG. 24 is a schematic diagram of a portion of a planar layout in the pixel area, for explaining placement of polarizers and infrared light beam-absorbing filter layers.

In an imaging element $100_{B6}$ depicted in FIG. 24, a plurality of pixels each having the polarizer placed therein is placed adjacent to each other and constitutes a pixel group, and the pixel group is placed so as to be surrounded by and adjacent to pixels having no polarizer placed therein. Although it is assumed in the figure that the pixel group of the polarized pixels includes 2×2 pixels, this is only exemplification. The polarized pixels constituting one pixel group have the polarizers placed therein whose azimuth angles of polarization are equal to each other. In addition, an infrared light beam-absorbing filter layer is placed in all the pixels having no polarizer placed therein.

Moreover, although it is assumed in the previous examples that four types of azimuth angles of polarizers are present, in some cases, a configuration for three or fewer types of azimuth angles can be considered.

Figure 25:
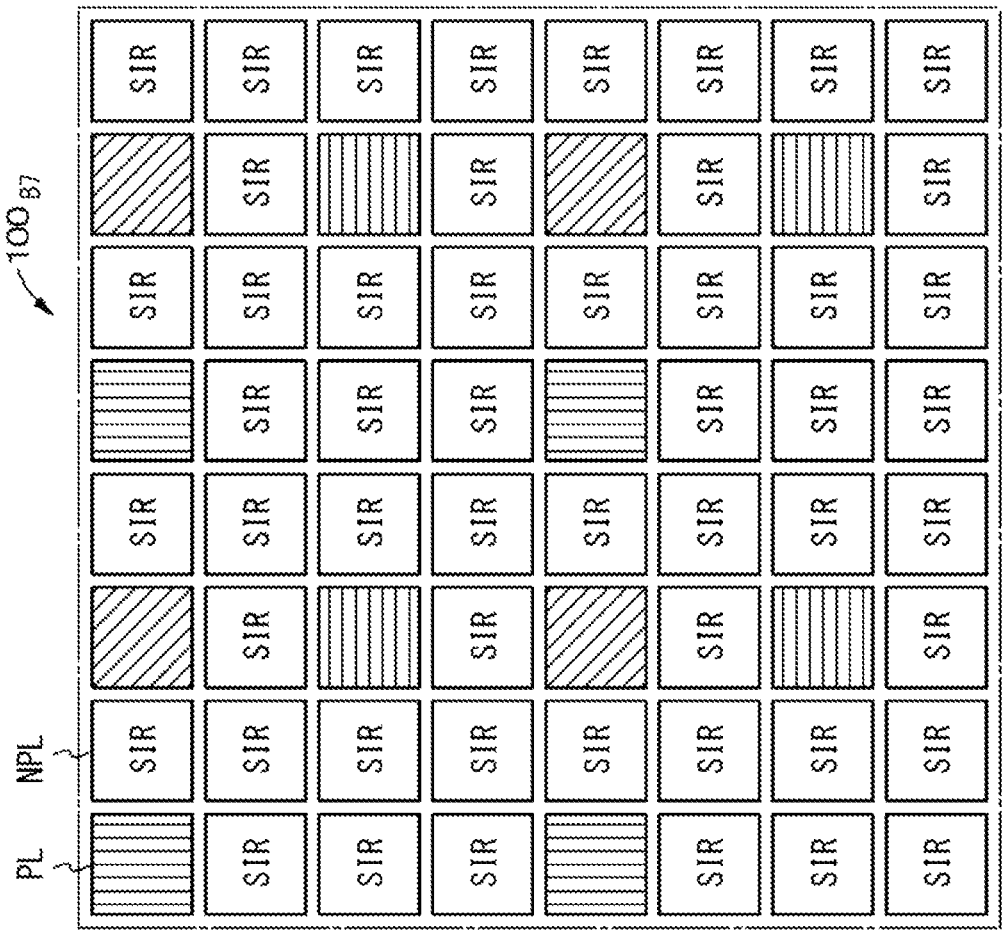
FIG. 25 is a schematic diagram of a portion of a planar layout in the pixel area, for explaining placement of polarizers and infrared light beam-absorbing filters.

FIG. 25 is a schematic diagram of a portion of a planar layout in the pixel area, for explaining placement of polarizers and infrared light beam-absorbing filter layers.

In an imaging element $100_{B7}$ depicted in FIG. 25, three types of azimuth angles of polarizers are present. Basically, the image element $100_{B7}$ has a configuration formed by replacing the polarizers each having a specific azimuth angle with the infrared light beam-absorbing filter layers, of the placement depicted in FIG. 18.

[Oblique Placement of Pixels]

It is assumed in the previous examples that each of the sides of the pixels is placed along the X-direction or the Y-direction. From the viewpoint of the resolution and the like, however, a configuration in which the pixels are obliquely placed can be considered.

Figure 26:
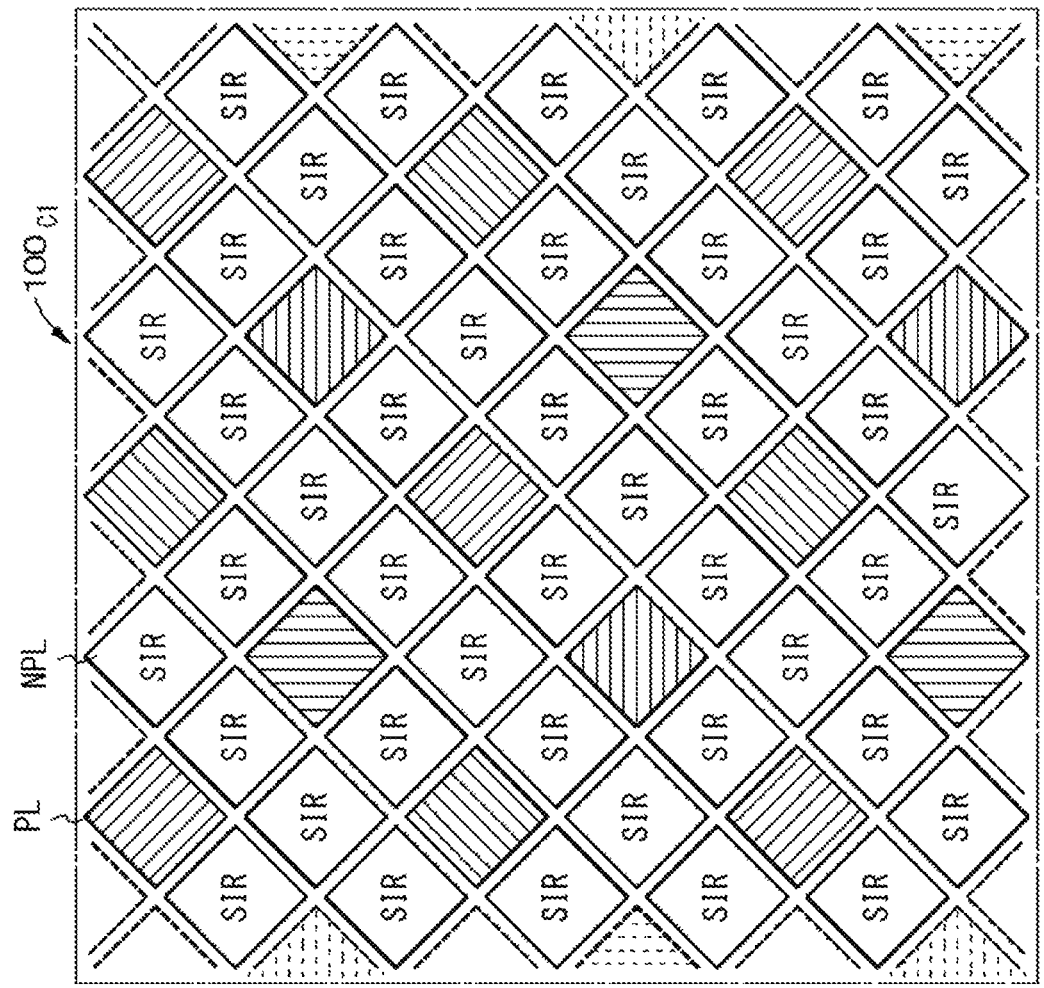
FIG. 26 is a schematic diagram of a portion of a planar layout in the pixel area, for explaining placement of polarizers and infrared light beam-absorbing filters in a configuration in which pixels are in oblique placement.

FIG. 26 is a schematic diagram of a portion of a planar layout in the pixel area, for explaining placement of polarizers and infrared light beam-absorbing filter layers in a configuration in which pixels are in oblique placement. This similarly applies to FIG. 27 and FIG. 28 described later.

An imaging element $100_{C1}$ depicted in FIG. 26 basically has a configuration obtained by setting the configuration depicted in FIG. 18 to be oblique by 45 degrees. Each of the polarized pixels is surrounded by the normal pixels in the entire periphery thereof.

Figure 27:
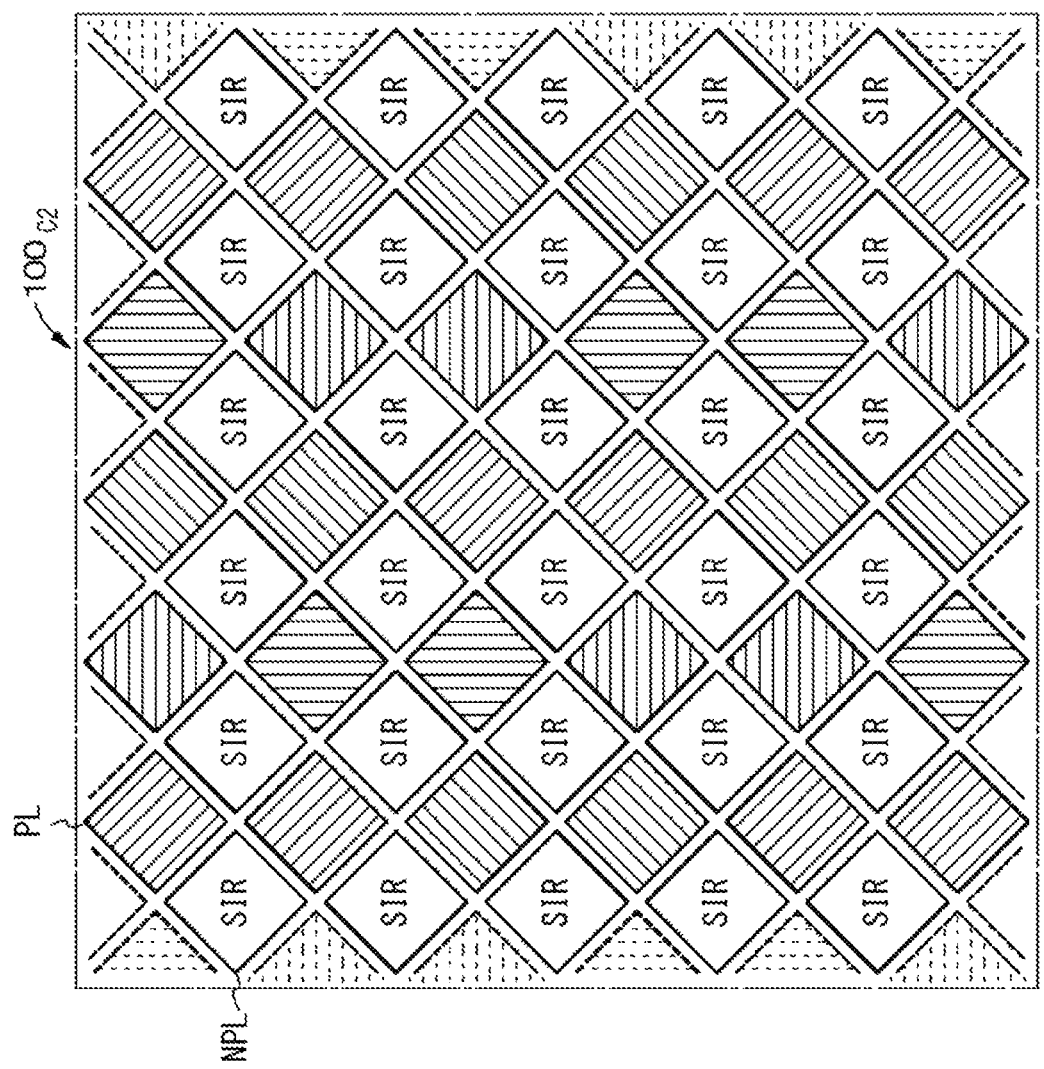
FIG. 27 is a schematic diagram of a portion of a planar layout in the pixel area, for explaining placement of polarizers and infrared light beam-absorbing filters in a configuration in which pixels are in oblique placement.

An imaging element $100_{C2}$ depicted in FIG. 27 basically has a configuration obtained by setting the configuration depicted in FIG. 21 to be oblique by 45 degrees.

In the case of this placement, a pixel having no polarizer placed therein is surrounded by four polarizers through the sides thereof. Two of the four polarizers, however, have the equal azimuth angle. Therefore, to acquire information relating to four types of azimuth angles of polarization, the information relating to the polarized pixel present at a location distant from the pixel having no polarizer placed therein has to be used.

Figure 28:
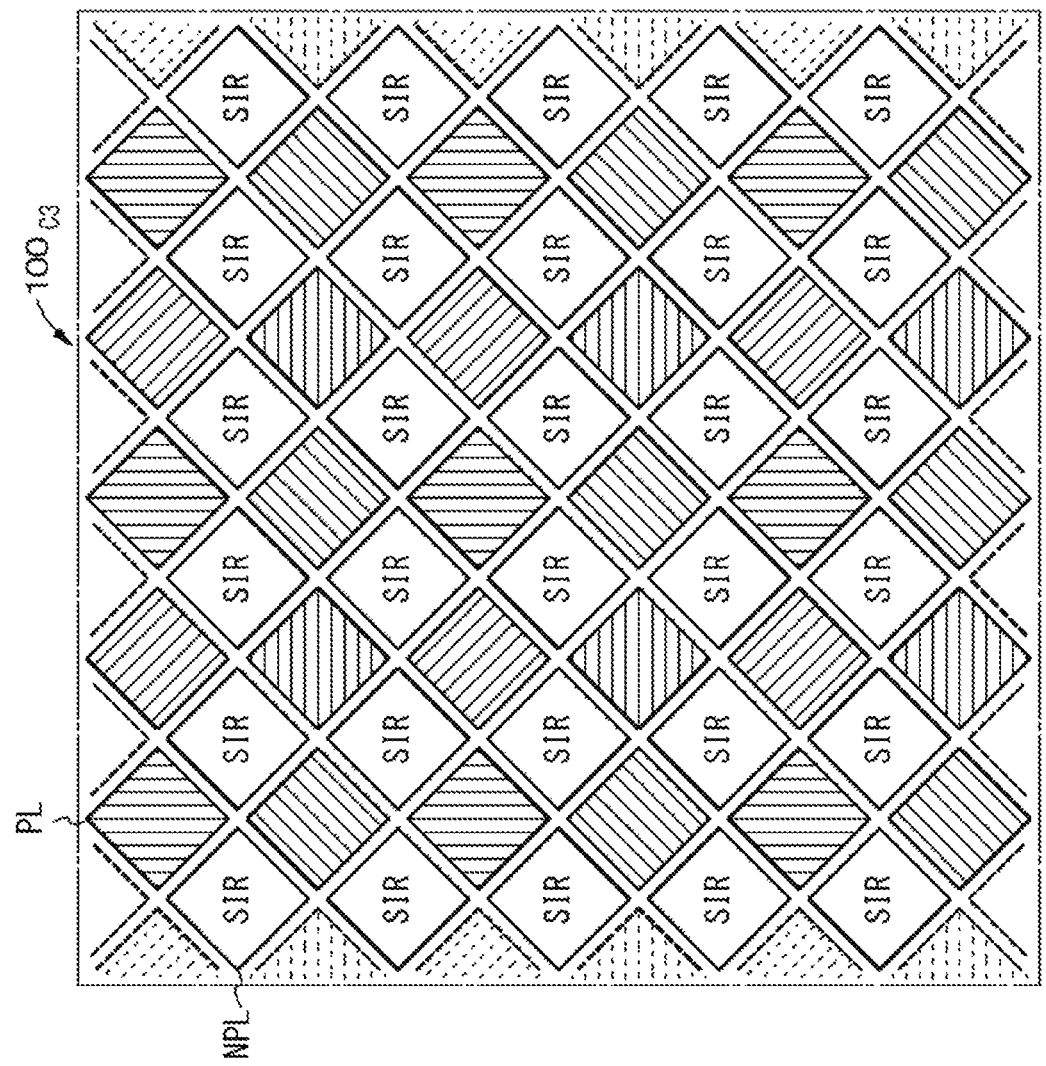
FIG. 28 is a schematic diagram of a portion of a planar layout in the pixel area, for explaining placement of polarizers and infrared light beam-absorbing filters in a configuration in which pixels are in oblique placement.
Figure 29A:
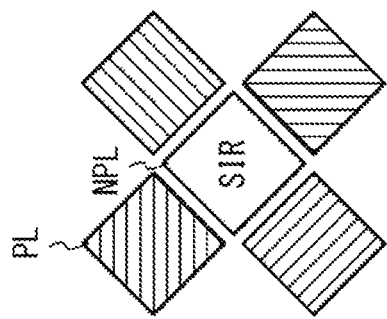
FIG. 29A to FIG. 29D are schematic diagrams for explaining a state where polarizers whose azimuth angles are different from each other are placed on sides of a pixel having an infrared light beam-absorbing filter placed therein, in the configuration depicted in FIG. 28.
Figure 29B:
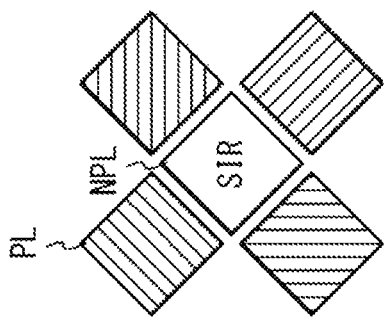
Figure 29C:
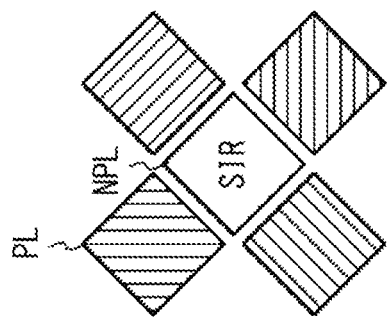
Figure 29D:
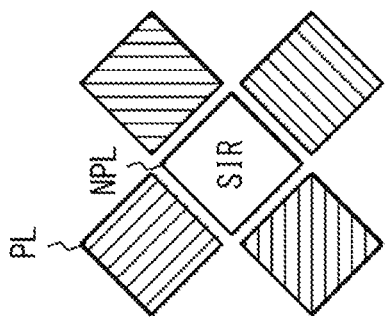

An imaging element $100_{C3}$ depicted in FIG. 28 basically has a configuration obtained by setting the configuration depicted in FIG. 22 to be oblique by 45 degrees.

With this configuration, the relation among the azimuth angles of polarized elements surrounding a normal pixel is any of those depicted in FIG. 29A to FIG. 29D. The polarization information relating to all the azimuth angles can therefore be acquired from the polarized pixels adjacent to the normal pixel.

[Exemplary Placement of Polarizers Having Same Structure]

In the case where polarizers whose azimuth angles are different from each other are constituted, it can be considered that the property of the polarizer is varied depending on the pixel shape. The length and the like of the wire grid constituting the polarizer are different between, for example, a polarizer including a wire grid extending along the sides of the pixel and a polarizer including a wire grid extending obliquely relative to the sides of the pixel, and it can therefore be considered that a difference may be generated in the optical property of the polarizer itself.

Therefore, with a configuration in which the polarizers have the same structure and are placed such that the azimuth angles of polarization are made different from each other by differentiating the placement relation of the polarizer with respect to the pixel, generation of a difference in the optical property of the polarizers themselves can therefore be reduced.

Figure 30:
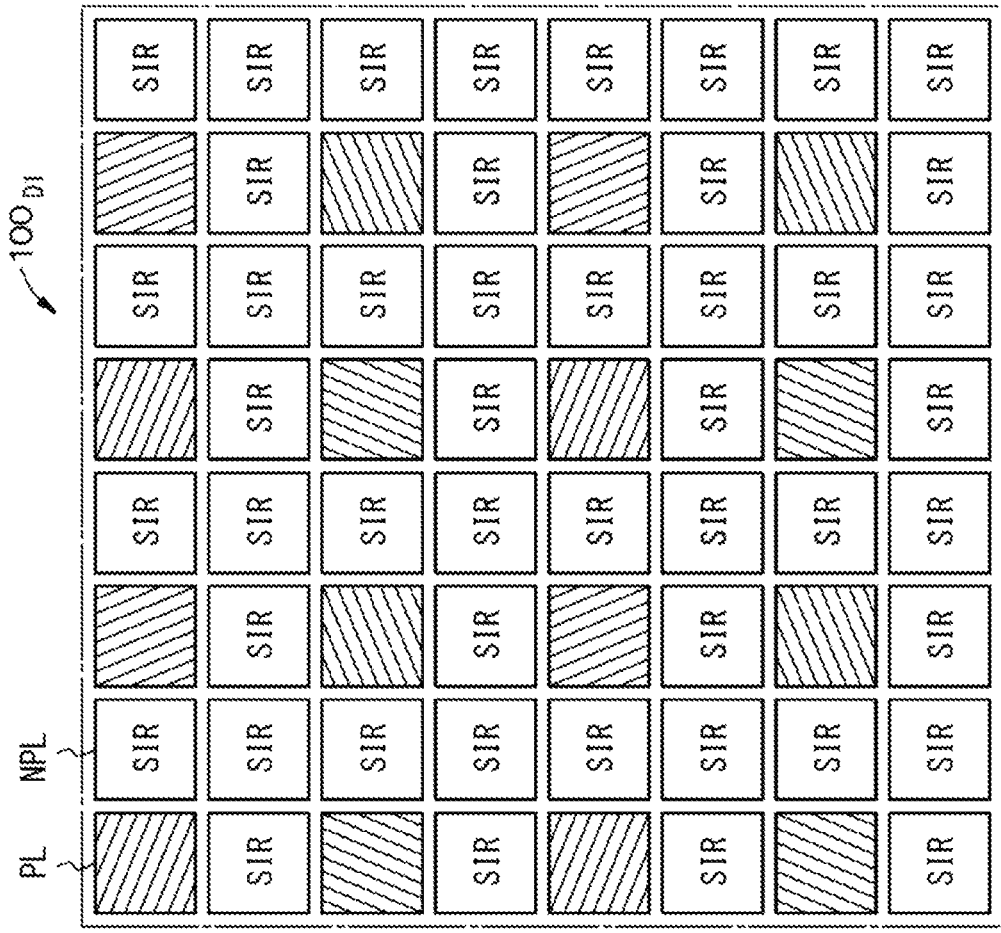
FIG. 30 is a schematic diagram of a portion of a planar layout in the pixel area, for explaining a configuration that uses polarizers capable of reducing dispersion of the optical property.
Figure 31B:
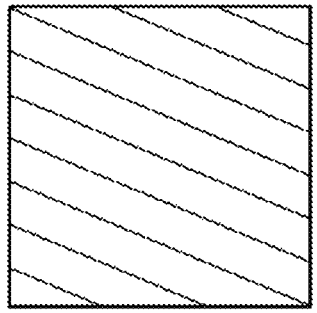
FIG. 31A to FIG. 31D are schematic planar diagrams for explaining a fact that the polarizers themselves are the same despite a difference in azimuth angle.
Figure 31D:
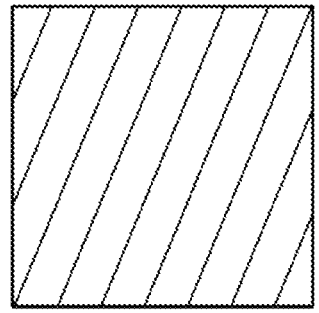
Figure 31A:
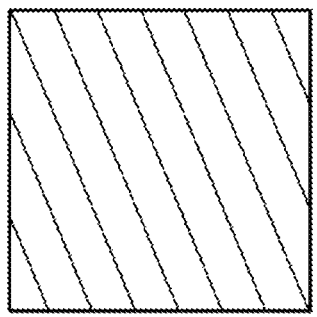
Figure 31C:
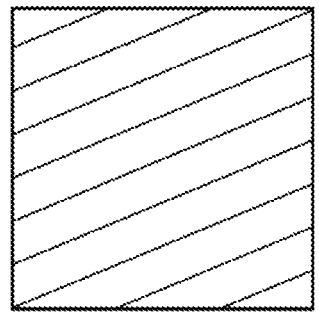

FIG. 30 is a schematic diagram of a portion of a planar layout in the pixel area, for explaining a configuration that uses polarizers capable of reducing dispersion of the optical property. FIG. 31A to FIG. 31D are schematic planar diagrams for explaining a fact that the polarizers themselves are the same despite the difference in the azimuth angle.

In an imaging element $100_{D1}$ depicted in FIG. 30, the azimuth angles of polarizers are set to 22.5 degrees, 67.5 degrees, 112.5 degrees, and 157.5 degrees.

As depicted in FIG. 31, assuming that the sides of each of the pixels have a substantially equal dimension, these polarizers whose azimuth angles are different from each other are obtained by placing the polarizers having the same structure so as to be rotated or inverted. According to this configuration, generation of a difference in the optical property of the polarizers themselves can therefore be reduced.

Second Embodiment

A second embodiment also relates to the imaging element according to the present disclosure.

In the first embodiment, an infrared light beam-absorbing filter layer is placed in each of at least some pixels of the pixels having no polarizer placed therein, as a material layer preventing transmission of a light beam having a wavelength of a predetermined range. Occurrence of a state is thereby reduced such as the one where the infrared light beam entering from the pixel having no polarizer 50 placed therein penetrates up to the photoelectric conversion part 21 of the pixel having the polarizer 50 placed therein.

The second embodiment adopts a configuration in which the polarization information is acquired on the basis of visible light beams and the image information is acquired on the basis of infrared light beams. In addition, in order to reduce color mixture caused by reaching of a visible light beam from a pixel having no polarizer placed therein to the photoelectric conversion part of a pixel having a polarizer placed therein, an infrared light beam-transmitting filter layer (an infrared light beam-transmitting filter) including a material that absorbs visible light beams and selectively transmits infrared light beams is placed in each of at least some pixels from among the pixels having no polarizer placed therein as a material layer preventing transmission of a light beam having a wavelength of a predetermined range.

Figure 32:
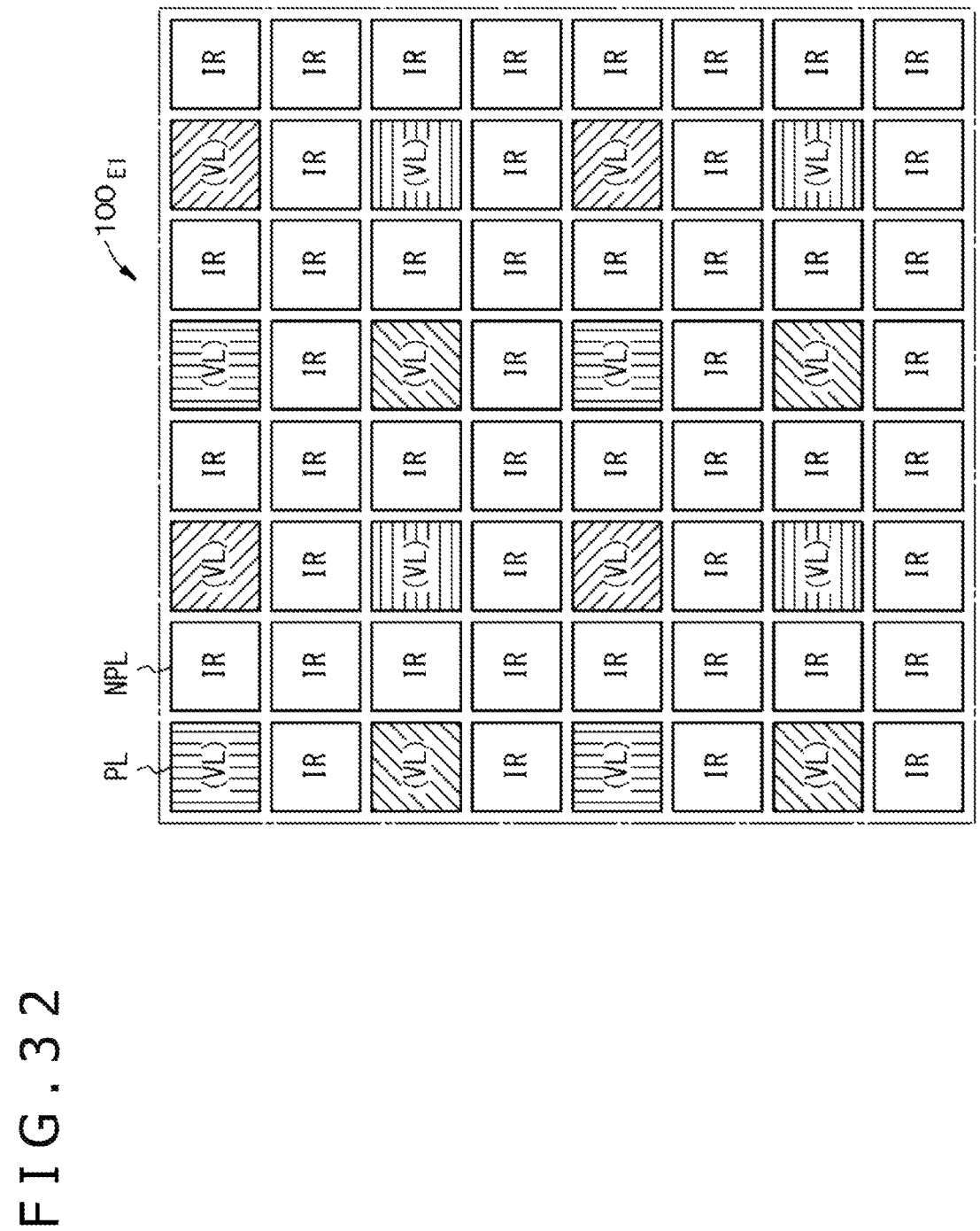
FIG. 32 is a schematic diagram of a portion of a planar layout in a pixel area of an imaging element according to a second embodiment of the present disclosure, in which polarization information is acquired on the basis of visible light beams and image information is acquired on the basis of infrared light beams.

FIG. 32 is a schematic diagram of a portion of a planar layout in a pixel area of an imaging element according to the second embodiment of the present disclosure, in which polarization information is acquired on the basis of visible light beams and image information is acquired on the basis of infrared light beams.

As depicted in FIG. 32, in the pixel area of an imaging element $100_{E1}$, a plurality of pixels is arranged in a two-dimensional matrix in an X-direction (the horizontal direction in the figure) and a Y-direction (the vertical direction in the figure).

In FIG. 1, a reference sign [VL] indicates that the pixel includes a filter transmitting a visible light beam such as, for example, a red filter, a green filter, or a blue filter. Moreover, a reference sign [IR] indicates that the pixel includes an infrared light beam-transmitting filter layer. This similarly applies to the other drawings.

In FIG. 32, a pixel having a polarizer placed therein is placed so as to be surrounded by and adjacent to pixels having no polarizer placed therein. In addition, an infrared light beam-transmitting filter layer is placed in all the pixels having no polarizer placed therein.

With this configuration, even if any visible light beam to be photoelectric-converted by a polarized pixel enters a normal pixel, the intensity thereof is attenuated by the infrared light beam-transmitting filter layer. Occurrence of a state can thereby be reduced such as where the visible light beam that has passed through the normal pixel reaches the photoelectric conversion part of the polarized pixel adjacent thereto. The extinction ratio in the pixel having the polarizer placed therein is therefore improved.

Figure 33:
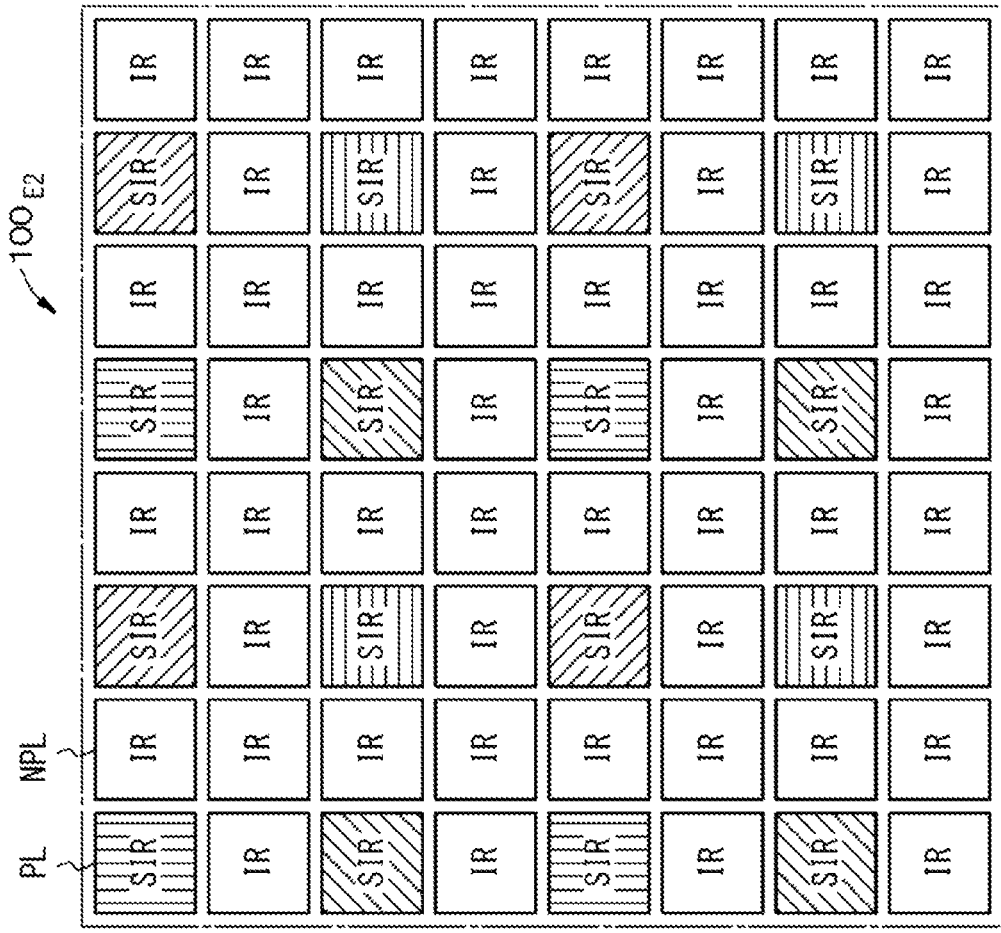
FIG. 33 is a schematic diagram of a portion of a planar layout in the pixel area of an imaging element that has a configuration in which an infrared-absorbing filter layer is placed in a pixel imaging a visible light beam.

In addition, as described above, the commercially available color filters to be used in imaging elements generally present a transmittance of approximately 100% on the side of the wavelength longer than 800 nm. It is therefore preferred in practice that an infrared light beam-absorbing filter layer is provided in addition to a color filter. FIG. 33 is a schematic diagram of a portion of a planar layout in the pixel area of an imaging element that has a configuration in which an infrared light beam-absorbing filter layer is placed in a pixel imaging a visible light beam.

As depicted in FIG. 33, in an imaging element $100_{E2}$, the polarized pixel imaging the visible light beam has the infrared-absorbing filter layer placed therein. The infrared-absorbing filter layer itself acts substantially as a white filter.

Figure 34:
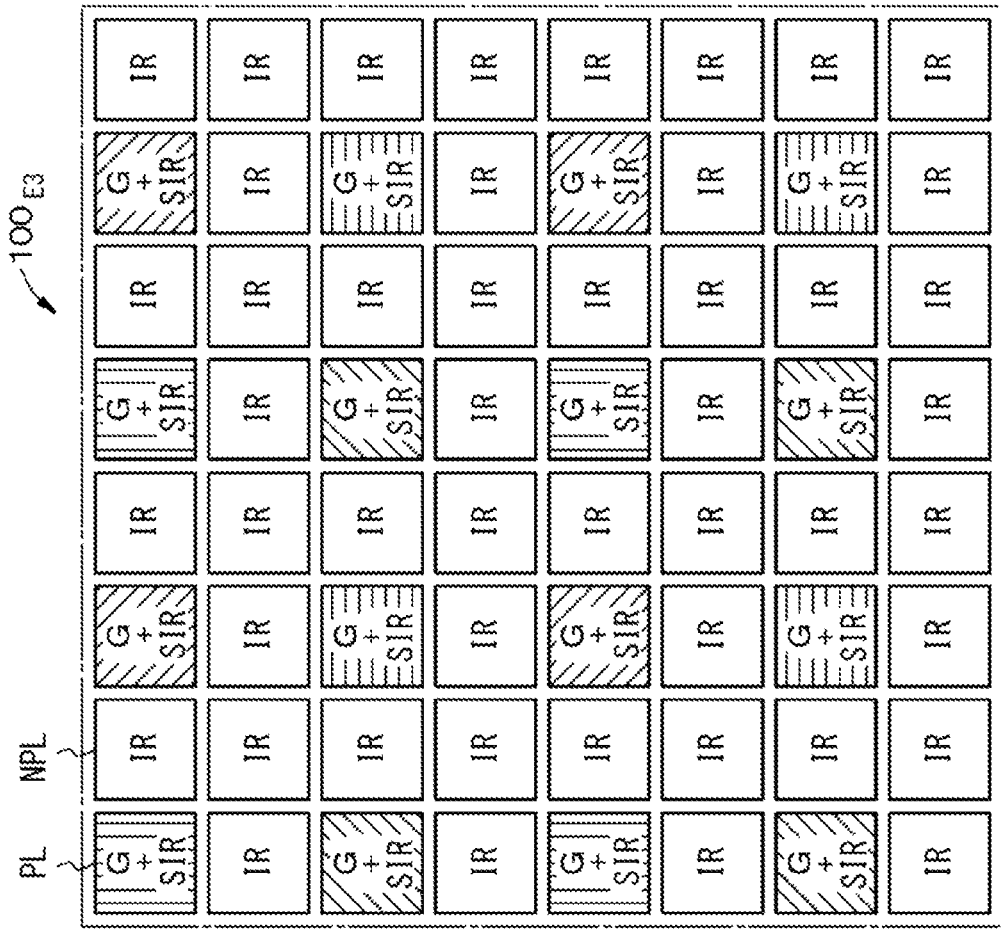
FIG. 34 is a schematic diagram of a portion of a planar layout in the pixel area, for explaining exemplary placement of color filters.
Figure 35:
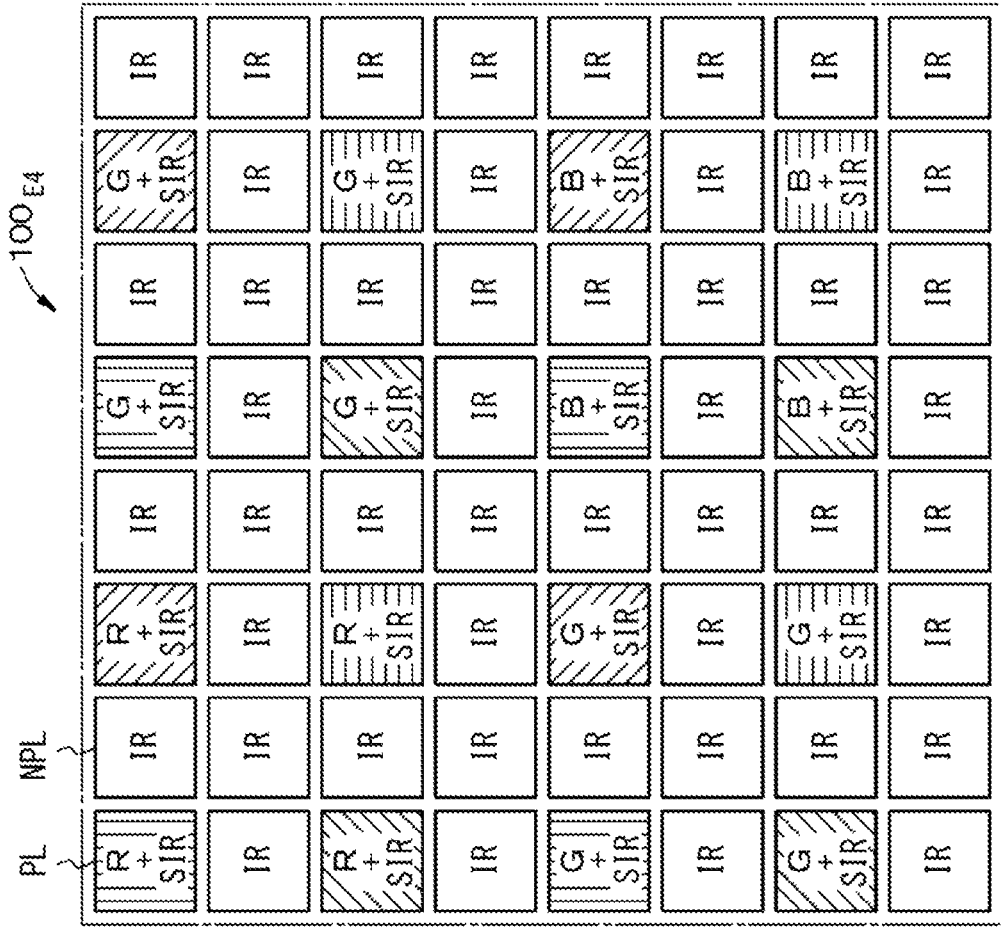
FIG. 35 is a schematic diagram of a portion of the planar layout in the pixel area, for explaining exemplary placement of color filters.

In the second embodiment, the placement of color filters is not especially limited. Exemplary placement of color filters is depicted in FIG. 34 and FIG. 35.

It is assumed in the previous examples that the infrared light beam-transmitting filter layer is placed in each of all the pixels having no polarizer placed therein. In some cases, it is also possible to place the infrared light beam-transmitting filter layer in some pixels of the pixels having no polarizer placed therein. For example, a configuration formed by replacing the reference sign [SIR] with [IR] in FIG. 19 can also be adopted.

Moreover, modifications similar to [Oblique Placement of Pixels] and [Exemplary Placement of Polarizers Having Same Structure] described in the first embodiment or the like can also be made.

[Exemplary Configuration of Three-Dimensional Placement]

In the various types of exemplary configurations described above, variations of the planar placement have been mainly described. Various types of variations can be conceived for three-dimensional placement of polarizers, infrared light beam-absorbing filter layers, flattening layers, color filters, and the like. The variations will be described below with reference to FIG. 36 to FIG. 43.

It is assumed for the imaging element 100 depicted in FIG. 2 that the color filter 70 is formed on the polarizer 50 and the infrared light beam-absorbing filter layer 60 that are placed in the same layer. From the viewpoint such as improvement of the flatness of the color filter 70, a state can also be considered, for example, where the color filter 70 is formed on the flattening layer that covers the polarizer 50 and the infrared light beam-absorbing filter layer 60.

Figure 36:
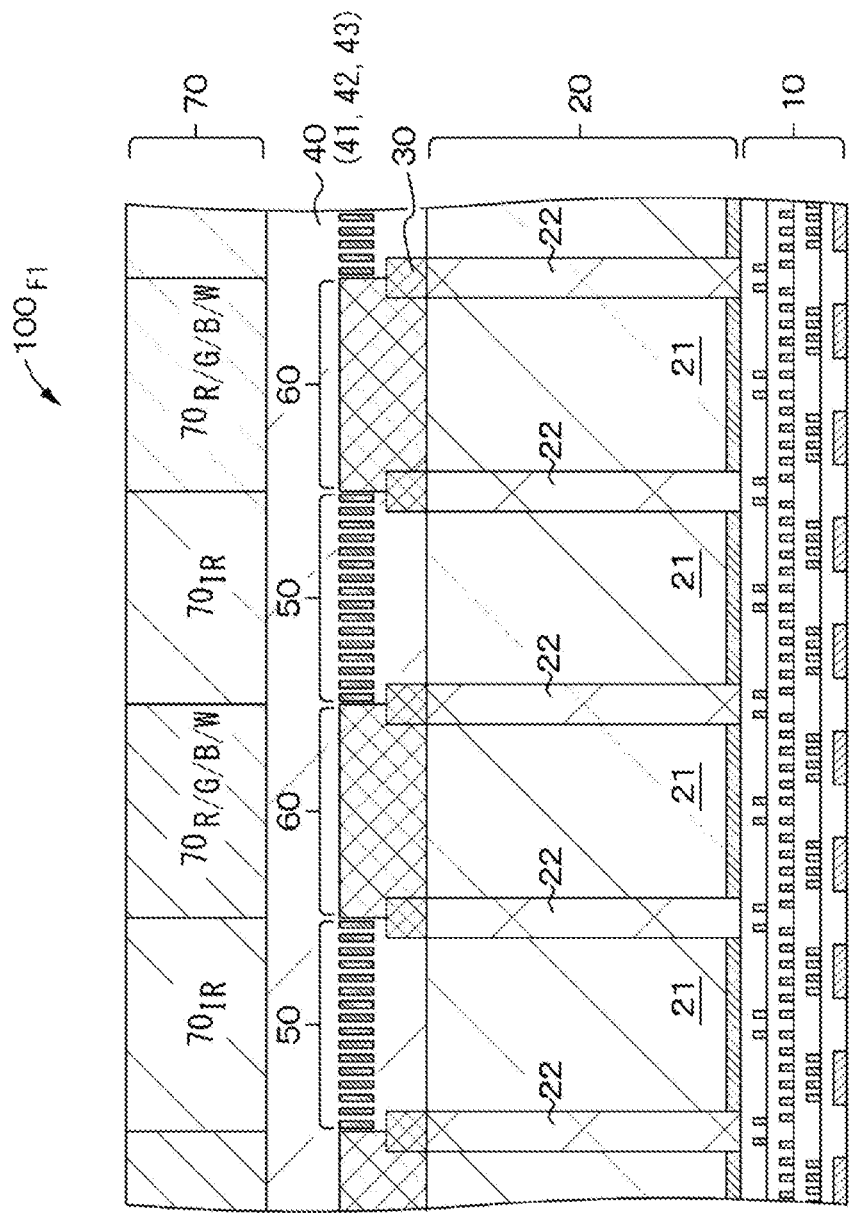
FIG. 36 is a schematic partial cross-sectional diagram of an imaging element that has a configuration in which a flattening layer is further stacked.

FIG. 36 is a schematic partial cross-sectional diagram of an imaging element that has a configuration in which a flattening layer is further stacked.

In an imaging element $100_{F1}$ depicted in FIG. 36, the flattening layer 43 is stacked on the polarizer 50 and the infrared light beam-absorbing filter layer 60, and the color filter 70 is formed thereon. More specifically, it is sufficient that a step of forming the flattening layer 43 depicted in FIG. 12 is executed before [Step-150] described above.

Alternatively, in a case where the film thickness needs to be large because of the property of the infrared light beam-absorbing filter layer, for example, such a process can also be considered that a portion or the entire part of the flattening layer at a portion where the infrared light beam-absorbing filter layer is to be placed is removed.

Figure 37:
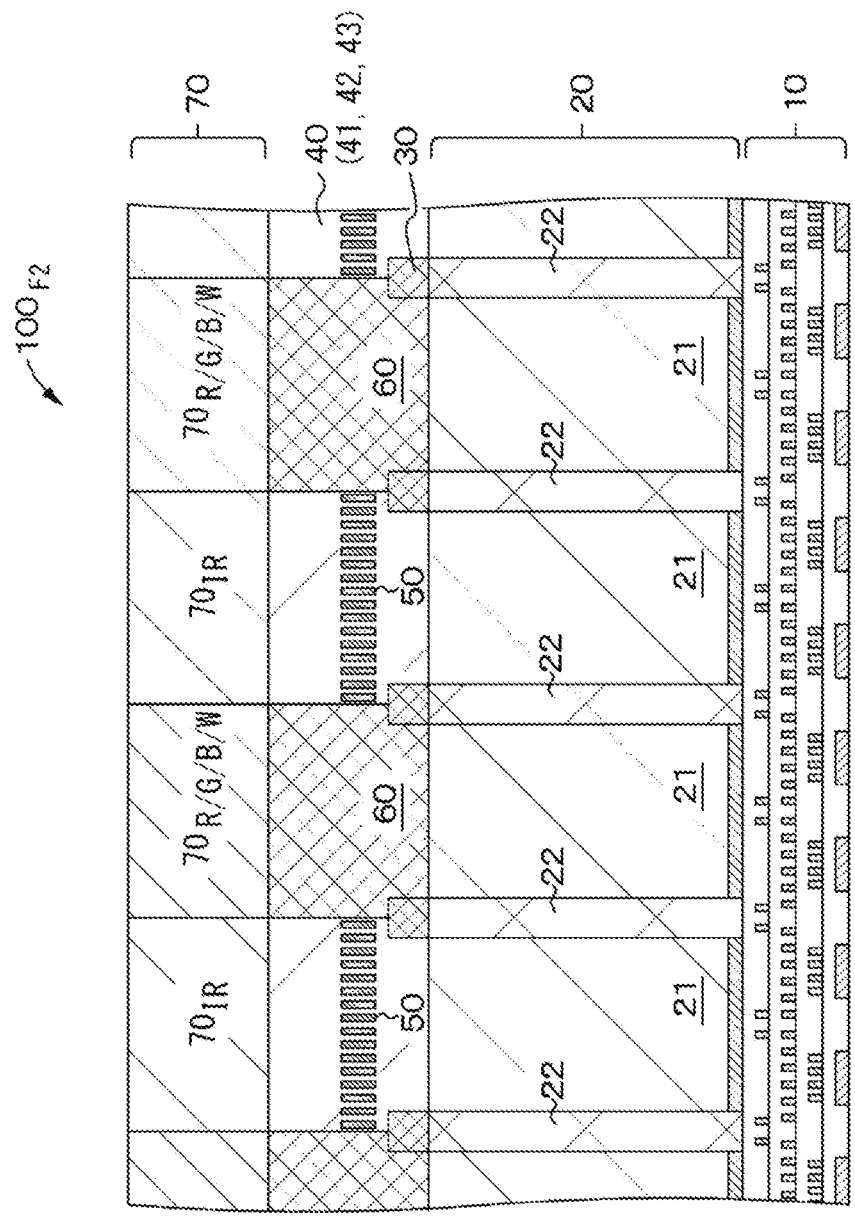
FIG. 37 is a schematic partial cross-sectional diagram of an imaging element, for explaining exemplary placement of infrared light beam-absorbing filters.

FIG. 37 is a schematic partial cross-sectional diagram of an imaging element, for explaining exemplary placement of infrared light beam-absorbing filter layers. This similarly applies to FIG. 38 to FIG. 41 described later.

An imaging element $100_{F2}$ depicted in FIG. 37 has a configuration in which the entire flattening layer 40 at a portion where the infrared light beam-absorbing filter layer 60 is to be placed is removed, compared to the imaging element $100_{F1}$ depicted in FIG. 36. With this configuration, an increase of the film thickness of the infrared light beam-absorbing filter layer 60 can be achieved.

For example, the imaging element $100_{F2}$ depicted in FIG. 37 can be obtained by executing [Step-130] and [Step-140] described above after the flattening layers 41, 42, and 43 are stacked.

Alternatively, such a configuration can also be conceived where the infrared light beam-absorbing filter layer is brought closer to the side of the color filter.

Figure 38:
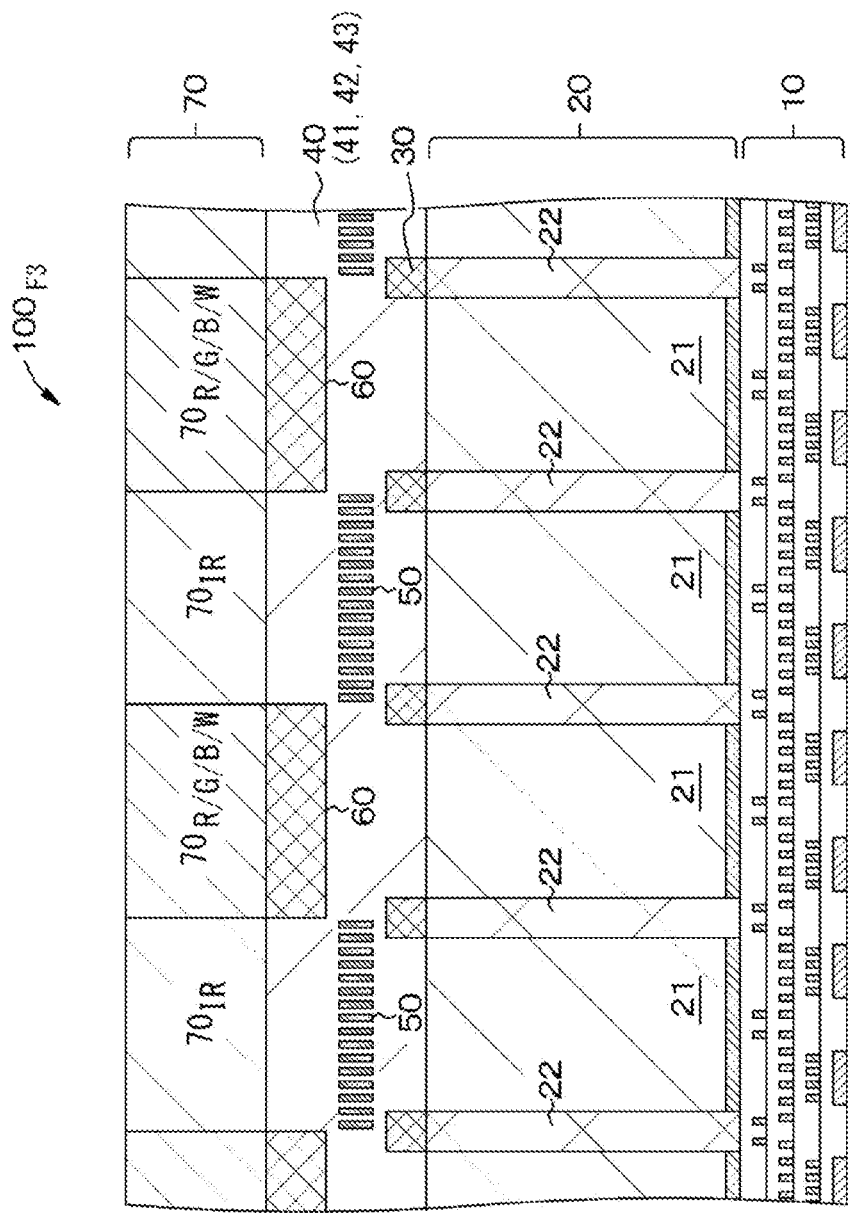
FIG. 38 is a schematic partial cross-sectional diagram of an imaging element, for explaining exemplary placement of infrared light beam-absorbing filters.

The imaging element $100_{F3}$ depicted in FIG. 38 has a configuration in which a portion of the flattening layer 40 on the side of the color filter 70 is removed and the infrared light beam-absorbing filter layer 60 is embedded therein.

Although it is assumed in the above examples that the infrared light beam-absorbing filter layer 60 is placed on the side of the color filter 70 closer to the polarizer 50, for example, a configuration in which the infrared light beam-absorbing filter layer 60 is placed on the side of the color filter 70 closer to the light beam incidence plane can be adopted, a configuration in which the infrared light beam-absorbing filter layer 60 is placed in the same layer as that of the color filter 70 can be adopted, or a configuration in which the infrared light beam-absorbing filter layer 60 is placed so as to be embedded in the color filter 70 can be adopted.

Figure 39:
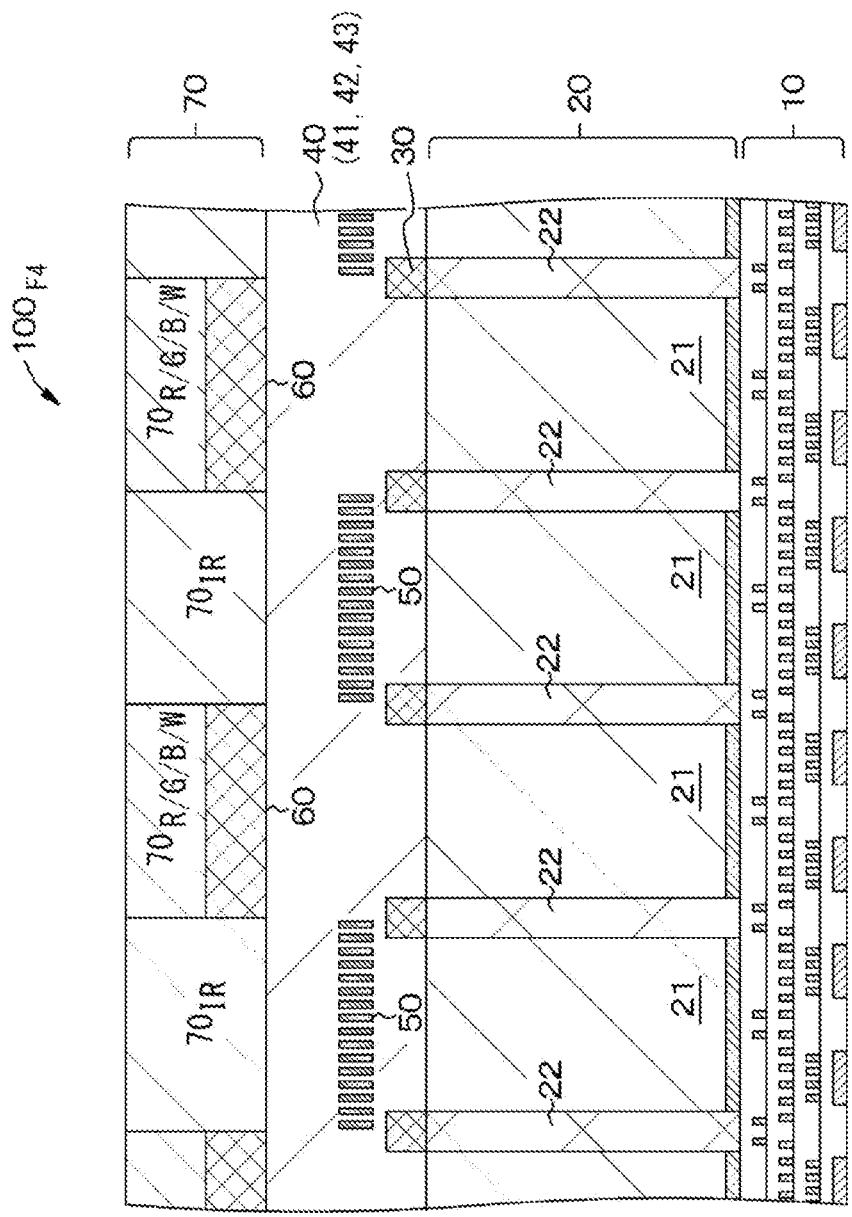
FIG. 39 is a schematic partial cross-sectional diagram of an imaging element, for explaining exemplary placement of infrared light beam-absorbing filters.

An imaging element $100_{F4}$ depicted in FIG. 39 is an example where the infrared light beam-absorbing filter layer 60 is placed on the flattening layer 40 (more specifically, the flattening layer 43). In this configuration, the infrared light beam-absorbing filter layer 60 is placed so as to be embedded in the color filter 70. Such a structure can be obtained by conducting in advance a formation process of the infrared light beam-absorbing filter layer 60 as part of the formation process of the color filter 70.

Figure 40:
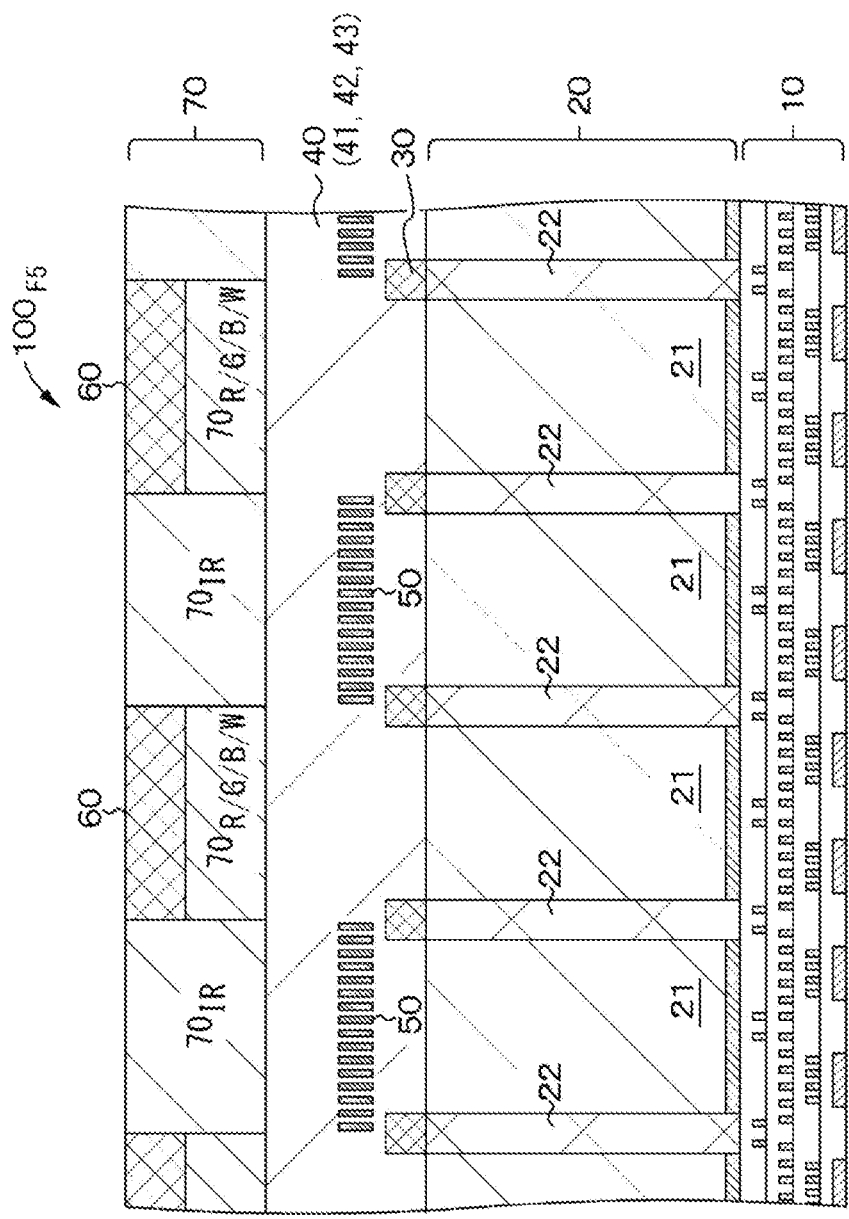
FIG. 40 is a schematic partial cross-sectional diagram of an imaging element, for explaining exemplary placement of infrared light beam-absorbing filters.
Figure 41:
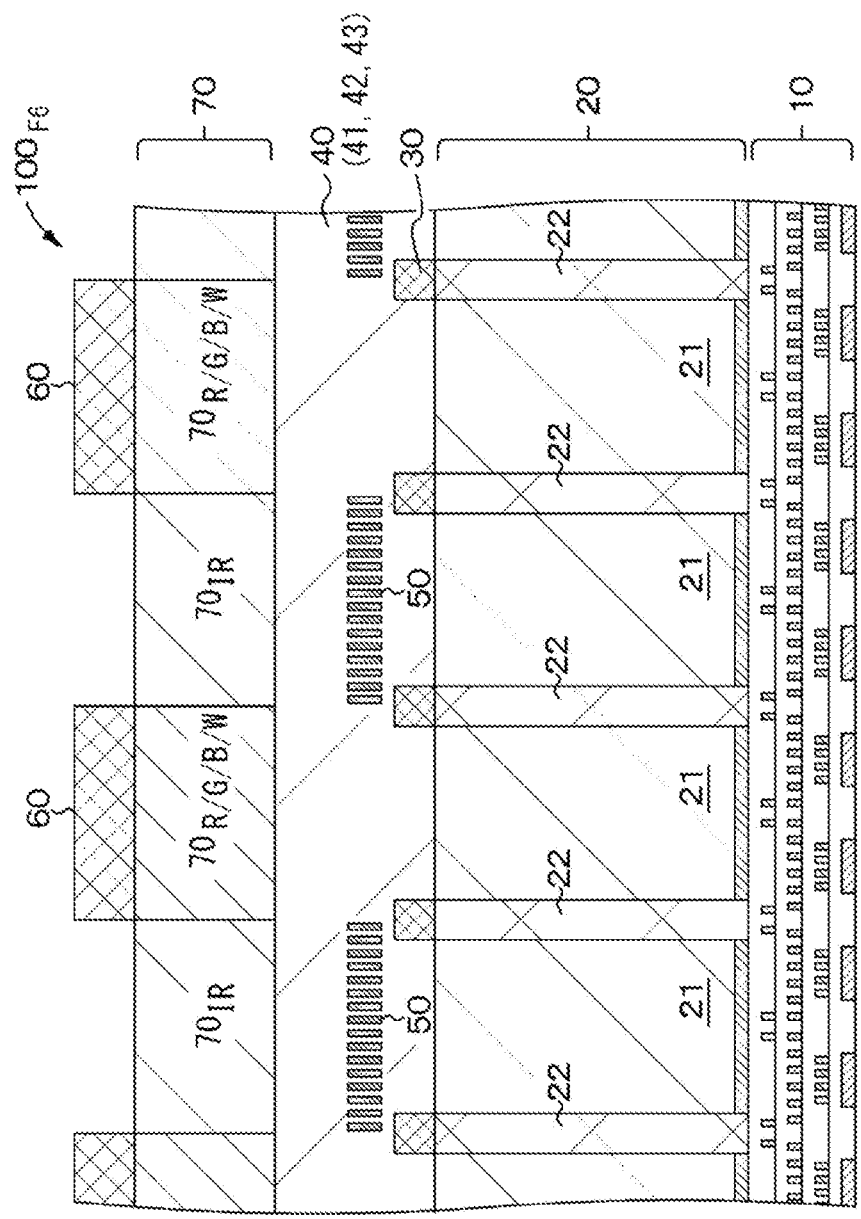
FIG. 41 is a schematic partial cross-sectional diagram of an imaging element, for explaining exemplary placement of infrared light beam-absorbing filters.

An imaging element $100_{F5}$ depicted in FIG. 40 is an example where the infrared light beam-absorbing filter layer 60 is placed on the side of the light beam incidence plane of the color filter 70. The infrared light beam-absorbing filter layer 60 is placed so as to be embedded in the color filter 70. An imaging element $100_{F6}$ depicted in FIG. 41 is also an example where the infrared light beam-absorbing filter layer 60 is placed on the side of the light beam incidence plane of the color filter 70. The infrared light beam-absorbing filter layer 60 is placed on the color filter 70. These structures can be obtained by conducting in an after-the-fact manner a formation process of the infrared light beam-absorbing filter layer 60 as part of the formation process of the color filter 70.

It is assumed in the above examples that the infrared light beam-absorbing filter layer is placed so as to cover the entire face of the light beam incidence plane of each pixel.

Considering from the positional relation among pixels, a light beam passing through a peripheral portion of the light beam incidence plane of a normal pixel tends to influence a polarized pixel more than a light beam passing through a central portion thereof does. An idea can therefore be conceived, for example, in which the infrared light beam-absorbing filter layer is placed only in the peripheral portion of the light beam incidence plane of the pixel.

Figure 42:
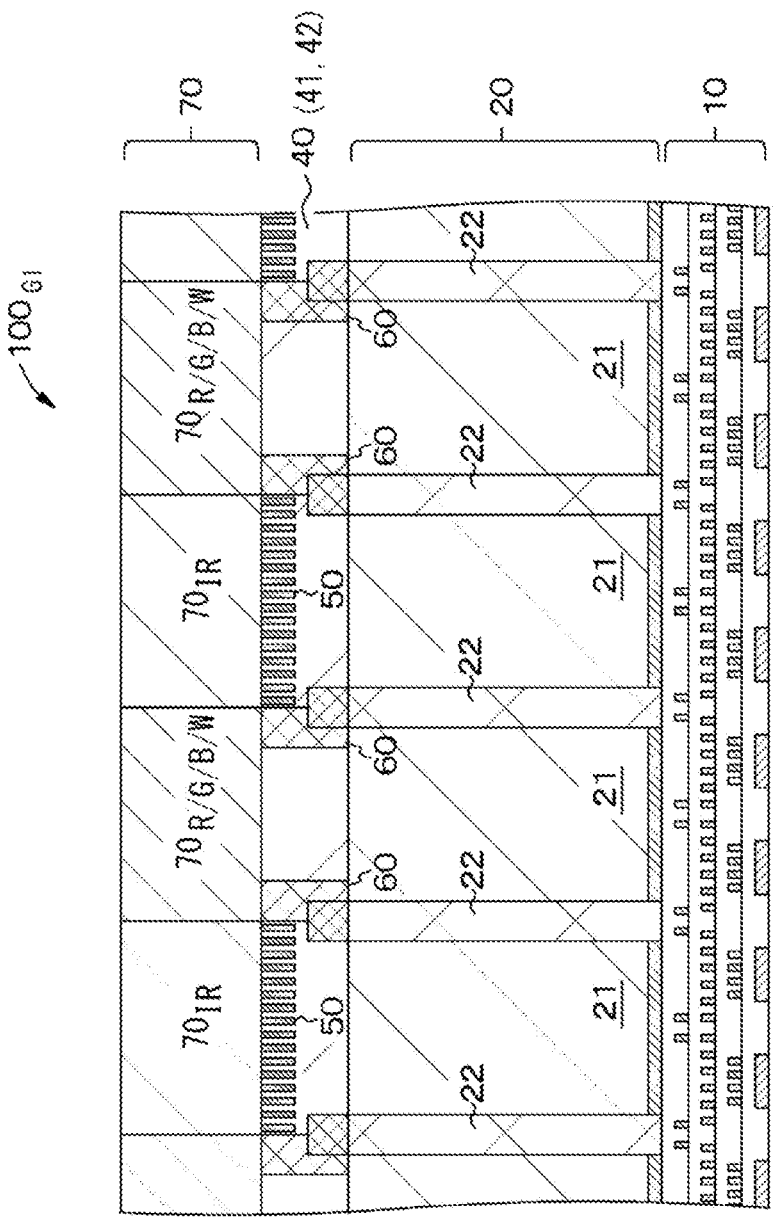
FIG. 42 is a schematic partial cross-sectional diagram of an imaging element, for explaining a configuration in which an infrared light beam-absorbing filter is placed only in a peripheral portion of a light beam incidence plane of a pixel.
Figure 43:
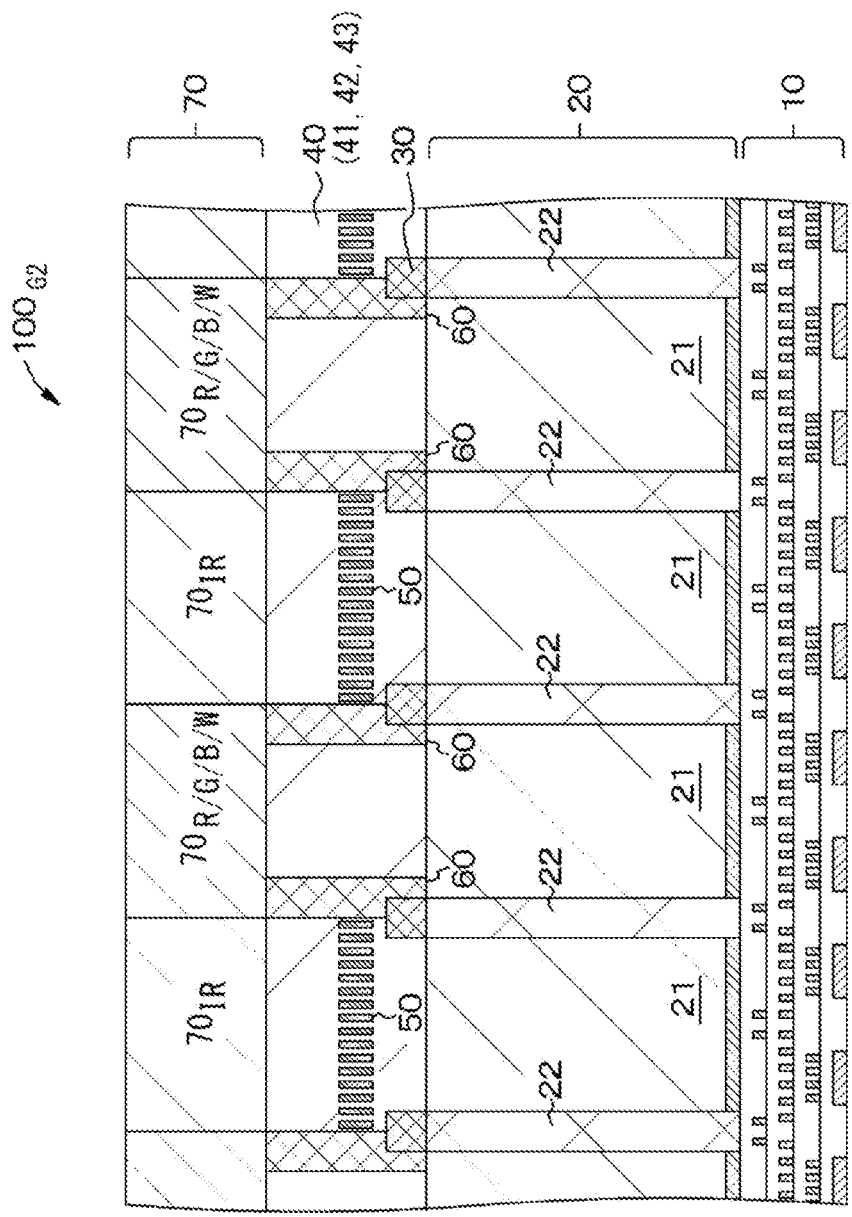
FIG. 43 is a schematic partial cross-sectional diagram of an imaging element, for explaining a configuration in which an infrared light beam-absorbing filter is placed only in a peripheral portion of a light beam incidence plane of a pixel.

FIG. 42 is a schematic partial cross-sectional diagram of an imaging element, for explaining a configuration in which an infrared light beam-absorbing filter layer is placed only in a peripheral portion of the light beam incidence plane of a pixel. This similarly applies to FIG. 43.

An imaging element $100_{G1}$ depicted in FIG. 42 has a configuration in which the infrared light beam-absorbing filter layer 60 is placed only in a peripheral portion of the light beam incidence plane of a pixel, compared to the imaging element 100 depicted in FIG. 1. An imaging element $100_{G1}$ depicted in FIG. 43 has a configuration in which the infrared light beam-absorbing filter layer 60 is placed only in a peripheral portion of the light beam incidence plane of a pixel, compared to the imaging element $100_{F2}$ depicted in FIG. 37.

[Exemplary Placement of Elements of Types Different from Pixel]

Although it is assumed in the above examples that polarized pixels and normal pixels are properly placed, in some cases, an idea can be considered, for example, where a structure such as a capacitor constituting a DRAM is placed instead of a normal pixel.

Figure 44:
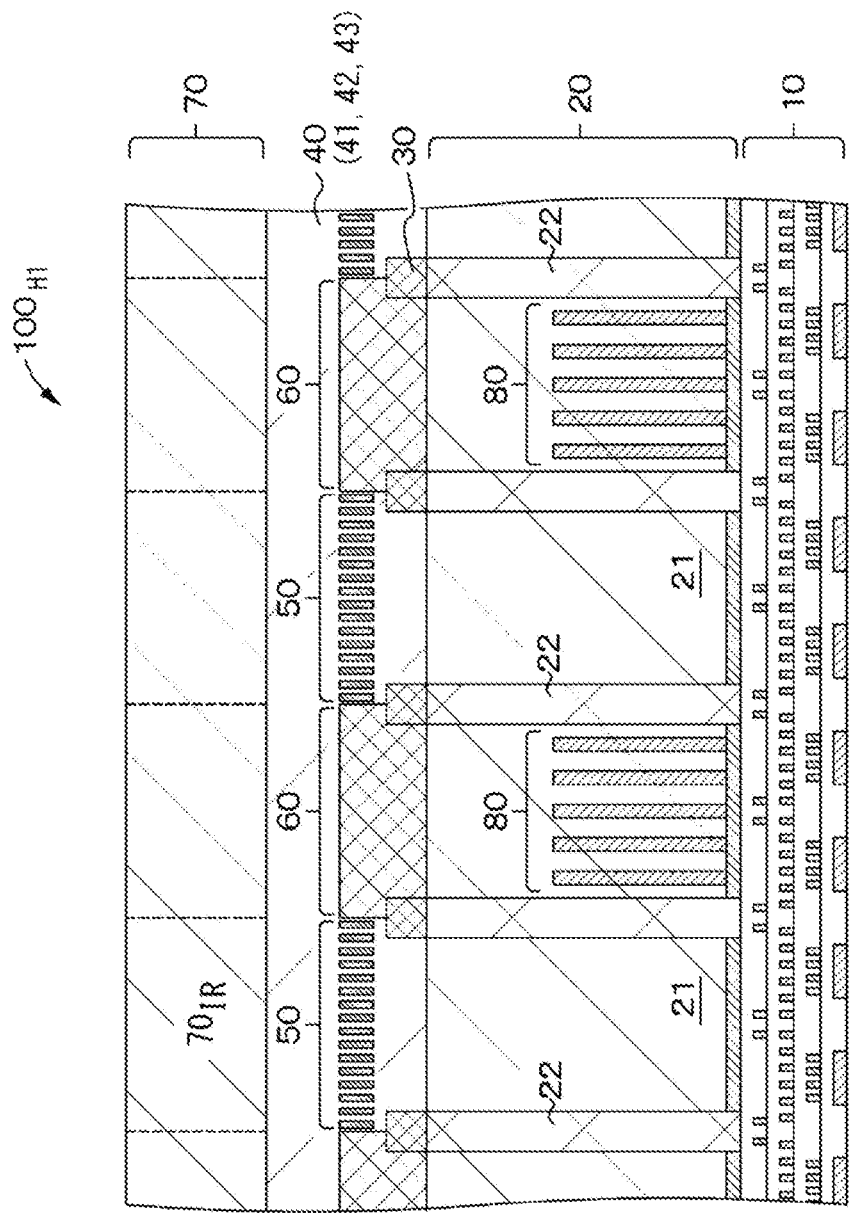
FIG. 44 is a schematic partial cross-sectional diagram of an imaging element in a case where a structure different from a pixel is placed in the periphery of a pixel having a polarizer placed therein.

FIG. 44 is a schematic partial cross-sectional diagram of an imaging element in a case where a structure different from a pixel is placed in the periphery of a pixel having a polarizer placed therein. This similarly applies to FIG. 45 and FIG. 46.

Figure 45:
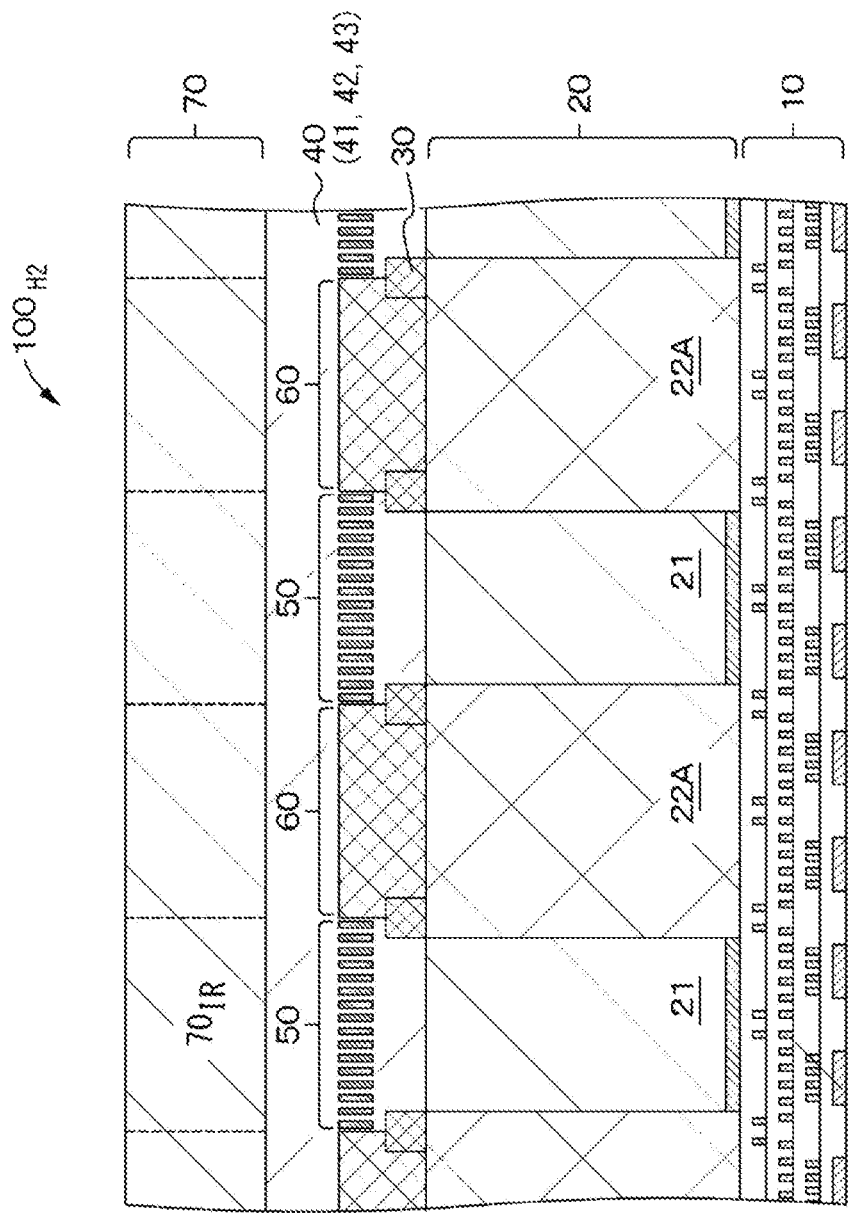
FIG. 45 is a schematic partial cross-sectional diagram of an imaging element in a case where a structure different from a pixel is placed in the periphery of a pixel having a polarizer placed therein.

An imaging element $100_{H1}$ depicted in FIG. 44 is an example where electrodes 80 constituting a capacitor are placed instead of a normal pixel. An imaging element $100_{H2}$ depicted in FIG. 45 is an example where some of the normal pixels are replaced with separation parts 22A.

Figure 46:
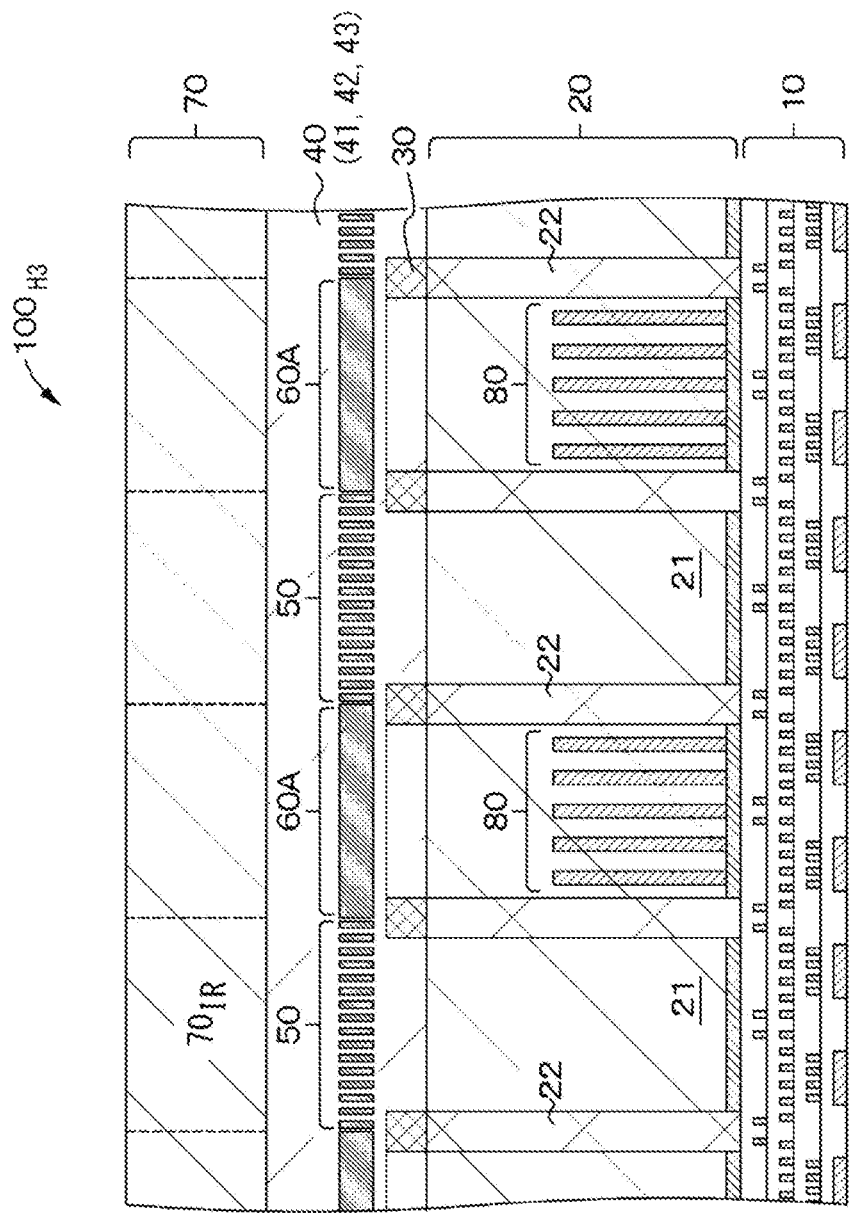
FIG. 46 is a schematic partial cross-sectional diagram of an imaging element in a case where a structure different from a pixel is placed in the periphery of a pixel having a polarizer placed therein.

An imaging element $100_{H3}$ depicted in FIG. 46 is a modification example of the imaging element $100_{H1}$ depicted in FIG. 44. This configuration is an example where an electrically conductive material layer 50A used when polarizers are configured is properly patterned and is caused to remain as a material layer 60A instead of the infrared light beam-absorbing filter layer 60.

Application Examples

The technique according to the present disclosure is applicable to various products. For example, the technique according to the present disclosure may be realized as an apparatus mounted on a mobile object of any type such as a car, an electric car, a hybrid electric car, a motorcycle, a bicycle, a personal mobility, an airplane, a drone, a ship, a robot, a construction machine, or an agricultural machine (tractor).

Figure 47:
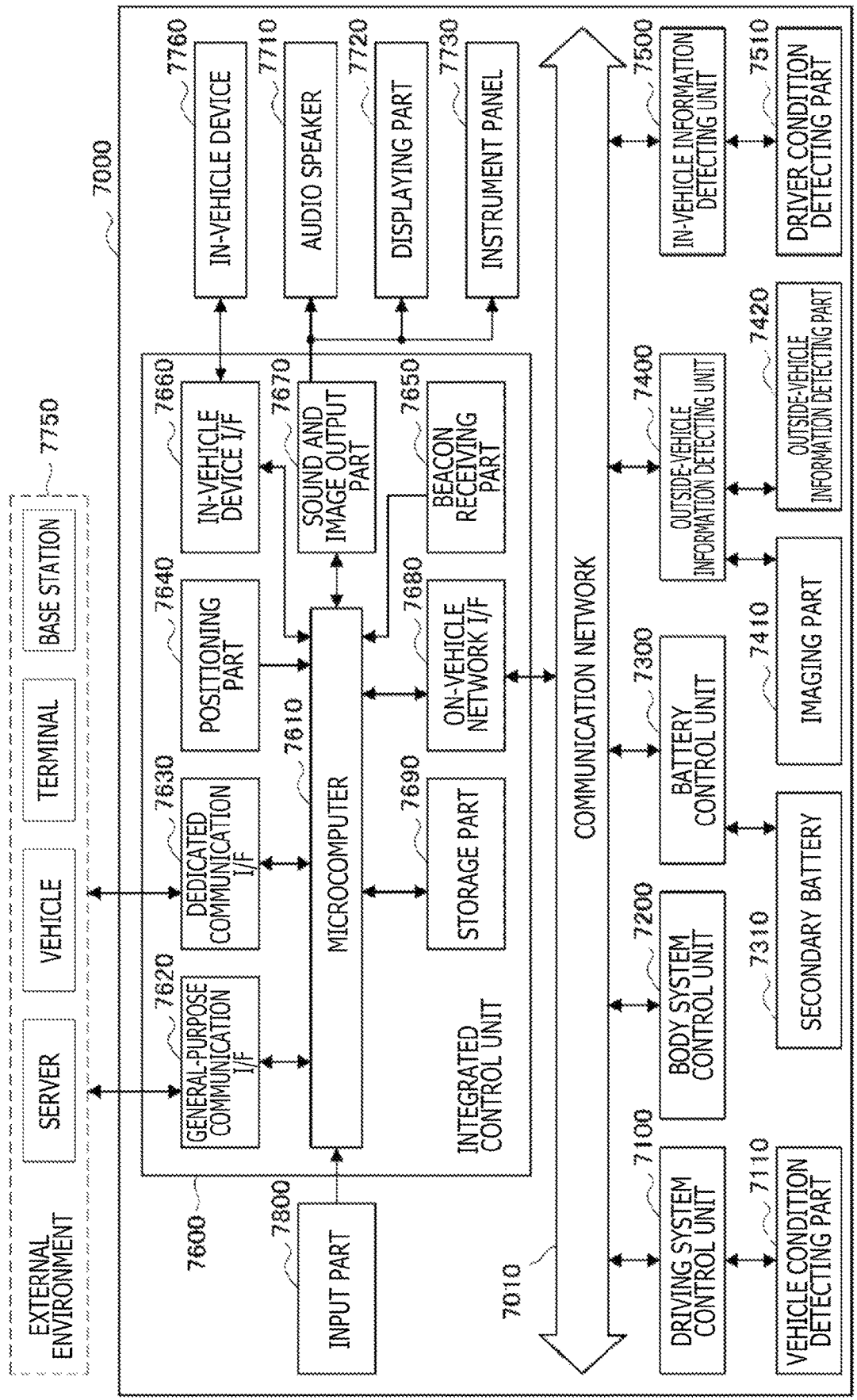
FIG. 47 is a block diagram depicting an example of a schematic configuration of a vehicle control system.

FIG. 47 is a block diagram depicting an example of a schematic configuration of a vehicle control system 7000 that is an example of a mobile object control system to which the technique according to the present disclosure is applicable. The vehicle control system 7000 includes a plurality of electronic control units connected through a communication network 7010. In the example depicted in FIG. 47, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting these plurality of control units may be an on-vehicle communication network complying with an optional standard such as, for example, CAN (Controller Area Network), LIN (Local Interconnect Network), LAN (Local Area Network), or FlexRay (registered trademark).

The control units each include a microcomputer that executes computing processes in accordance with various types of programs, a storage part that stores therein programs to be executed by the microcomputer, parameters to be used in the various types of computing, or the like, and a driving circuit that drives various types of apparatuses to be controlled. The control units each include a network I/F executing communication with other control units through the communication network 7010, and each include a communication I/F executing communication by wired communication or wireless communication with apparatuses, sensors, or the like inside and outside the vehicle. In FIG. 47, a microcomputer 7610, a general-purpose communication I/F 7620, a dedicated communication I/F 7630, a positioning part 7640, a beacon receiving part 7650, an in-vehicle device I/F 7660, a sound and image output part 7670, an on-vehicle network I/F 7680, and a storage part 7690 are depicted as a functional configuration of the integrated control unit 7600. Other control units each similarly include a microcomputer, a communication I/F, a storage part, and the like.

The driving system control unit 7100 controls operations of apparatuses relating to the driving system of the vehicle in accordance with the various types of programs. For example, the driving system control unit 7100 functions as a control apparatus such as a driving power generating apparatus generating the driving power of the vehicle such as an internal combustion engine or a driving motor, a driving power transmitting mechanism transmitting the driving power to the wheels, a steering mechanism regulating the steering angle of the vehicle, and a braking apparatus generating the braking force of the vehicle. The driving system control unit 7100 may have a function as a control apparatus such as an ABS (Antilock Brake System) or an ESC (Electronic Stability Control).

A vehicle condition detecting part 7110 is connected to the driving system control unit 7100. The vehicle condition detecting part 7110 includes at least one of, for example, a gyro sensor detecting the angular velocity of an axis rotation motion of the vehicle body, an acceleration sensor detecting the acceleration of the vehicle, or a sensor detecting the manipulation amount of an accelerator pedal, the manipulation amount of a brake pedal, the steerage angle of a steering wheel, the engine speed, the rotation speed of the wheels, or the like. The driving system control unit 7100 executes a computing process using a signal input thereinto from the vehicle condition detecting part 7110 and controls the internal combustion engine, the driving motor, an electric power steering apparatus, a braking apparatus, or the like.

The body system control unit 7200 controls operations of various types of apparatuses mounted on the vehicle body in accordance with various types of programs. For example, the body system control unit 7200 functions as a control apparatus for a keyless entry system, a smart key system, a power window apparatus, or various types of lamps such as a head lamp, a back lamp, a brake lamp, a direction indicator, or a fog lamp. In this case, to the body system control unit 7200, electric waves transmitted from a portable device that substitutes the key or signals of various types of switches may be input. The body system control unit 7200 accepts the input of such electric waves or signals and controls a door locking apparatus, the power window apparatus, the lamps, and the like of the vehicle.

The battery control unit 7300 controls a secondary battery 7310 that is an electric power supply source for the driving motor in accordance with the various types of programs. For example, to the battery control unit 7300, information such as the battery temperature, the battery output voltage, or the battery remaining capacity is input from a battery apparatus that includes the secondary battery 7310. The battery control unit 7300 executes a computing process using these signals and executes control for temperature regulation of the secondary battery 7310 or control for a cooling apparatus and the like included in the battery apparatus.

The outside-vehicle information detecting unit 7400 detects information relating to the outside of the vehicle having the vehicle control system 7000 mounted thereon. For example, to the outside-vehicle information detecting unit 7400, at least one of the imaging part 7410 or the outside-vehicle information detecting part 7420 is connected. The imaging part 7410 includes at least one of a ToF (Time Of Flight) camera, a stereo camera, a monocular camera, an infrared camera, or other cameras. The outside-vehicle information detecting part 7420 includes at least one of, for example, an environment sensor detecting the current weather or the current meteorological condition, or a peripheral information detecting sensor detecting other vehicles, obstacles, pedestrians, or the like around the vehicle having the vehicle control system 7000 mounted thereon.

The environment sensor may be at least one of, for example, a raindrop sensor detecting rainy weather, a fog sensor detecting fog, a sunshine sensor detecting the degree of sunshine, or a snow sensor detecting snowfall. The peripheral information detecting sensor may be at least one of an ultrasonic sensor, a radar apparatus, or a LIDAR (Light Detection and Ranging, Laser Imaging Detection and Ranging) apparatus. The imaging part 7410 and the outside-vehicle information detecting part 7420 may be provided each as an independent sensor or apparatus, or may be provided each as an apparatus having a plurality of sensors or apparatuses integrated therein.

Figure 48:
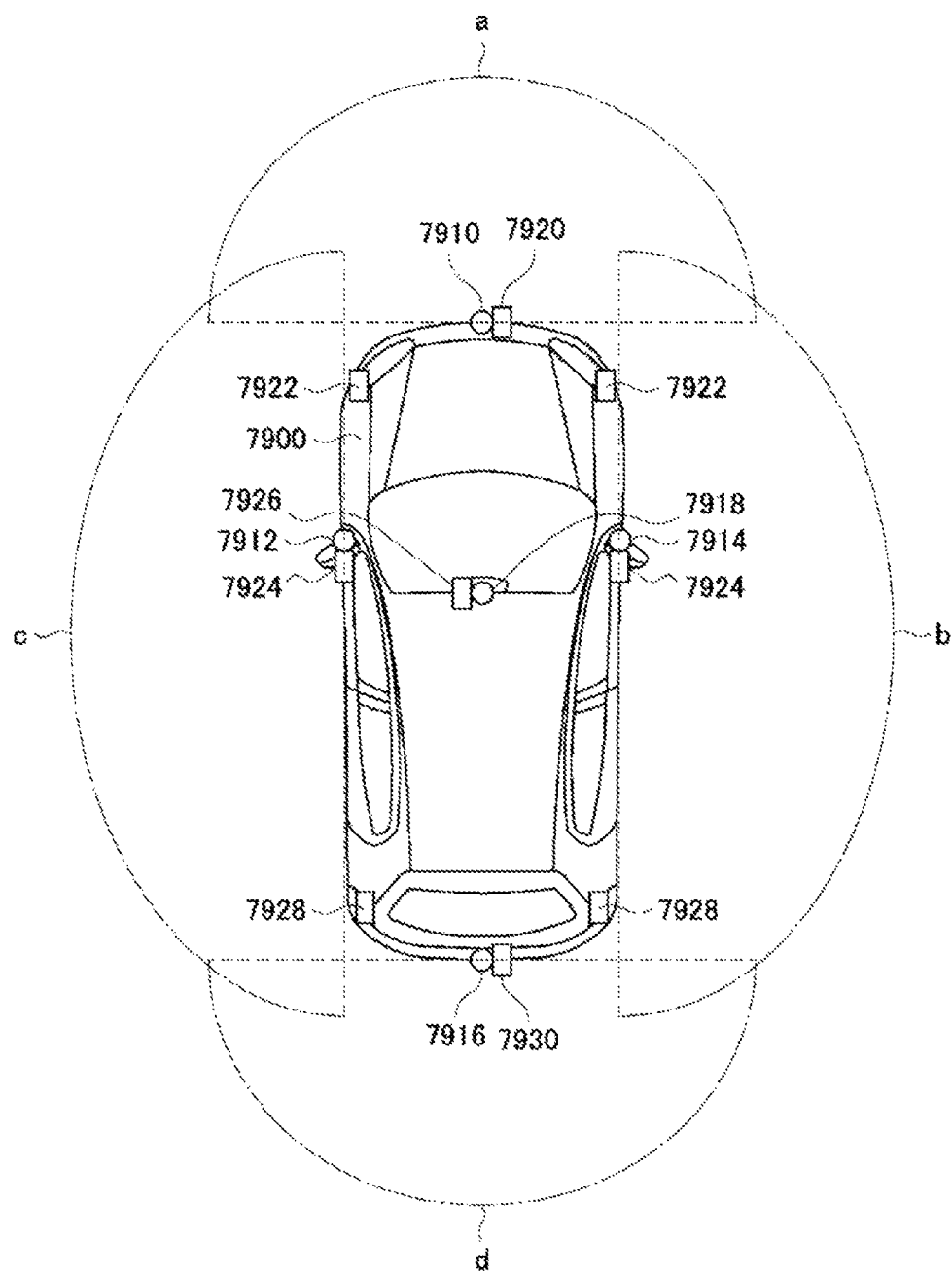
FIG. 48 is an explanatory diagram depicting an example of installation positions of outside-vehicle information detecting parts and imaging parts.

Here, FIG. 48 depicts an example of installation positions of the imaging part 7410 and the outside-vehicle information detecting part 7420. Imaging parts 7910, 7912, 7914, 7916, and 7918 are each disposed at a position of at least one of, for example, the front nose, a side mirror, the rear bumper, or a rear door of the vehicle 7900, or in an upper portion of the windshield in the vehicle interior. The imaging part 7910 provided in the front nose and the imaging part 7918 provided in the upper portion of the windshield in the vehicle interior acquire mainly images of the scenery in front of the vehicle 7900. The imaging parts 7912 and 7914 provided each in a side mirror acquire mainly images of the sceneries lateral to the vehicle 7900. The imaging part 7916 provided in the rear bumper or a rear door acquires mainly images of the scenery on the back of the vehicle 7900. The imaging part 7918 provided in the upper portion of the windshield in the vehicle interior is mainly used for detection of vehicles running ahead, pedestrians, obstacles, traffic light machines, traffic signs, running lanes, or the like.

Note that, FIG. 48 depicts an example of an imaging range of each of the imaging parts 7910, 7912, 7914, and 7916. An imaging range "a" indicates the imaging range of the imaging part 7910 disposed on the front nose. Imaging ranges "b" and "c" respectively indicate the imaging ranges of the imaging parts 7914 and 7912 disposed on the side mirrors. An imaging range "d" indicates the imaging range of the imaging part 7916 disposed on the rear bumper or the rear door. An overhead image of the vehicle 7900 seen from above is acquired by, for example, superimposing the pieces of image data on each other that are captured by the imaging parts 7910, 7912, 7914, and 7916.

Outside-vehicle information detecting parts 7920, 7922, 7924, 7926, 7928, and 7930 disposed at the front, at the rear, on the sides, or at the corners of the vehicle 7900, and in an upper portion of the windshield in the vehicle interior may each be, for example, an ultrasonic sensor or a radar apparatus. The outside-vehicle information detecting parts 7920, 7926, and 7930 disposed on the front nose, the rear bumper, and the rear door of the vehicle 7900, and in the upper portion of the windshield in the vehicle interior may each be, for example, a LIDAR apparatus. These outside-vehicle information detecting parts 7920 to 7930 are mainly used for detection of vehicles running ahead, pedestrians, obstacles, or the like.

The description will be continued referring back to FIG. 47. The outside-vehicle information detecting unit 7400 causes the imaging part 7410 to capture an image of the scenery outside the vehicle and receives the captured image data. Moreover, the outside-vehicle information detecting unit 7400 receives detected information from the outside-vehicle information detecting part 7420 connected thereto. In a case where the outside-vehicle information detecting part 7420 is an ultrasonic sensor, a radar apparatus, or a LIDAR apparatus, the outside-vehicle information detecting unit 7400 causes an ultrasonic wave, an electromagnetic wave, or the like to be transmitted and receives information regarding a received reflected wave. The outside-vehicle information detecting unit 7400 may also execute an object detection process or a distance detection process for a person, a vehicle, an obstacle, a traffic sign, a character on the road surface, or the like on the basis of the received information. The outside-vehicle information detecting unit 7400 may also execute an environment recognition process to recognize rainfall, fog, the road surface state, or the like on the basis of the received information. The outside-vehicle information detecting unit 7400 may also calculate the distance to an outside-vehicle object on the basis of the received information.

Moreover, the outside-vehicle information detecting unit 7400 may also execute an image recognition process or a distance detection process for recognizing a person, a vehicle, an obstacle, a traffic sign, a character on the road surface, or the like on the basis of the received image data. The outside-vehicle information detecting unit 7400 may also execute processes such as distortion correction, alignment, or the like for the received image data, and may also produce an overhead image or a panorama image by synthesizing the pieces of image data captured by the different imaging parts 7410. The outside-vehicle information detecting unit 7400 may also execute a viewpoint conversion process using pieces of image data captured by the different imaging parts 7410.

The in-vehicle information detecting unit 7500 detects in-vehicle information. To the in-vehicle information detecting unit 7500, for example, a driver condition detecting part 7510 detecting the condition of the driver is connected. The driver condition detecting part 7510 may also include a camera imaging the driver, a biometric sensor detecting the biometric information of the driver, a microphone collecting sounds in the vehicle interior, or the like. The biometric sensor is disposed on, for example, the seat surface, the steering wheel, or the like and detects the biometric information of a passenger seated on a seat or the driver gripping the steering wheel. The in-vehicle information detecting unit 7500 may calculate the degree of fatigue or the degree of concentration of the driver on the basis of the detected information input from the driver condition detecting part 7510, or may determine whether or not the driver drowses. The in-vehicle information detecting unit 7500 may execute processes such as a noise cancellation process for the collected sound signal.

The integrated control unit 7600 generally controls the operations in the vehicle control system 7000 in accordance with the various types of programs. To the integrated control unit 7600, an input part 7800 is connected. The input part 7800 is realized by such an apparatus capable of being operated by a passenger for input operations as, for example, a touch panel, a button, a microphone, a switch, a lever, or the like. To the integrated control unit 7600, data acquired by executing sound recognition for the sound input from the microphone may be input. The input part 7800 may be, for example, a remote control apparatus that uses infrared light beams or other electric waves, or may also be an externally connected device such as a mobile phone or a PDA (Personal Digital Assistant) that supports the operations of the vehicle control system 7000. The input part 7800 may be, for example, a camera and, in this case, the passenger can input information using a gesture. Alternatively, data acquired by detecting a motion of a wearable apparatus mounted on the passenger may be input. Furthermore, the input part 7800 may also include, for example, an input control circuit or the like that produces an input signal on the basis of information input by the passenger or the like using the above input part 7800 and that outputs this input signal to the integrated control unit 7600. The passenger or the like inputs various types of data, instructs a process operation, and the like to the vehicle control system 7000 by operating this input part 7800.

The storage part 7690 may include a ROM (Read Only Memory) that stores therein various types of programs to be executed by the microcomputer, and a RAM (Random Access Memory) that stores therein various types of parameters, computing results, sensor values, and the like. Moreover, the storage part 7690 may also be realized by a magnetic storage device such as an HDD (Hard Disc Drive), a semiconductor storage device, an optical storage device, a magneto-optical storage device, or the like.

The general-purpose communication I/F 7620 is a general-purpose communication I/F that intervenes the communication with various devices present in an external environment 7750. The general-purpose communication I/F 7620 may have such a cellular communication protocol implemented therein as GSM (registered trademark) (Global System of Mobile communications), WiMAX, LTE (Long Term Evolution), or LTE-A (LTE-Advanced), or such other wireless communication protocols implemented therein as a wireless LAN (otherwise called Wi-Fi (registered trademark)), or Bluetooth (registered trademark). The general-purpose communication I/F 7620 may be connected to a device (such as, for example, an application server or a control server) present on an external network (such as, for example, the Internet, a cloud network, or a network specific to a business entity) through, for example, a base station or an access point. Moreover, the general-purpose communication I/F 7620 may be connected to a terminal present in the vicinity of the vehicle (such as, for example, a terminal of the driver, of a pedestrian, or in a store, or an MTC (Machine Type Communication) terminal) using, for example, P2P (Peer to Peer) technique.

The dedicated communication I/F 7630 is a communication I/F that supports a communication protocol formulated aiming at use by the vehicle. The dedicated communication I/F 7630 may have a standard protocol implemented therein such as, for example, WAVE (Wireless Access in Vehicle Environment) that is a combination of IEEE802.11p in a lower layer and IEEE1609 in an upper layer, DSRC (Dedicated Short Range Communications), or a cellular communication protocol. The dedicated communication I/F 7630 typically accomplishes V2X communication that is a concept including one or more of Vehicle to Vehicle communication, Vehicle to Infrastructure communication, Vehicle to Home communication, and Vehicle to Pedestrian communication.

The positioning part 7640 receives, for example, a GNSS (Global Navigation Satellite System) signal from a GNSS satellite (such as, for example, a GPS (Global Positioning System) signal from a GPS satellite) to execute positioning, and produces position information that includes the latitude, the longitude, and the altitude of the vehicle. Note that the positioning part 7640 may identify the current location by exchanging signals with wireless access points, or may acquire the position information from a terminal such as a mobile phone, a PHS, or a smartphone that has a positioning function.

The beacon receiving part 7650 receives, for example, an electric wave or an electromagnetic wave transmitted from a wireless station or the like that is installed on a road, and acquires information such as the current location, traffic congestion, traffic closure, the necessary time period, or the like. Note that the function of the beacon receiving part 7650 may be included in the dedicated communication I/F 7630 described above.

The in-vehicle device I/F 7660 is a communication interface that intervenes the connection between the microcomputer 7610 and the various in-vehicle devices 7760 present in the vehicle. The in-vehicle device I/F 7660 may establish wireless connection using a wireless communication protocol such as wireless LAN, Bluetooth (registered trademark), NFC (Near Field Communication), or WUSB (wireless USB). Moreover, the in-vehicle device I/F 7660 may establish wired connection such as USB (Universal Serial Bus), HDMI (registered trademark) (High-Definition Multimedia Interface), or MHL (Mobile High-Definition Link) through a connection terminal not depicted (and a cable when necessary). The in-vehicle devices 7760 may include at least one of, for example, a mobile device or a wearable device held by the passenger, or an information device carried in or attached to the vehicle. Moreover, the in-vehicle devices 7760 may include a navigation apparatus that executes a search for a route to an optional destination. The in-vehicle device I/F 7660 exchanges control signals or data signals with these in-vehicle devices 7760.

The on-vehicle network I/F 7680 is an interface that intervenes the communication between the microcomputer 7610 and the communication network 7010. The on-vehicle network I/F 7680 transmits and receives signals and the like in accordance with a predetermined protocol supported by the communication network 7010.

The microcomputer 7610 of the integrated control unit 7600 controls the vehicle control system 7000 in accordance with various types of programs on the basis of information acquired through at least one of the general-purpose communication I/F 7620, the dedicated communication I/F 7630, the positioning part 7640, the beacon receiving part 7650, the in-vehicle device I/F 7660, or the on-vehicle network I/F 7680. For example, the microcomputer 7610 may compute a control target value for the driving power generating apparatus, the steering mechanism, or the braking apparatus on the basis of the acquired information relating to the inside and the outside of the vehicle, and may output control instructions to the driving system control unit 7100. For example, the microcomputer 7610 may also execute collaborative control that aims at realization of the function of an ADAS (Advanced Driver Assistance System) including collision avoidance or impact alleviation of the vehicle, follow-up running based on the inter-vehicular distance, vehicle-speed maintaining running, warning for collisions of the vehicle, warning for lane-departing of the vehicle, or the like. Moreover, the microcomputer 7610 may also execute collaborative control that aims at automatic driving or the like for the vehicle to autonomously run without depending on operations by the driver, by controlling the driving power generating apparatus, the steering mechanism, the braking apparatus, or the like on the basis of the acquired information relating to the periphery of the vehicle.

The microcomputer 7610 may produce three-dimensional distance information between the vehicle and an object such as a structure or a person therearound on the basis of the information acquired through at least one of the general-purpose communication I/F 7620, the dedicated communication I/F 7630, the positioning part 7640, the beacon receiving part 7650, the in-vehicle device I/F 7660, or the on-vehicle network I/F 7680, and may produce local map information including the peripheral information relating to the current location of the vehicle. Moreover, the microcomputer 7610 may predict a risk for a collision of the vehicle, proximity to a pedestrian or the like, entrance into a closed road, and the like on the basis of the acquired information, and may produce a signal for warning. The signal for warning may be, for example, a signal to generate a warning sound or to turn on a warning lamp.

The sound and image output part 7670 transmits an output signal of at least one of a sound or an image to an output apparatus capable of notifying the passenger of the vehicle or the outside of the vehicle, of information visually or aurally. In the example in FIG. 47, an audio speaker 7710, a displaying part 7720, and an instrument panel 7730 are exemplified as the output apparatus. The displaying part 7720 may include at least one of, for example, an on-board display or a head-up display. The displaying part 7720 may have an AR (Augmented Reality) display function. Other than the above apparatuses, the output apparatus may be another apparatus such as a headphone, a wearable device including a glasses-type display mounted on the passenger, a projector, a lamp, or the like. In a case where the output apparatus is a displaying apparatus, the displaying apparatus visually displays thereon the results acquired from various types of processes executed by the microcomputer 7610 or information received from other control units, in any of various formats such as a text, an image, a table, a graph, and the like. Moreover, in a case where the output apparatus is a sound output apparatus, the sound output apparatus converts an audio signal that includes reproduced sound data, acoustic data, or the like into an analog signal and aurally outputs the analog signal.

Note that, in the example depicted in FIG. 47, at least two control units connected to each other through the communication network 7010 may be integrated with each other as one control unit. Alternatively, each individual control unit may include a plurality of control units. Moreover, the vehicle control system 7000 may include other control units that are not depicted. Moreover, in the above description, a portion or the whole of the function born by any of the control units may be caused to be born by another control unit. In short, as long as transmission and reception of information can be executed through the communication network 7010, predetermined computation processes may be executed by any of the control units. Similarly, a sensor or an apparatus connected to any of the control units may be connected to another control unit and a plurality of control units may mutually transmit and receive detected information through the communication network 7010.

The technique according to the present disclosure is applicable to, for example, the imaging part of the outside-vehicle information detecting unit of the configuration described above. In other words, the polarization information can be acquired together with the image information, and more detailed information can therefore be acquired.

[Others]

Although the embodiments of the present disclosure have been described as above, the present disclosure is not limited to the above embodiments and various modifications can be made thereto on the basis of the technical idea of the present disclosure. For example, the numerical values, the structures, the substrates, the raw materials, the processes, and the like referred to in the above embodiments are merely exemplification and, when necessary, numerical values, structures, substrates, raw materials, processes, and the like that are different from the above may be used.

In addition, the technique of the present disclosure may also take the following configurations.

[A1]

An imaging element including:

a plurality of pixels each having a photoelectric conversion part and arranged in a two-dimensional matrix, in which some of the plurality of pixels each have a polarizer placed therein on a side of a light beam incidence plane, and at least some of pixels having no polarizer placed therein each have a material layer placed therein that prevents transmission of a light beam having a wavelength of a predetermined range, to reduce color mixture in the pixel having the polarizer placed therein.

[A2]

The imaging element described in the above [A1], in which the polarizer is placed in a pixel for an infrared light beam.

[A3]

The imaging element described in the above [A1], in which the polarizer is placed in a pixel for a visible light beam.

[A4]

The imaging element described in any one of the above [A1] to [A3], in which
the material layer preventing transmission of the light beam having the wavelength of the predetermined range is placed in
all the pixels having no polarizer placed therein,
from among the pixels having no polarizer placed therein, a pixel adjacent to the pixel having the polarizer placed therein through a side or a vertex of the pixel, or
from among the pixels having no polarizer placed therein, a pixel adjacent to the pixel having the polarizer placed therein through a side of the pixel.

[A5]
The imaging element described in any one of the above [A1] to [A4], in which
the material layer includes a material that prevents transmission of a light beam having a wavelength of a predetermined range from among light beams in a range of visible light beams or non-visible light beams.

[A6]
The imaging element described in the above [A5], in which
the material layer includes a visible light beam-absorbing material, an infrared-absorbing material, or an electrically conductive material.

[A7]
The imaging element described in any one of the above [A1] to [A6], in which
the pixel having the polarizer placed therein is placed so as to be surrounded by and adjacent to the pixels having no polarizer placed therein.

[A8]
The imaging element described in any one of the above [A1] to [A6], in which
the pixel having the polarizer placed therein is placed so as to be adjacent to the pixel having no polarizer placed therein through a side of the pixel and adjacent to another pixel having the polarizer placed therein through a vertex of the pixel.

[A9]
The imaging element described in any one of the above [A1] to [A8], in which
a plurality of types of polarizers whose azimuth angles of polarization differ from each other is placed such that one type of polarizer is placed in one pixel.

[A10]
The imaging element described in the above [A9], in which
the polarizers have the same structure, and
the polarizers are placed such that the azimuth angles of polarization are made different from each other by differentiating a placement relation of the polarizer with respect to the pixel.

[A11]
The imaging element described in the above [A9], in which
the pixel having no polarizer placed therein is placed so as to be adjacent to pixels having polarizers placed therein whose azimuth angles of polarization are different from each other, on all sides of the pixel.

[A12]
The imaging element described in the above [A9], in which
a plurality of the pixels having the polarizer placed therein is placed adjacent to each other and constitutes a pixel group, and
the pixel group is placed so as to be surrounded by and adjacent to the pixels having no polarizer placed therein.

[A13]
The imaging element described in the above [A12], in which
the pixels constituting one pixel group have polarizers placed therein whose azimuth angles of polarization are equal to each other.

[A14]
The imaging element described in any one of the above [A1] to [A13], in which
the polarizer includes a wire grid polarizer.

[A15]
The imaging element described in any one of the above [A1] to [A14], in which
the material layer preventing transmission of the light beam having the wavelength of the predetermined range and the polarizer are placed in the same layer.

[A16]
The imaging element described in any one of the above [A1] to [A15], in which
the imaging element includes a color filter that is placed on the side of the light beam incidence plane and formed so as to cover an entire face including an area above the polarizer.

[A17]
The imaging element described in the above [A16], in which
the material layer preventing transmission of the light beam having the wavelength of the predetermined range is placed
on a side of the color filter closer to the polarizer, or
on a side of the color filter closer to the light beam incidence plane.

[A18]
The imaging element described in the above [A17], in which
the material layer preventing transmission of the light beam having the wavelength of the predetermined range is placed so as to cover an entire face of the light beam incidence plane of the pixel or only a peripheral portion of the light beam incidence plane of the pixel.

[A19]
The imaging element described in any one of the above [A1] to [A18], in which
the material layer preventing transmission of the light beam having the wavelength of the predetermined range is placed so as to cover an entire face of the light beam incidence plane of the pixel or only a peripheral portion of the light beam incidence plane of the pixel.

[B1]
An electronic device including:
an imaging element, in which
the imaging element includes a plurality of pixels each having a photoelectric conversion part and arranged in a two-dimensional matrix,
some of the plurality of pixels each have a polarizer placed therein on a side of a light beam incidence plane, and
at least some of pixels having no polarizer placed therein each have a material layer placed therein that prevents transmission of a light beam having a wavelength of a predetermined range, to reduce color mixture in the pixel having the polarizer placed therein.

[B2]
The electronic device described in the above [B1], in which
the polarizer is placed in a pixel for an infrared light beam.

[B3]
The electronic device described in the above [B1], in which
the polarizer is placed in a pixel for a visible light beam.
[B4]
The electronic device described in any one of the above [B1] to [B3], in which
the material layer preventing transmission of the light beam having the wavelength of the predetermined range is placed in
all the pixels having no polarizer placed therein,
from among the pixels having no polarizer placed therein, a pixel adjacent to the pixel having the polarizer placed therein through a side or a vertex of the pixel, or
from among the pixels having no polarizer placed therein, a pixel adjacent to the pixel having the polarizer placed therein through a side of the pixel.
[B5]
The electronic device described in any one of the above [B1] to [B4], in which
the material layer includes a material that prevents transmission of a light beam having a wavelength of a predetermined range from among light beams in a range of visible light beams or non-visible light beams.
[B6]
The electronic device described in the above [B5], in which
the material layer includes a visible light beam-absorbing material, an infrared-absorbing material, or an electrically conductive material.
[B7]
The electronic device described in any one of the above [B1] to [B6], in which
the pixel having the polarizer placed therein is placed so as to be surrounded by and adjacent to the pixels having no polarizer placed therein.
[B8]
The electronic device described in any one of the above [B1] to [B6], in which
the pixel having the polarizer placed therein is placed so as to be adjacent to the pixel having no polarizer placed therein through a side of the pixel and adjacent to another pixel having the polarizer placed therein through a vertex of the pixel.
[B9]
The electronic device described in any one of the above [B1] to [B8], in which
a plurality of types of polarizers whose azimuth angles of polarization differ from each other is placed such that one type of polarizer is placed in one pixel.
[B10]
The electronic device described in the above [B9], in which
the polarizers have the same structure, and
the polarizers are placed such that the azimuth angles of polarization are made different from each other by differentiating a placement relation of the polarizer with respect to the pixel.
[B11]
The electronic device described in the above [B9], in which
the pixel having no polarizer placed therein is placed so as to be adjacent to pixels having polarizers placed therein whose azimuth angles of polarization are different from each other, on all sides of the pixel.
[B12]
The electronic device described in the above [B9], in which
a plurality of the pixels having the polarizer placed therein is placed adjacent to each other and constitutes a pixel group, and
the pixel group is placed so as to be surrounded by and adjacent to the pixels having no polarizer placed therein.
[B13]
The electronic device described in the above [B12], in which
the pixels constituting one pixel group have polarizers placed therein whose azimuth angles of polarization are equal to each other.
[B14]
The electronic device described in any one of the above [B1] to [B13], in which
the polarizer includes a wire grid polarizer.
[B15]
The electronic device described in any one of the above [B1] to [B14], in which
the material layer preventing transmission of the light beam having the wavelength of the predetermined range and the polarizer are placed in the same layer.
[B16]
The electronic device described in any one of the above [B1] to [B15], in which
the electronic device includes a color filter that is placed on the side of the light beam incidence plane and formed so as to cover an entire face including an area above the polarizer.
[B17]
The electronic device described in the above [B16], in which
the material layer preventing transmission of the light beam having the wavelength of the predetermined range is placed
on a side of the color filter closer to the polarizer, or
on a side of the color filter closer to the light beam incidence plane.
[B18]
The electronic device described in the above [B17], in which
the material layer preventing transmission of the light beam having the wavelength of the predetermined range is placed so as to cover an entire face of the light beam incidence plane of the pixel or only a peripheral portion of the light beam incidence plane of the pixel.
[B19]
The electronic device described in any one of the above [B1] to [B18], in which
the material layer preventing transmission of the light beam having the wavelength of the predetermined range is placed so as to cover an entire face of the light beam incidence plane of the pixel or only a peripheral portion of the light beam incidence plane of the pixel.

REFERENCE SIGNS LIST

100, $100_{A1}$ to $100_{A5}$, $100_{B1}$ to $100_{B7}$, $100_{C1}$ to $100_{C3}$, $100_{D1}$, $100_{E1}$ to $100_{E4}$, $100_{F1}$ to $100_{F6}$, $100_{G1}$, $100_{G2}$, $100_{H1}$ to $100_{H33}$, 900 . . . Imaging element, 10 . . . Wiring layer, 20 . . . Semiconductor layer, 21 . . . Photoelectric conversion part, 22 . . . Separation part, 30 . . . Light-blocking part, 40, 41, 42, 43 . . . Flattening layer, 50 . . . Polarizer, 60 . . . Material layer (infrared light beam-absorbing filter layer), 60A . . . Material layer (electrically conductive material layer), 70 . . . Color filter, 70$_R$ . . . Red filter, 70$_G$ . . . Green filter, 70$_B$ . . . Blue filter, 70$_W$ . . . White filter (transparent filter), 70$_{IR}$ . . . Infrared light beam-transmitting filter, PL . . . Pixel having a polarizer placed therein (polarized pixel), NPL . . . Pixel having no polarizer placed therein (normal pixel)

The invention claimed is:

1. An imaging element comprising:
a plurality of pixels each having a photoelectric conversion part and arranged in a two-dimensional matrix, wherein
a first portion of the plurality of pixels, each have a polarizer placed therein on a side of a light beam incidence plane, and
a second portion of the plurality of pixels having no polarizer placed therein, each have a material layer placed therein filtering a transmission of a light beam, the transmission of the light beam that is filtered having a wavelength of a predetermined range, to reduce color mixture in the plurality of pixels having the polarizer placed therein.

2. The imaging element according to claim 1, wherein the polarizer is placed in a pixel for an infrared light beam.

3. The imaging element according to claim 1, wherein the polarizer is placed in a pixel for a visible light beam.

4. The imaging element according to claim 1, wherein the material layer filtering the transmission of the light beam having the wavelength of the predetermined range is placed in
all of the plurality of pixels having no polarizer placed therein,
from among the plurality of pixels having no polarizer placed therein, one pixel adjacent to one of the plurality of pixels having the polarizer placed therein through a side or a vertex of the one pixel, or
from among the plurality of pixels having no polarizer placed therein, a second one pixel adjacent to a second one of the plurality of pixels having the polarizer placed therein through a side of the second one pixel.

5. The imaging element according to claim 1, wherein the material layer includes a material filtering the transmission of the light beam having the wavelength of the predetermined range from among light beams in a first range of visible light beams or a second range of non-visible light beams, and
a material of the polarizer is different from the material filtering the transmission of the light beam.

6. The imaging element according to claim 5, wherein the material layer includes one of a visible light beam-absorbing material, an infrared-absorbing material, or an electrically conductive material, and
a material of the polarizer is different from the visible light beam-absorbing material, the infrared-absorbing material, or the electrically conductive material.

7. The imaging element according to claim 1, wherein a pixel of the first portion of the plurality of pixels having the polarizer placed therein is placed so as to be surrounded by and adjacent to pixels of the second portion of the plurality of pixels having no polarizer placed therein.

8. The imaging element according to claim 1, wherein a pixel of the first portion of the plurality of pixels having the polarizer placed therein is placed so as to be adjacent to a pixel of the second portion of the plurality of pixels having no polarizer placed therein through a side of the pixel and adjacent to another pixel of the first portion of the plurality of pixels having the polarizer placed therein through a vertex of the pixel.

9. The imaging element according to claim 1, wherein a plurality of types of polarizers whose azimuth angles of polarization differ from each other is placed such that one type of polarizer is placed in one pixel.

10. The imaging element according to claim 9, wherein the polarizers have a same structure, and
the polarizers are placed such that the azimuth angles of polarization are made different from each other by differentiating a placement relation of the polarizer with respect to one of the plurality of pixels.

11. The imaging element according to claim 9, wherein the second portion of the plurality of pixels having no polarizer placed therein is placed so as to be adjacent to the first portion of the plurality of pixels having polarizers placed therein whose azimuth angles of polarization are different from each other, on all sides of one of the plurality of pixels.

12. The imaging element according to claim 9, wherein the first portion of the plurality of pixels having the polarizer placed therein is placed adjacent to each other and constitutes a pixel group, and
the pixel group is placed so as to be surrounded by and adjacent to the second portion of the plurality of pixels having no polarizer placed therein.

13. The imaging element according to claim 12, wherein the plurality of pixels constituting one pixel group have polarizers placed therein whose azimuth angles of polarization are equal to each other.

14. The imaging element according to claim 1, wherein the polarizer includes a wire grid polarizer.

15. The imaging element according to claim 1, wherein the material layer filtering the transmission of the light beam having the wavelength of the predetermined range and the polarizer are placed in a same layer.

16. The imaging element according to claim 1, wherein the imaging element includes a color filter that is placed on the side of the light beam incidence plane and formed so as to cover an entire face including an area above the polarizer.

17. The imaging element according to claim 16, wherein the material layer filtering the transmission of the light beam having the wavelength of the predetermined range is placed
on a side of the color filter closer to the polarizer, or
on a side of the color filter closer to the light beam incidence plane.

18. The imaging element according to claim 17, wherein the material layer filtering the transmission of the light beam having the wavelength of the predetermined range is placed in a same layer as that of the color filter.

19. The imaging element according to claim 1, wherein the material layer filtering the transmission of the light beam having the wavelength of the predetermined range is placed so as to cover an entire face of the light beam incidence plane of one of the plurality of pixels or only a peripheral portion of the light beam incidence plane of the one of the plurality of pixels.

20. An electronic device comprising:
an imaging element, wherein
the imaging element includes a plurality of pixels each having a photoelectric conversion part and arranged in a two-dimensional matrix,
some of the plurality of pixels, each have a polarizer placed therein on a side of a light beam incidence plane, and at least some of pixels having no polarizer placed therein, each have a material layer placed therein filtering a transmission of a light beam, the transmission of the light beam that is filtered having a wavelength of a predetermined range, to reduce color mixture in the plurality of pixels having the polarizer placed therein.

* * * * *